(12) United States Patent
Naito et al.

(10) Patent No.: US 7,843,023 B2
(45) Date of Patent: Nov. 30, 2010

(54) ELECTROMECHANICAL SWITCH

(75) Inventors: Yasuyuki Naito, Kanagawa (JP); Yoshito Nakanishi, Tokyo (JP)

(73) Assignee: Panasonic Corporation, Osaka (JP)

( * ) Notice: Subject to any disclaimer, the term of this patent is extended or adjusted under 35 U.S.C. 154(b) by 787 days.

(21) Appl. No.: 11/577,017

(22) PCT Filed: Oct. 18, 2005

(86) PCT No.: PCT/JP2005/019111
§ 371 (c)(1),
(2), (4) Date: Apr. 11, 2007

(87) PCT Pub. No.: WO2006/043542
PCT Pub. Date: Apr. 27, 2006

(65) Prior Publication Data
US 2008/0078662 A1 Apr. 3, 2008

(30) Foreign Application Priority Data
Oct. 22, 2004 (JP) ............................ 2004-308672
Oct. 5, 2005 (JP) ............................ 2005-292750

(51) Int. Cl.
*H01L 23/48* (2006.01)
(52) U.S. Cl. ................ 257/417; 257/414; 257/E29.166
(58) Field of Classification Search ................ 257/417, 257/414, 415, 418, E29.166
See application file for complete search history.

(56) References Cited
U.S. PATENT DOCUMENTS
6,307,452 B1 10/2001 Sun
6,376,787 B1 * 4/2002 Martin et al. ................ 200/181
7,446,927 B2 * 11/2008 Chui ........................... 359/290
2003/0223176 A1 12/2003 Fujii et al.
2004/0069608 A1 4/2004 Shimizu et al.

FOREIGN PATENT DOCUMENTS

| | | |
|---|---|---|
| CN | 1484266 A | 3/2004 |
| JP | 7-045175 | 2/1995 |
| JP | 10-162713 | 6/1998 |
| JP | 11-176307 | 7/1999 |
| JP | 2000-164105 | 6/2000 |
| JP | 2002-289081 | 10/2002 |
| JP | 2002-326197 | 11/2002 |
| JP | 2003-264123 | 9/2003 |
| JP | 2003-282359 | 10/2003 |
| JP | 2004-253365 | 9/2004 |

OTHER PUBLICATIONS

Meichun Ruan et al., "Latching Micromagnetic Relays," Journal of Microelectromechanical Systems, vol. 10, No. 4, Dec. 2001, pp. 511-517.
Jeremy B. Muldavin et al., "Inline Capacitive and DC-Contact MEMS Shunt Switches," IEEE Microwave and Wireless Components Letters, vol. 11, No. 8, Aug. 2001, pp. 334-336.
Chinese Office Action Issued Jun. 5, 2009.

* cited by examiner

*Primary Examiner*—Roy K Potter
(74) *Attorney, Agent, or Firm*—Pearne & Gordon LLP

(57) ABSTRACT

An electromechanical filter of the present invention is an electromechanical switch formed on a substrate. The switch has a fixed electrode which is to become a signal transmission line, and a movable electrode formed in a levitating manner while being spaced from the fixed electrode with a gap therebetween. An insulating film is provided on the fixed electrode, and an actuator is formed around the movable electrode formed on a post section. Thereby, an electromechanical switch equipped with a movable electrode fixing mechanism which prevents occurrence of self-actuation, which has hitherto been difficult to realize, is materialized.

22 Claims, 43 Drawing Sheets

ELECTROMECHANICAL SWITCH

TECHNICAL FIELD

The present invention relates to an electromechanical switch.

BACKGROUND ART

With the progressive proliferation of information communication equipment such as wireless terminals, the range of frequencies used for communication is broadening, spanning from hundreds of megahertz for a cellular phone, and the like, to gigahertz for a wireless LAN, and the like. Currently, terminals complying with respective communications schemes are independently used. However, for the future, desire exists for a compact terminal which complies with various communication schemes by use of a single wireless terminal. Against the backdrop of an increase in the number of passive components, such as switches to be incorporated into a housing of a terminal, a desire exists for miniaturization of the passive components.

In view of this situation, research and development of an RF-MEMS switch manufactured by the MEMS (Micro Electro Mechanical Systems) technique has become brisk. The RF-MEMS switch is a switch which mechanically switches a signal transmission path by means of actuating a micro-movable electrode. The advantage of this switch is compactness of the device and superior high-frequency characteristics such as an ultra-low loss and high isolation. Moreover, the switch can be manufactured in a process compatible with an RF-IC and, hence, can be incorporated into the RF-IC, as well. Thus, employment of the switch is expected to contribute greatly to miniaturization of a wireless section.

The related RF-MEMS switch is a mechanical switch which switches a signal transmission path by means of: supporting both ends of a membrane-like or rod-like movable element or supporting the movable element in a cantilever fashion; and bringing the movable element into or out of contact with an electrode. Many RF-MEMS switches adopt electrostatic force as the source of driving force for a membrane or a movable element (Patent Document 1). In addition, RF-MEMS switches adopting magnetic force have also been released (Non-Patent Document 2).

A related minute switch of the order of hundreds of micrometers is described in Non-Patent Document 1. In this switch, a signal line through which a high-frequency signal is to be transmitted is formed on a membrane, and a control electrode is provided immediately below the signal line. When a DC potential is applied to the control electrode, the membrane is attracted and bent toward the control electrode by means of electrostatic potential, to thus contact a ground electrode formed on a substrate. As a result, the signal line formed on the membrane enters a short-circuited state, whereby the signal flowing through the signal line is attenuated and interrupted. In contrast, when the DC potential is not applied to the control electrode, the membrane is not bent, and the signal flowing through the signal line on the membrane passes through the switch without being subjected to losses produced by the ground electrode.

Research and development of the RF-MEMS switch originated with one intended for use in military and aerospace applications, and the focus of research and development has been placed on improving signal transmission characteristics. However, when the RF-MEMS switch finds its application in consumer products, such as a portable information terminal and the like, there is sought an RF-MEMS switch which simultaneously satisfies various characteristics such as reliability, durability, high-speed response, low power consumption, a lower drive voltage, miniaturization, and the like, as well as enhanced signal transmission characteristics.

Patent Document 1: U.S. Pat. No. 6,307,452B1

Non-Patent Document 1: J. B. Muldavin and G. M. Rebeiz, IEEE Microwave Wireless Compon. Lett., vol. 11, pp. 334-336, August 2001.

Non-Patent Document 2: M. Ruan, J. Shen and C. B. Wheeler, IEEE Journal of Micro Electromechanical Systems, vol. 10, pp. 511-517, December 2001.

DISCLOSURE OF THE INVENTION

Problems to be Solved by the Invention

However, currently, there may arise a case where, when a signal is input to a movable electrode, assuming a levitated structure, or a fixed electrode, the configuration of the electromechanical switch found in Non-Patent Document 1 causes a phenomenon of a potential difference arising between the movable electrode and the fixed electrode by means of the power of the signal and the movable electrode being automatically driven downward, regardless of additional application of the drive voltage. This phenomenon is called "self-actuation." Self-actuation poses a problem when a signal of heavy current is input or when spring force of the movable electrode employed for achieving high-speed response and low-voltage driving is lowered. The phenomenon is responsible for faulty operation of the electromechanical switch or deterioration of durability of the same.

The present invention has been conceived in light of the situation, and aims at avoiding occurrence of self-actuation to thus enhance the reliability of the electromechanical switch.

Means for Solving the Problem

Accordingly, the present invention is characterized by comprising a movable electrode fixing mechanism for fixing a levitating movable electrode in order to avoid occurrence of self-actuation. In order to exhibit fixing force which is superior to self-actuation in terms of drive force, physically retaining the movable electrode is desirable. By means of this configuration, a highly-reliable electromechanical switch capable of avoiding occurrence of self-actuation, which has hitherto been difficult to attain, and electrical equipment using the switch are materialized.

In order to solve the conventional drawbacks, an electromechanical switch of the present invention is characterized by comprising a first electrode, and a second electrode which is formed while being spaced from the first electrode by way of a gap and is formed so as to be able to contact the first electrode by means of displacement induced by electrostatic force. The second electrode has an actuator for preventing occurrence of contact with the first electrode. Specifically, the electromechanical switch is formed on the substrate, and one of the first and second electrodes becomes a signal transmission path.

By means of this configuration, there can be realized a highly-reliable electromechanical switch capable of avoiding occurrence of self-actuation, which has been difficult to realize, and electrical equipment using the switch.

In the electromechanical switch of the present invention, the actuator includes an actuator embodied by clamp means which physically clamps the second electrode.

By means of this configuration, the electromechanical switch is provided with the force for fixing the second electrode serving as a movable electrode, which is superior to the driving force stemming from self-actuation. Thus, occurrence of self-actuation can be avoided.

In the electromechanical switch of the present invention, the actuator includes an actuator which is interposed between the second electrode and the first electrode.

By means of this configuration, the force required when the actuator fixedly clamps the second electrode becomes unnecessary, and therefore only the force used for actuating the actuator is required. The drive force of the actuator can be reduced, which in turn enables a reduction in power consumption of the device. Further, there is no necessity for fixing the second electrode that attempts to induce self-actuation, by means of a side face of the actuator. Hence, abrasion or fatigue, which would otherwise arise in a contact portion, can be avoided.

The electromechanical switch of the present invention includes an electromechanical switch having an actuator whose surface is covered with an insulating film.

By means of this configuration, reinforcing the mechanical strength of the contact portion and preventing occurrence of discharge breakdown or welding, which would otherwise be caused by a high-frequency signal or a control signal, can be achieved.

The electromechanical switch of the present invention includes an electromechanical switch having a resistor provided in a contact portion between the actuator and the movable electrode.

When the movable electrode is fixed with an actuator, a large potential difference is caused by an input high-frequency signal, to thus pose difficulty in detaching the actuator from the movable electrode. By means of the configuration, in such a case, the electrostatic force can be reduced by dividing the potential difference, to thereby make removal of the actuator easy. Such a structure enables realization of an electromechanical switch exhibiting high-speed response, low drive voltage, and highly reliability.

The electromechanical switch of the present invention includes an electromechanical switch having a mechanical resonator provided in a contact portion between the actuator and the movable electrode.

When the movable electrode is fixed by the actuator, a great potential difference is induced by an input high-frequency signal, to thus pose difficulty in detaching the actuator from the movable electrode. In such a case, by means of the configuration, power is dispersed, to thereby diminish electrostatic power. Thus, easy detachment of the actuator becomes possible. By means of this structure, an electromechanical switch exhibiting high-speed response, low drive voltage, and high reliability can be embodied.

The electromechanical switch of the present invention has the actuator, wherein the part of the actuator contacting the second electrode has a pointed shape.

By means of this configuration, the area of the portion of the actuator contacting the second electrode that serves as a movable electrode can be reduced, thereby avoiding occurrence of abrasion or fatigue of the contact portion. Further, the amount of displacement required to cause the actuator to enter a position below the second electrode can be reduced. So long as the amount of displacement can be reduced, great drive force or a great drive voltage is not required, which in turn enables a reduction in power consumption of the device. Moreover, the actuator formed on a post can be provided at an elevated position in relation to the substrate, and a gap margin between the actuator, the first electrode, and the insulating film can be secured. By means of this configuration, simplification of manufacturing processes and electrical isolation between the actuator and the first electrode can be acquired.

The electromechanical switch of the present invention has the actuator, wherein the part of the actuator contacting the second electrode has a plane shape.

The electromechanical switch of the present invention has the actuator, wherein the part of the actuator contacting the second electrode preferably assumes a rounded structure, or an angular structure, such as a square structure, a triangular structure, or a wedge-shaped structure.

The electromechanical switch of the present invention includes the actuator, wherein an end face of a part of the actuator opposing the second electrode forms a tapered surface whose cross-sectional area becomes smaller with increased proximity to the second electrode.

Even this configuration enables a reduction in the amount of displacement required to cause the actuator to enter a position below the second electrode.

The electromechanical switch of the present invention includes the second electrode, wherein an end face of a part of the second electrode opposing the actuator forms a tapered surface whose cross-sectional area becomes smaller with increasing proximity to the actuator.

By means of this configuration, the area of the contact between the actuator and the movable electrode can be increased, whereby concentration of stress on the contact portion can be lessened. Frictional force or material fatigue of the contact portion can be diminished, to thus enhance reliability.

The electromechanical switch of the present invention includes a third electrode disposed around the second electrode, and a comb-shaped electrode between the second and third electrodes.

The electromechanical switch of the present invention includes a comb-shaped electrode between the second electrode and the actuator.

When the movable electrode is switched from an ON position located in a lower position to an OFF position located at a higher position, electrostatic force can be imparted to the movable electrode in an obliquely upward direction, whereby the speed of switching action for deactivation can be increased. By means of this structure, an electromechanical switch exhibiting high-speed response, low drive voltage, and high reliability can be embodied.

The electromechanical switch of the present invention includes a drive electrode provided around the actuator.

The electromechanical switch of the present invention includes drive electrodes provided on both sides of the actuator.

By means of this configuration, drive force can be imparted to the actuator in both activation and deactivation, so that high-speed response and a lower drive voltage of the actuator can be realized.

The electromechanical switch of the present invention includes the drive electrodes provided on one side of the actuator.

By means of this configuration, the drive direction can assume any of various directions, including a vertical direction. The layout of the drive electrode can be changed so that the drive force is imparted to the actuator along a desired direction.

The electromechanical switch of the present invention includes an electromechanical switch where the actuator and the drive electrode form a parallel electrode structure.

The electromechanical switch of the present invention includes an electromechanical switch where the actuator and the drive electrode form a comb electrode structure.

By means of this configuration, large opposing areas of the electrodes, between which electrostatic force is applied, can be secured. Greater electrostatic force can be generated by a given voltage, and an increase in the response speed and a decrease in the drive voltage of the actuator can be achieved. Further, a greater amount of displacement of the actuator can be secured.

The electromechanical switch of the present invention includes the actuator whose drive section is a piezoelectric actuator including a bimorph element and a unimorph element.

By means of this configuration, drive force can be imparted to the actuator during activation and deactivation periods, whereby high-speed response and a decrease in drive voltage of the actuator can be achieved. Various directions, including the vertical direction, are available as the driving direction, and the structure of the drive section can be changed such that the drive force is exerted on the actuator in a desired direction. Moreover, application of the piezoelectric actuator eliminates a necessity for forming a drive electrode. Hence, the structure can be simplified.

The electromechanical switch of the present invention is characterized in that the drive force of the actuator is electrostatic force.

By means of the configuration, the actuator can attain high-speed response and a reduction in drive voltage.

In the electromechanical switch of the present invention, the actuator is actuated by piezoelectric force which arises between the actuator and the drive electrode.

In the electromechanical switch of the present invention, the actuator includes an actuator which is actuated by electromagnetic force which arises between the actuator and the drive electrode.

By means of the configuration, the amount of displacement of the actuator can be increased. Further, there is no necessity of forming a drive electrode, and hence the structure of the switch can be simplified, thereby saving space.

In the electromechanical switch of the present invention, the actuator is formed from a high-impedance material containing an insulator or a semiconductor.

By means of this configuration, the actuator can be formed from a high-electrical-impedance material containing an insulator or a semiconductor. Thus, electrical connection among the actuator, the second electrode acting as the movable electrode, and the first electrode acting as a lower electrode can be prevented.

In the electromechanical switch of the present invention, the actuator includes a stay which is configured to fix a portion of the second electrode and shortens the length of a vibrating section.

The electromechanical switch of the present invention is characterized in that the movable electrode is fixed by means of an increase in spring force of the movable electrode.

By means of this configuration, there are embodied a highly-reliable electromechanical switch capable of avoiding self-actuation, which has hitherto been difficult to realize, and electrical equipment using the switch.

The electromechanical switch of the present invention is characterized by further comprising an actuator which is formed on a post section and around the movable electrode, wherein the actuator is connected to the stay.

This configuration enables positional adjustment of the stay and downward insertion and removal of the movable electrode.

The electromechanical switch of the present invention comprises a mechanism for detecting the power value of an input signal, and a mechanism for inputting to the actuator a drive signal for the actuator, by means of a signal output from the mechanism for detecting the power value of the input signal.

By means of the configuration, only when power generated by self-actuation; for instance, a signal of heavy power of the order of at least 2 W or more, is input, the actuator can be controlled so as to insert the stay to a position below the movable electrode, thereby avoiding occurrence of self-actuation.

In the electromechanical switch of the present invention, the actuator is a lever whose both ends are supported.

By means of the configuration, the stability of a structural body can be enhanced, which in turn improves durability and reliability of the electromechanical switch.

In the electromechanical switch of the present invention, the actuator is a cantilever.

By means of this configuration, adoption of the cantilever makes the structure more simple, resulting in space savings. Stress is released by means of adopting a cantilever, to thus reduce spring force. Hence, the electromechanical switch can be actuated at high speed and low voltage.

The electromechanical switch of the present invention is characterized in that the movable electrode is actuated by means of self-actuation induced by the power of the signal.

By means of the configuration, the electromechanical switch is actuated by means of the power of an input signal. Hence, an additional drive power source is not required, and a reduction in power consumption and miniaturization of the device are realized.

Advantages of the Invention

As has been described above, according to the present invention, the electromechanical switch has the mechanism for fixing the second electrode that serves as a movable electrode. The invention realizes a highly-reliable electromechanical switch capable of preventing occurrence of self-actuation, which has been difficult to realize, as well as electrical equipment using the switch.

Further, the electromechanical switch can be provided with fixing force which is superior to the drive force induced by self-actuation.

Since the force required to fix and clamp the movable electrode by means of the actuator becomes unnecessary, only the force used for actuating the actuator is required. As a result, the drive force of the actuator can be reduced, which in turn enables a reduction in power consumption of the device. Further, there is no necessity for fixing the movable electrode that attempts to induce self-actuation, by means of a side face of the actuator. Hence, abrasion or fatigue, which would otherwise arise in a contact portion, can be avoided.

The area of the portion of the actuator contacting the movable electrode can be reduced, thereby avoiding occurrence of abrasion or fatigue of the contact portion. Further, the amount of displacement required to cause the actuator to enter a position below the movable electrode can be reduced. So long as the amount of displacement can be reduced, great drive force or a great drive voltage is not required, which in turn enables a reduction in power consumption of the device. Moreover, the actuator formed on the post can be provided at an elevated position in relation to the substrate, and a gap margin between the actuator, the fixed electrode, and the insulating film can be secured. By means of this configuration, simplification of manufacturing processes and electrical isolation between the actuator and the fixed electrode can be attained.

Further, drive force can be imparted to the actuator even in both activation and deactivation, so that the actuator can exhibit high-speed response and a lower drive voltage.

Various directions, including the vertical direction, are available as the driving direction, and the layout of the drive electrode can be changed such that the drive force is exerted on the actuator in a desired direction.

Moreover, large opposing areas of the electrodes, between which electrostatic force is applied, can be secured. Greater electrostatic force can be generated by a given voltage, and an increase in the response speed and a decrease in the drive voltage of the actuator can be achieved.

Moreover, application of the piezoelectric actuator eliminates a necessity for forming a drive electrode. Hence, the structure can be simplified.

The high-speed response and a reduction in drive voltage of the actuator can be achieved.

The electromechanical switch of the present invention can be applied to electrical circuits of various purposes, as well as to an electrical circuit for wireless communication.

The electromechanical switch of the present invention can be applied to electrical equipment of various purposes, as well as to a wireless communications terminal.

Figure 1:
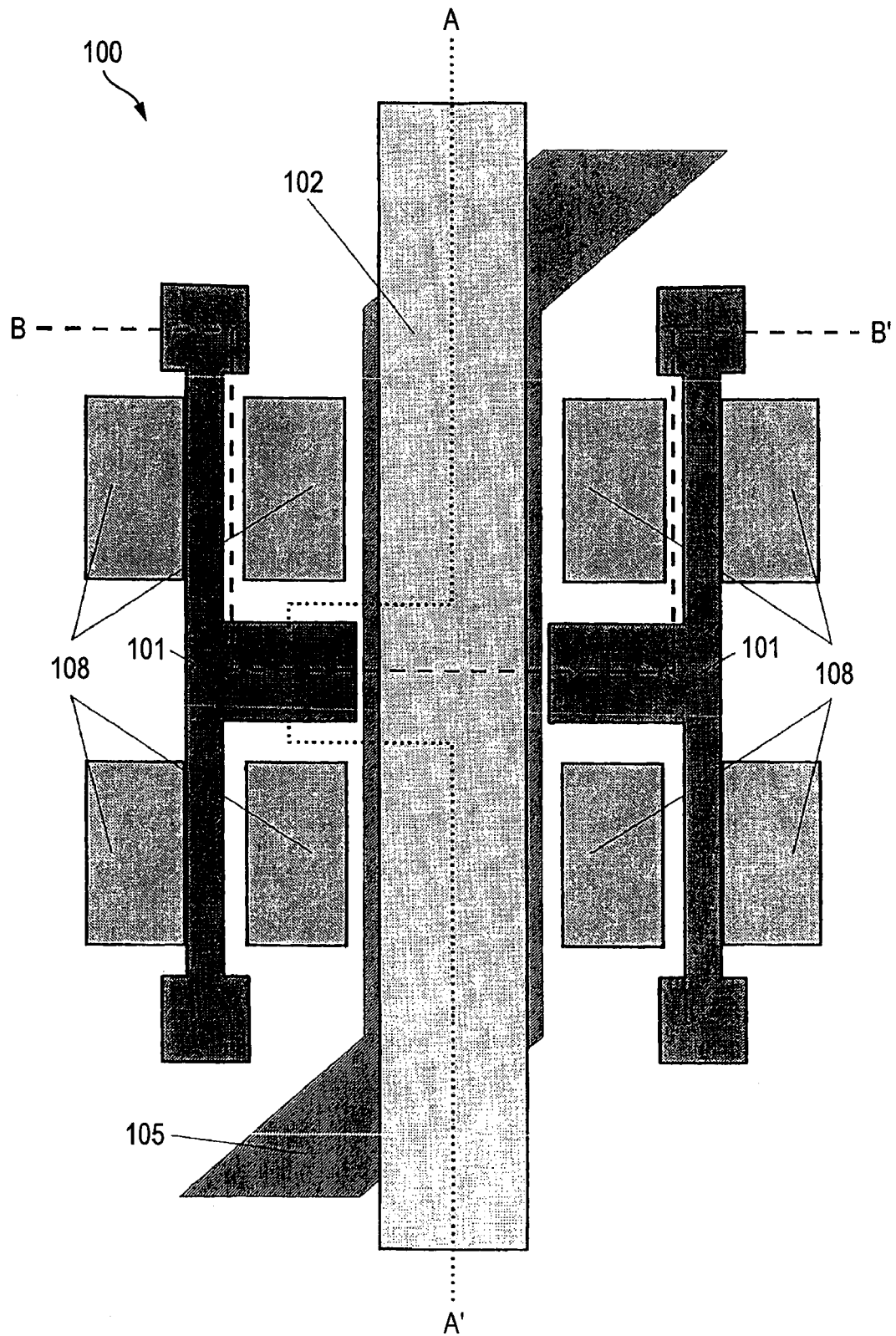
FIG. 1 A top view showing the configuration of an electromechanical switch according to a first embodiment of the present invention.

DESCRIPTION OF THE REFERENCE NUMERALS 100, 1900, 2400, 2000, 2500, 2100, 2600, 200, 300, 400, 500, 550, 600, 700, 800, 900, 1000, 1300, 1400, 1500, 1600, 1700, 2300, 1800

ELECTROMECHANICAL SWITCHES
101 ACTUATOR
102 MOVABLE ELECTRODE
103 FIXED ELECTRODE
104 POST SECTION
105, 114 INSULATING FILMS
106 INSULATING LAYER
107 SUBSTRATE
108 DRIVE ELECTRODE
109 DRIVE SECTION
110 SACRIFICIAL LAYER
111 STAY
112 SIGNAL POWER DETECTOR
113 CONTROL SIGNAL GENERATOR
115 RESISTOR
116, 117 MECHANICAL RESONATORS

BEST MODES FOR IMPLEMENTING THE INVENTION

Embodiments of the present invention will be described in detail hereinbelow by reference to the drawings.

First Embodiment

Figure 2:
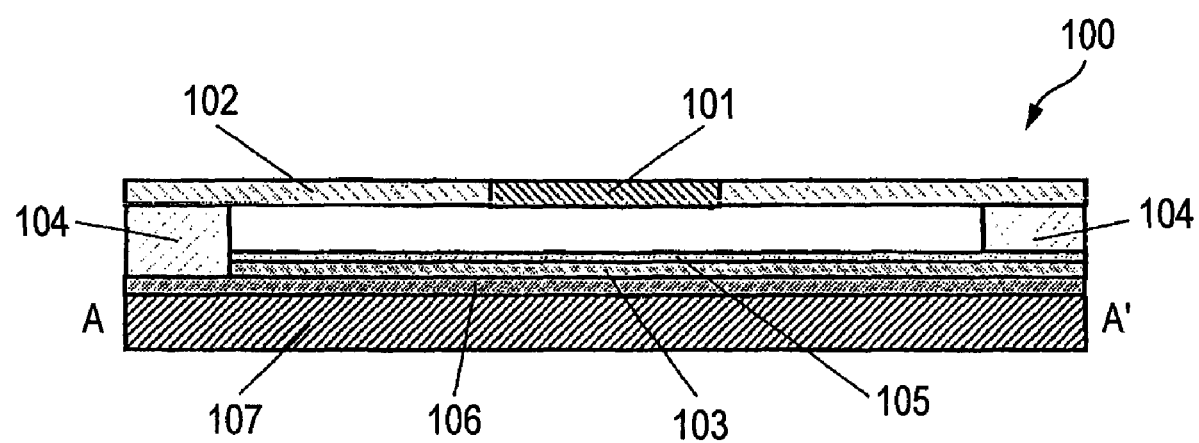
FIG. 2 A view showing a cross section taken along line A-A' shown in FIG. 1.

FIG. 1 is a top view showing the configuration of an electromechanical switch according to a first embodiment of the present invention; FIG. 2 is a view showing a cross section taken along line A-A' shown in FIG. 1; and FIG. 3(a) shows a cross section taken along line B-B' shown in FIG. 1; namely, a cross-sectional view showing the configuration of the electromechanical switch of the first embodiment of the present invention acquired when the switch is in the ON position.

Figure 3:
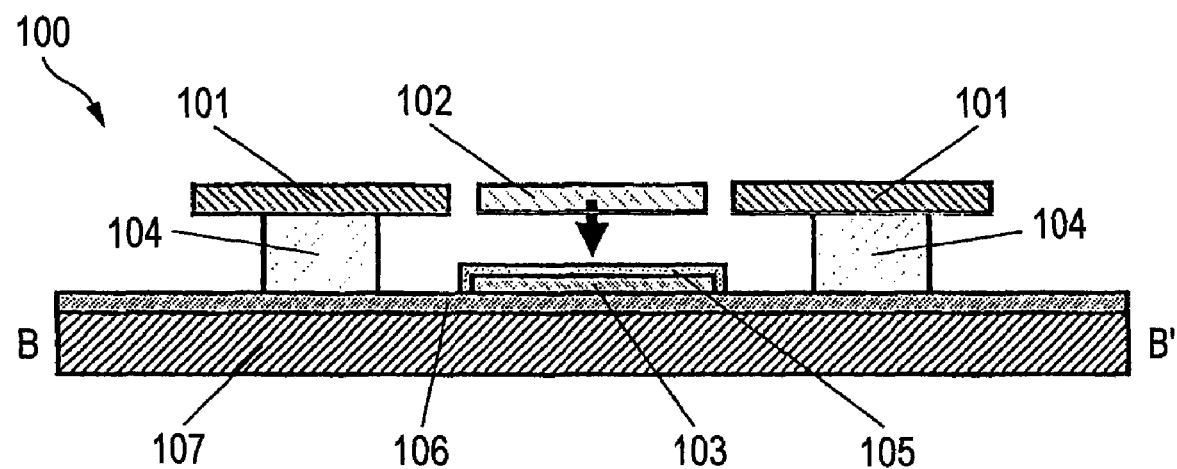
FIG. 3($a$) A cross-sectional view showing the configuration of the electromechanical switch of the first embodiment of the present invention in an ON state; and ($b$) A cross-sectional view showing the configuration of the electromechanical switch shown in FIG. 3($a$) in an OFF state.
Figure 3:
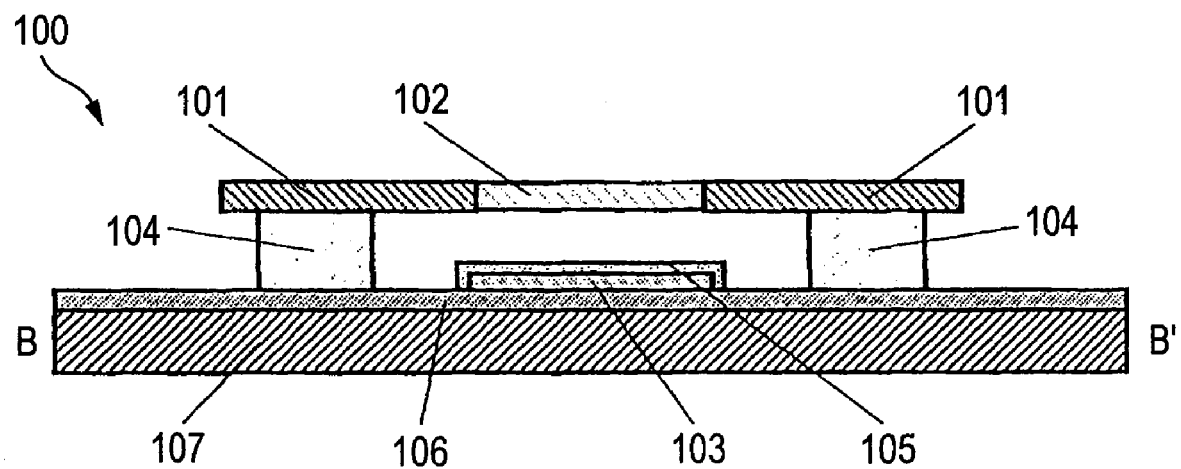

FIG. 3(b) is a cross-sectional view showing the configuration of the electromechanical switch according to the first embodiment of the present invention in a OFF state. An electromechanical switch 100 shown in FIGS. 1 through 3 comprises, on a substrate 107 whose surface is covered with an insulating layer 106, a fixed electrode 103 serving as a first electrode; an insulating film 105 of the fixed electrode 103; a movable electrode 102 which is a levitating crosslinked beam and serves as a second electrode; and actuators 101 which are formed on post sections 104 and disposed such that the movable electrode 102 is sandwiched between the actuators 101. The movable electrode 102 and the fixed electrode 103 form a capacitor in the same manner as a parallel-plate capacitor is formed.

Next, a switching mechanism of the electromechanical switch 100 will be described. When the switch remains in the OFF position, the movable electrode 102 is situated in an elevated position, and an air gap exists between the fixed electrode 103 and the movable electrode 102, whereby the capacitor formed by the fixed electrode and the movable electrode assumes a small electrostatic capacitance. In this case, the capacitor has AC high impedance, and a high-frequency signal cannot travel between the movable electrode 102 and the fixed electrode 103. Meanwhile, when the switch remains in the ON position, a voltage is applied between the movable electrode 102 and the fixed electrode 103, and the movable electrode 102 is actuated downward by means of electrostatic force. The movable electrode 102, which has been actuated downward, comes into contact with the fixed electrode 103, to thus generate great electrostatic capacitance between the movable electrode 102 and the fixed electrode 103 by way of the insulating film 105. In this case, the capacitor has AC low impedance, and the high-frequency signal can travel between the movable electrode 102 and the fixed electrode 103. Thus, the electromechanical switch 100 opens and closes the propagation channel for the signal that has traveled to the movable electrode 102 or the fixed electrode 103.

According to the configuration found in such a related electromechanical switch 100, when a signal is input to the movable electrode 102 or the fixed electrode 103 during the OFF state of the switch, a potential difference arises between the movable electrode 102 and the fixed electrode 103 for reasons of the power of the signal. There arises a phenomenon of the movable electrode 102 being automatically actuated downward, regardless of no additional application of drive voltage. This phenomenon is called self-actuation. Self-actuation enables an input of a signal of great power and high-speed response and a low-voltage drive of the actuator. For this reasons, self-actuation particularly poses a problem when the spring force of the movable electrode 102 has been reduced, which in turn induces faulty operation of the electromechanical switch or deterioration of durability of the same. For instance, the shape of the movable electrode 102 can be made to assume a width of about 5 μm, a thickness of about 0.7 μm, and a length of about 500 μm. An aspect ratio among the width, the thickness, and the length is increased, to thus enable a decrease in spring force.

In order to avoid self-actuation, the present invention provides a movable electrode fixing mechanism for use in an OFF state.

The mechanism of the movable electrode fixing mechanism in the electromechanical switch 100 will now be described. FIG. 3(b) is a cross-sectional view showing the configuration of the electromechanical switch, according to the first embodiment of the present invention, in an OFF state.

When the switch shown in FIG. 3(a) is in an ON state, the movable electrode 102 is in a free state where the electrode is not fixed. When the switch shown in FIG. 3(b) is in an OFF state, the movable electrode 102 is physically sandwiched between the actuators 101, to thus be fixed. The actuator 101 in the contact section assume a square structure. By means of such a movable electrode fixing mechanism, fixing force, which can prevent the driving force induced by self-actuation, can be exerted on the movable electrode, to thus prevent occurrence of self-actuation.

In this case, the gap between the actuator 101 and the movable electrode 102 is assumed to be of the order of, e.g., 0.6 μm or thereabouts. As mentioned above, the structure of the portion of the actuator 101 contacting the movable electrode 102 can be formed into a square shape.

Figure 4:
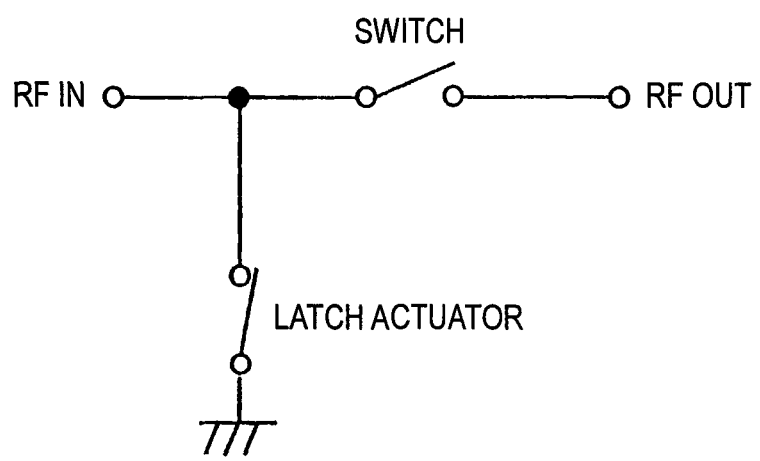
FIG. 4($a$) A view showing a circuit equivalent to the electromechanical switch according to the first embodiment of the present invention; and ($b$) A top view showing the configuration of a contact portion of an actuator with a movable electrode of the electromechanical switch.
Figure 4:
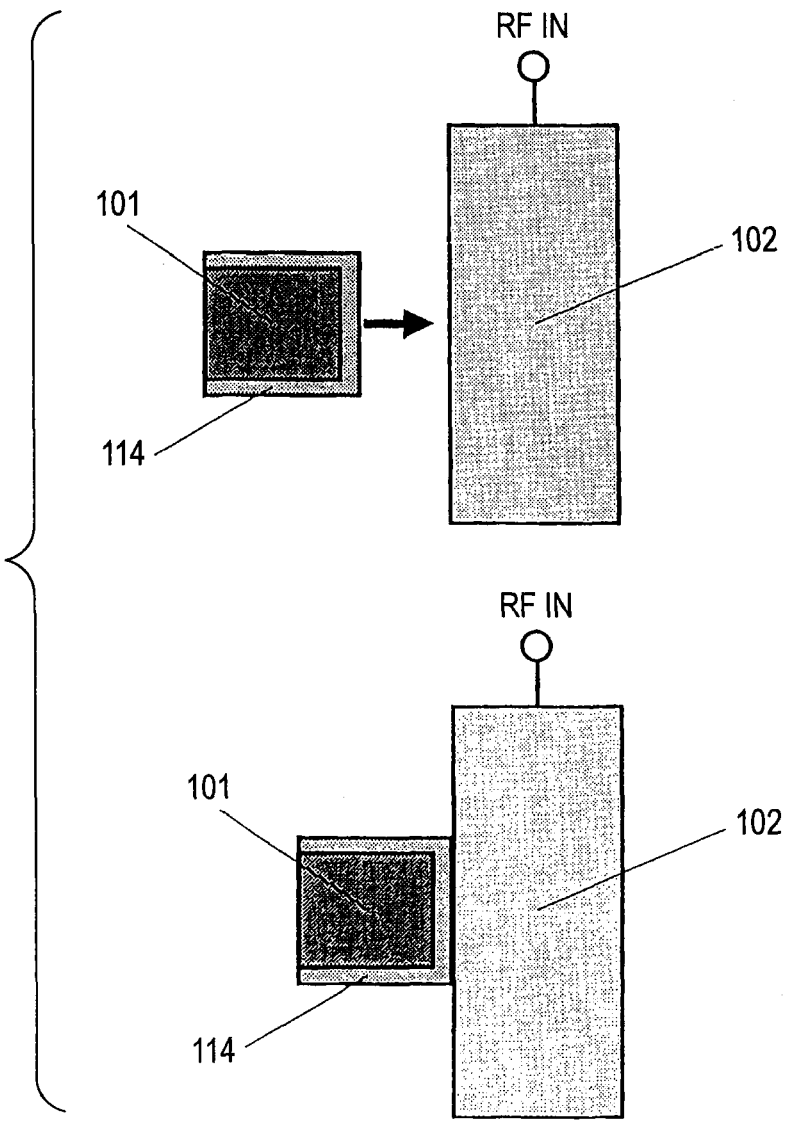

FIG. 4(a) is a view showing a circuit equivalent to the electromechanical switch according to the first embodiment of the present invention. A switch formed from the movable electrode 102 and the fixed electrode 103 is formed between a high-frequency signal input port RF-IN and a high-frequency signal output port RF-OUT. A mechanism for opening and closing the gap between the movable electrode 102 and the actuator 101 becomes equivalent to a switch formed from the actuator 101 in parallel with the movable electrode 102.

FIG. 4(b) is a top view showing the configuration of a contact portion of a movable electrode of the electromechanical switch having an actuator according to the first embodiment of the present invention. The actuators 101 move toward and physically contact the movable electrode 102, to thus fix the movable electrode 102. In order to reinforce the mechanical structure of the contact portion and avoid discharge breakdown and welding, which would otherwise be caused by a high-frequency signal and a control signal, an insulating film 114 is desirably formed over the surface of the actuators 101.

Figure 5:
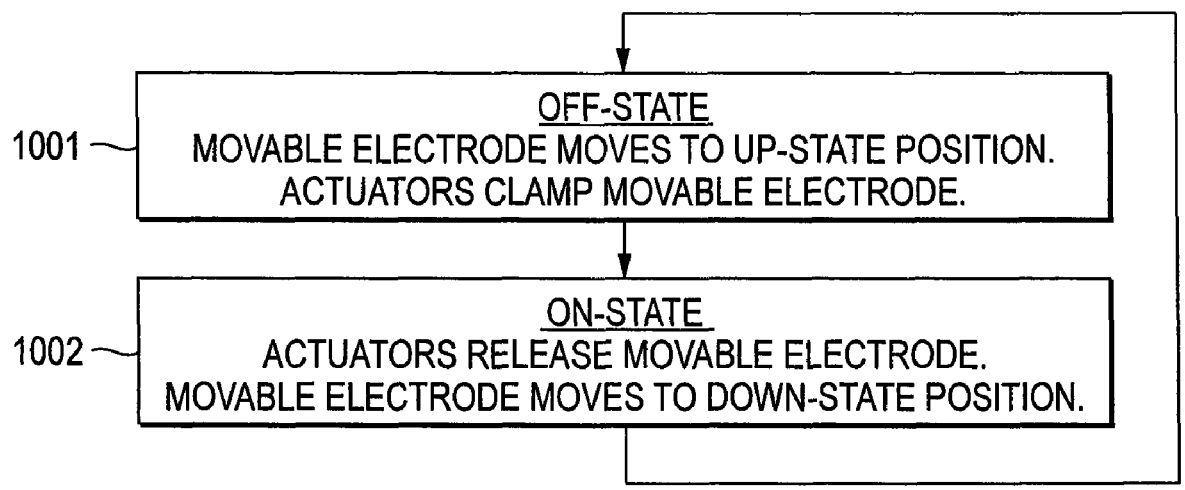
FIG. 5 A view showing procedures for controlling the electromechanical switch according to the first embodiment of the present invention.

FIG. 5 is a view showing procedures for controlling the electromechanical switch according to the first embodiment of the present invention. When the switch remains in the OFF position, the movable electrode 102 is situated at a higher position and remains out of electrical contact with the fixed electrode 103. Since this state is retained at the time of input of high power, the actuators 101 fix the movable electrode 102 (step 1001). Meanwhile, when the switch remains in an ON state, the actuators 101 are brought out of a fixed state, and the movable electrode 102 is brought into a drivable state. The lower movable electrode 102 is moved toward the lower fixed electrode 103, to thus form an electrical contact portion (step 1002). Switching operation is performed by means of iterating these ON/OFF states.

The actuators 101 can be formed from a material having high electrical impedance, ranging from an insulator to a semiconductor, so that electrical connection among the actuators 101, the movable electrode 102, and the lower electrode 103 can be prevented. Each of the actuators 101 is divided into a portion which directly contacts the movable electrode 102, and a movable beam portion. These portions can be formed from respective appropriate materials. As mentioned previously, the portion of the actuator 101 that directly contacts the movable electrode 102 can be formed from a material having high electrical impedance, ranging from an insulator to a semiconductor. The movable beam portion of the actuator 101 can be formed from a conductive material. The materials can be switched with each other.

Second Embodiment

A second embodiment of the present invention will now be described.

Figure 6:
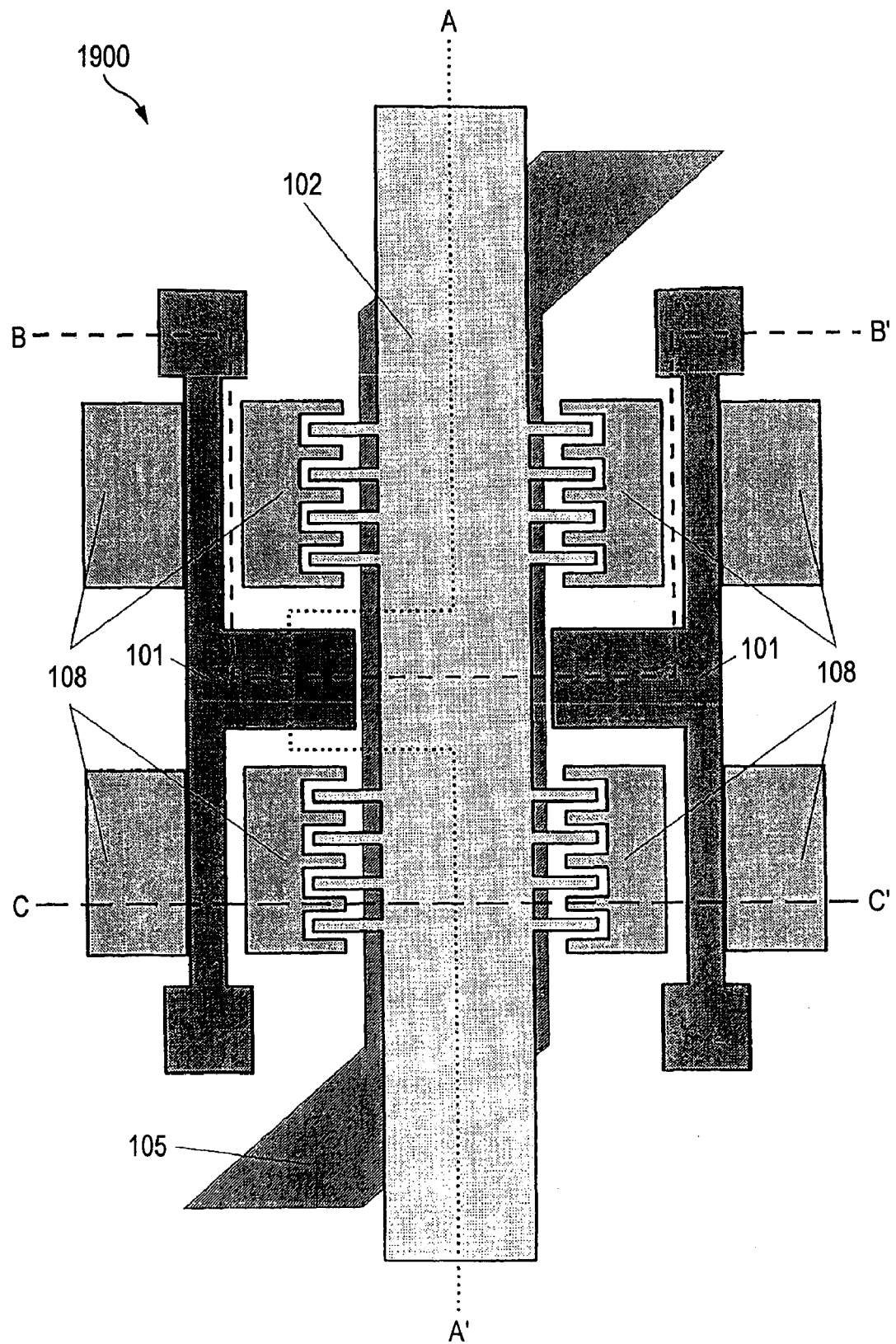
FIG. 6 A top view showing the configuration of an electromechanical switch according to a second embodiment of the present invention.
Figure 7:
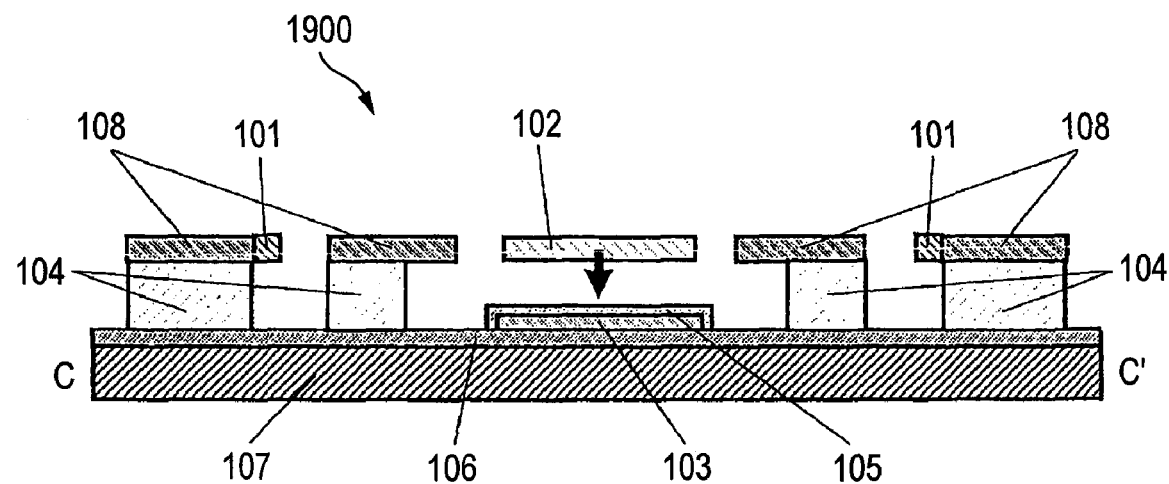
FIG. 7($a$) A cross-sectional view showing the configuration of the electromechanical switch of the second embodiment of the present invention in an ON state; and ($b$) A cross-sectional view showing the configuration of the electromechanical switch shown in FIG. 7($a$) in an OFF state.
Figure 7:
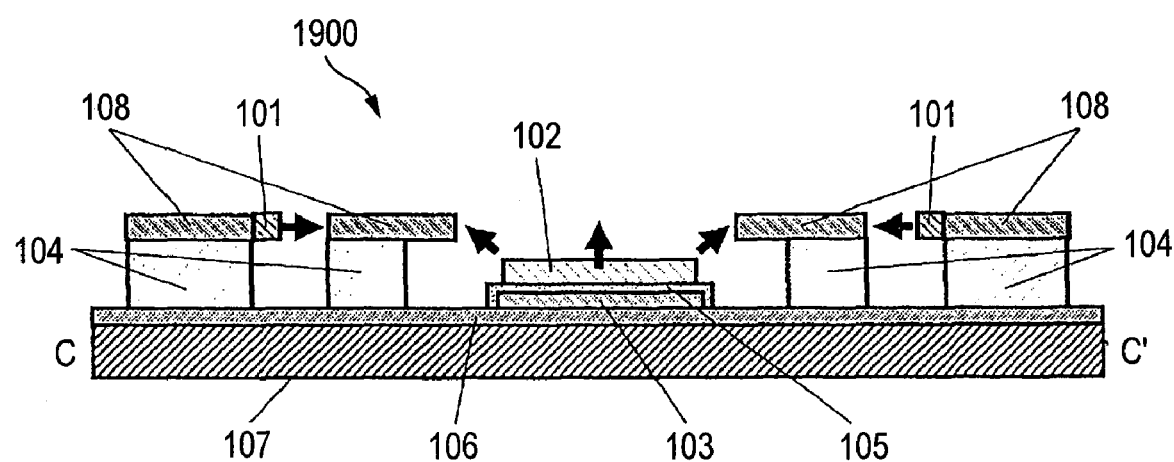

FIG. 6 is a top view showing the configuration of an electromechanical switch according to a second embodiment of the present invention. FIG. 7(a) is a cross-sectional view showing the configuration of the electromechanical switch of the second embodiment of the present invention in an ON state, and FIG. 7(b) is a cross-sectional view showing the configuration of the electromechanical switch, according to the second embodiment of the present invention, in a OFF state.

This structure is achieved by adding self-actuation avoidance measures of the present invention to the technique described in JP-A-2004-253365; namely, the structure disclosed by the inventor of the disclosed patent application, as means for realizing high-speed response and a decrease in drive voltage of the electromechanical switch. In order to realize high-speed response and a decrease in drive voltage of an electromechanical switch 1900, a space between the movable electrode 102 and a drive electrode 108 is formed into the shape of a comb electrode, thereby enabling application of electrostatic force to the movable electrode 102. As shown in FIG. 7(b), when the movable electrode 102 is switched from the ON position that is located at a lower position to the OFF position that is located at a higher position, electrostatic force can be applied from the movable electrode 102 to the drive electrode 108 in an upwardly oblique direction, thereby enabling speedup of the electromechanical switch during a OFF state. A method for fixing the movable electrode 102 by means of the actuators 101 during the ON and OFF states is analogous to that described in connection with the first embodiment.

By means of this structure, speedup of response, a decrease in a drive voltage, and an increase in reliability of the electromechanical switch can be fulfilled.

Third Embodiment

Figure 8:
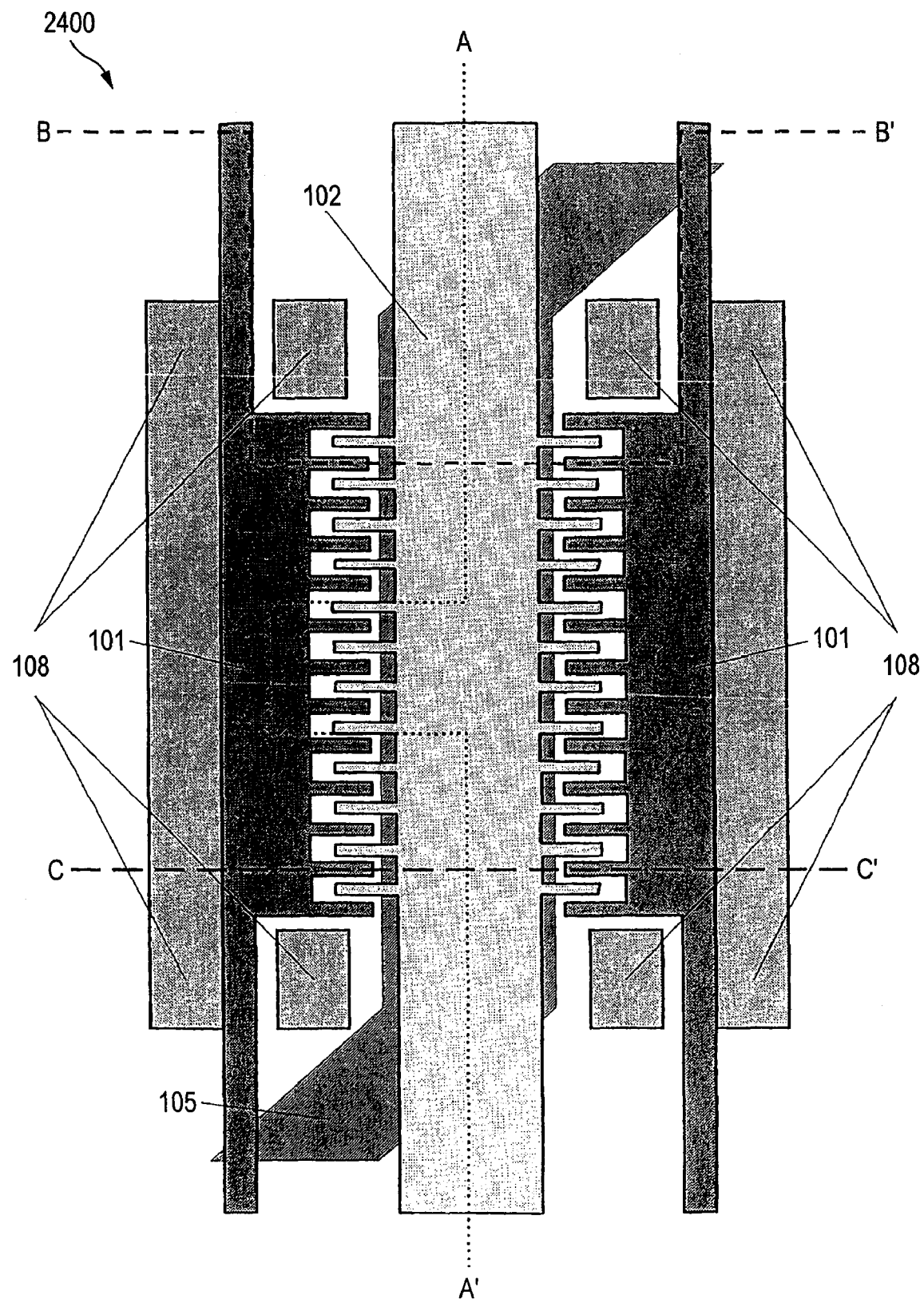
FIG. 8 A top view showing the configuration of an electromechanical switch according to a third embodiment of the present invention.
Figure 9:
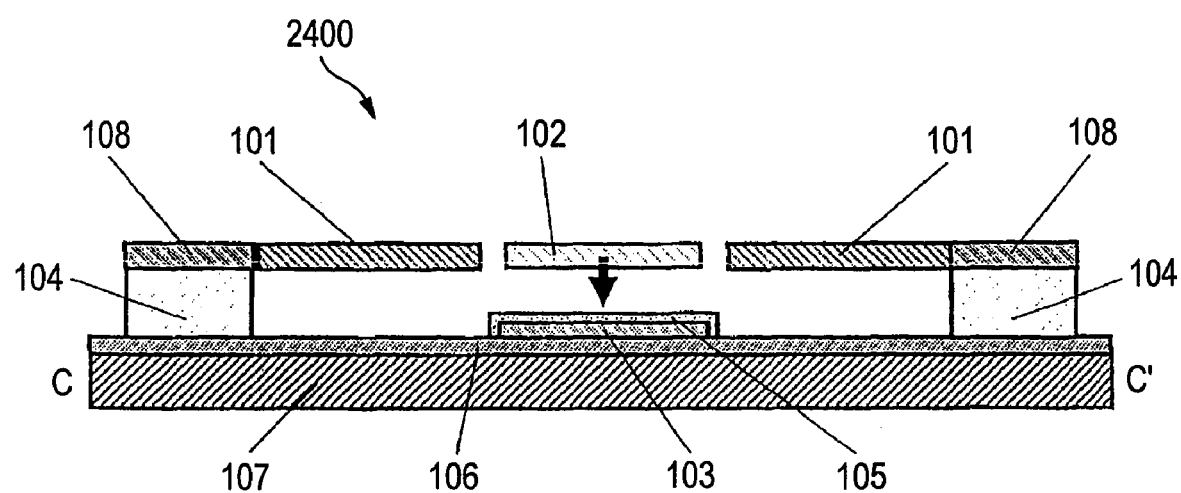
FIG. 9($a$) A cross-sectional view showing the configuration of the electromechanical switch of the third embodiment of the present invention in an ON state; and ($b$) A cross-sectional view showing the configuration of the electromechanical switch shown in FIG. 9($a$) in an OFF state.
Figure 9:
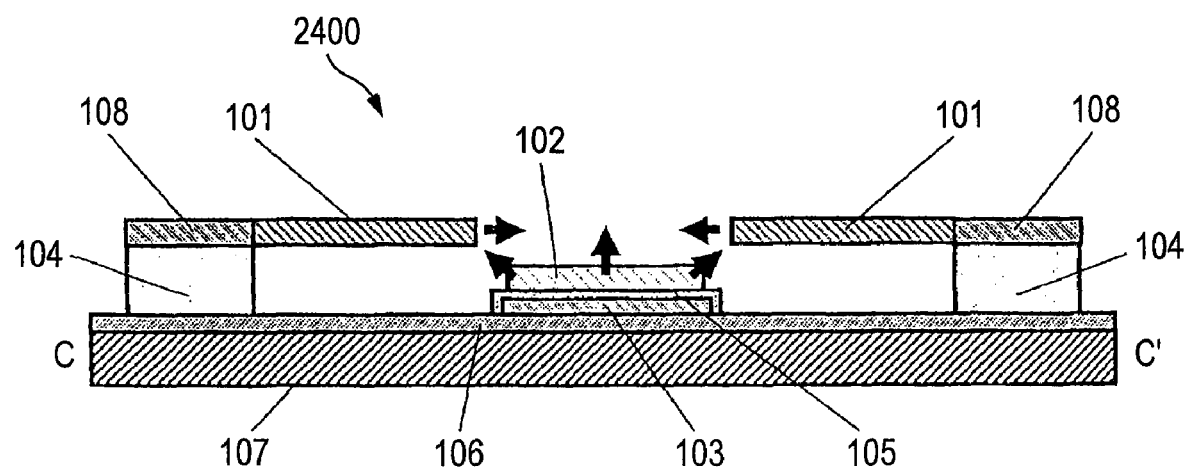

FIG. 8 is a top view showing the configuration of an electromechanical switch according to a third embodiment of the present invention. FIG. 9(a) is a cross-sectional view showing the configuration of the electromechanical switch of the third embodiment of the present invention in an ON state, and FIG. 9(b) is a cross-sectional view showing the configuration of the electromechanical switch of the third embodiment in an OFF state. In an electromechanical switch 2400, the space between the movable electrode 102 and the actuators 101 is formed into the shape of a comb electrode. As shown in FIG. 9(b), when the movable electrode 102 is switched from the ON position that is located at a lower position to the OFF position that is located at a higher position, electrostatic force can be applied from the movable electrode 102 to the actuators 101 in an upwardly oblique direction, thereby enabling speedup of the electromechanical switch during an OFF state. During an OFF state, the actuators 101 are actuated toward the movable electrode 102 to thus bring the comb electrodes into contact with each other, thereby fixing the movable electrode 102.

By means of this structure, speedup of response, a decrease in a drive voltage, and an increase in reliability of the electromechanical switch can be fulfilled.

Fourth Embodiment

When the movable electrode 102 is fixed with the actuators 101 under the method for avoiding occurrence of self-actuation in the electromechanical switch according to the present invention, a great potential difference is induced by an input high frequency signal, thereby posing difficulty in detaching the actuators 101 from the movable electrode 102. A potential difference, which is greater than the potential difference induced by the high frequency signal, must be applied between the actuator 101 and the drive electrode 108. A potential difference, which is greater than the potential difference attributable to the high frequency signal, results in an increase in the drive voltage for the electromechanical switch. In order to solve the problem, there is described a method for, when a potential difference has arisen between the actuators 101 and the movable electrode 102, diminishing electrostatic force by means of providing means for dividing the potential difference.

Figure 10:
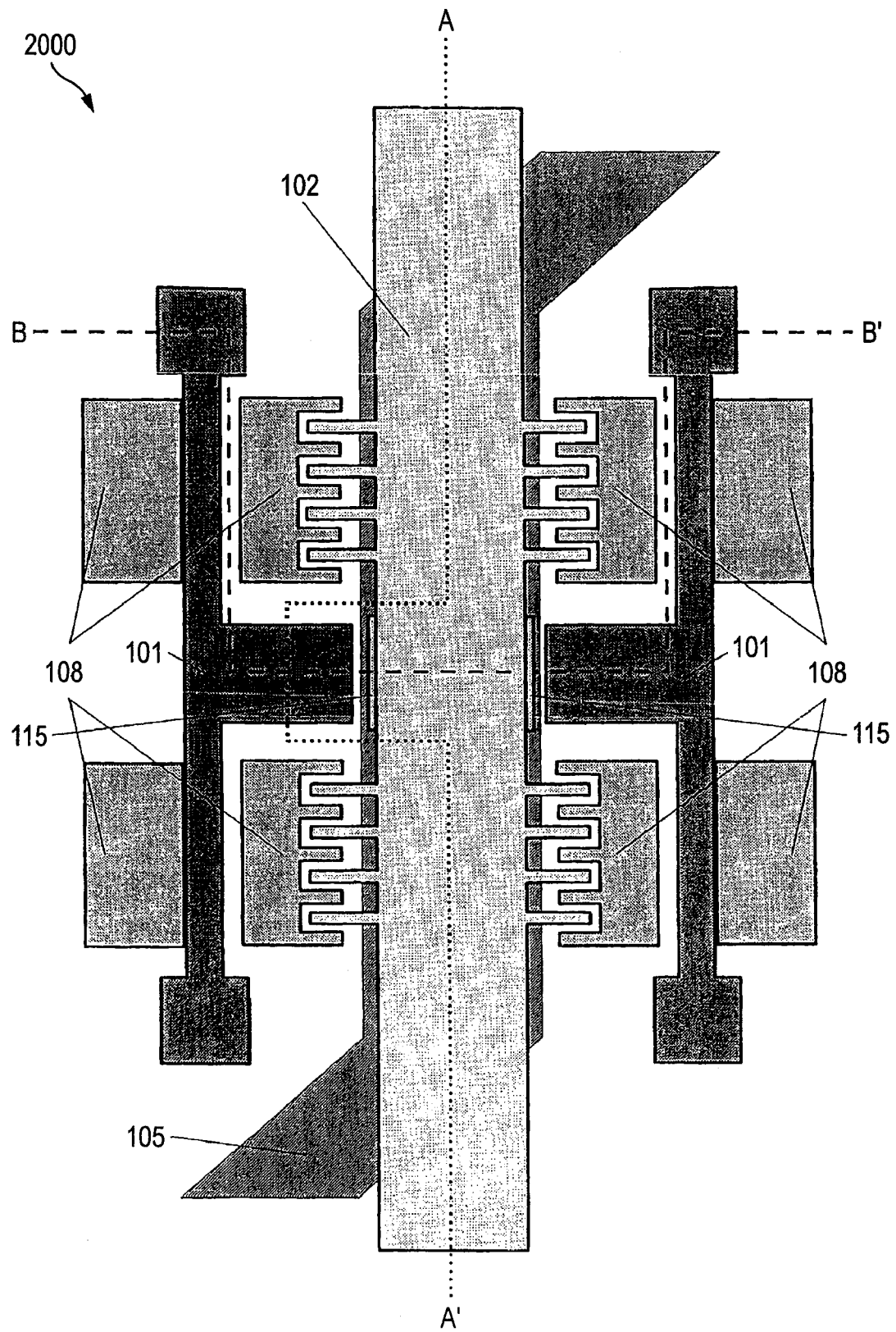
FIG. 10 A top view showing the configuration of an electromechanical switch according to a fourth embodiment of the present invention.
Figure 11:
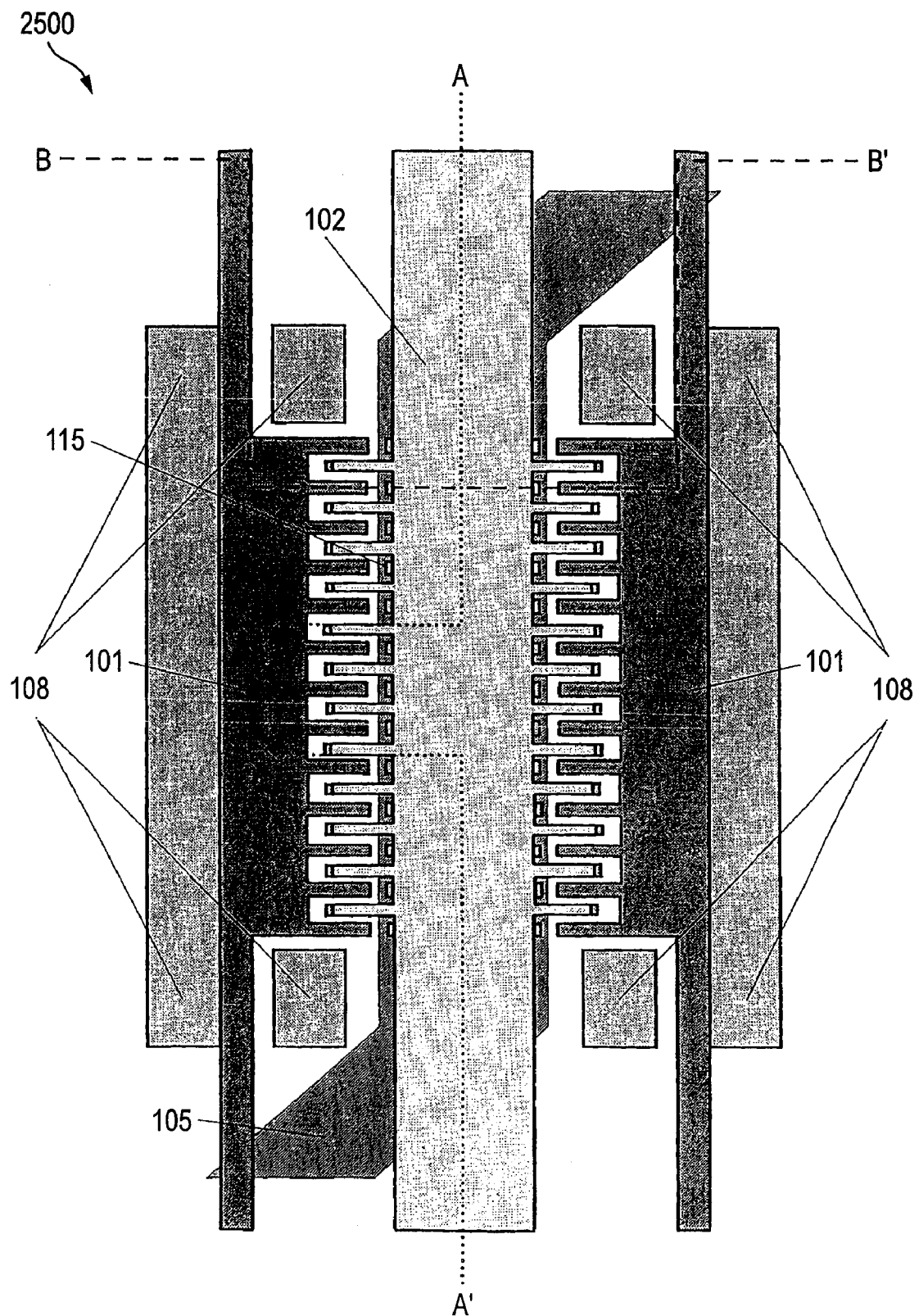
FIG. 11 A top view showing the configuration of the electromechanical switch according to the fourth embodiment of the present invention.
Figure 12:
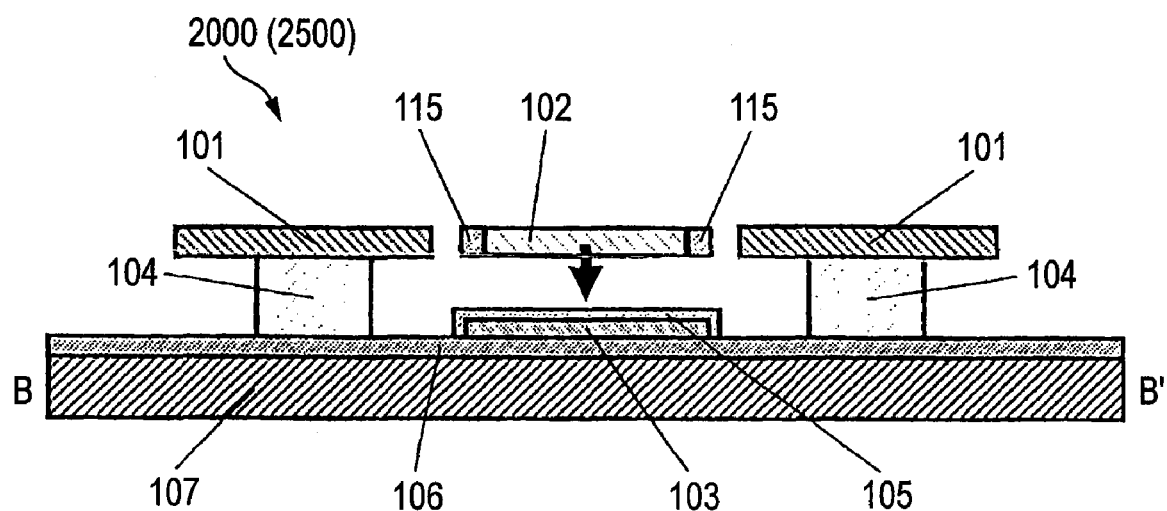
FIG. 12($a$) A cross-sectional view showing the configuration of the electromechanical switch of the fourth embodiment of the present invention in an ON state; and ($b$) A cross-sectional view showing the configuration of the electromechanical switch shown in FIG. 12($a$) in an OFF state.
Figure 12:
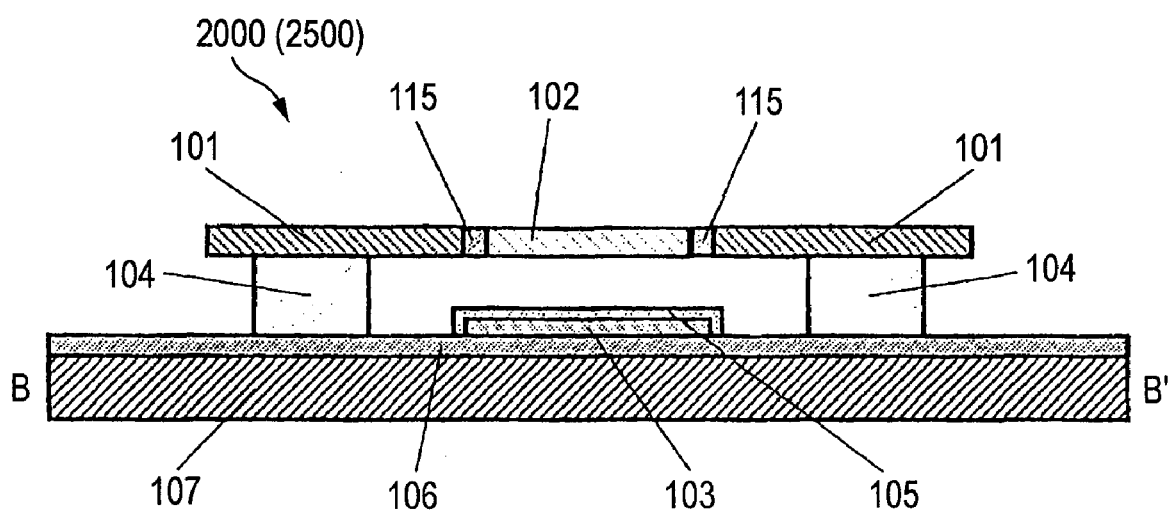

FIG. 10 is a top view showing the configuration of an electromechanical switch according to a fourth embodiment of the present invention; and FIG. 11 is a top view showing the configuration of a modification of the electromechanical switch according to the fourth embodiment of the present invention. FIG. 12(a) is a cross-sectional view showing the configuration of the electromechanical switch of the fourth embodiment of the present invention in an ON state, and FIG. 12(b) is a cross-sectional view showing the configuration of the electromechanical switch of the fourth embodiment in an OFF state. As shown in FIGS. 10 and 12, in an electromechanical switch 2000, resistors 115 are provided in the portions of the actuators 101 contacting the movable electrode 102. In an electro-mechanical switch 2500 shown in FIGS. 11 and 12, the resistors 115 are provided in contact portions between the comb electrodes of the actuators 101 and the comb electrodes of the movable electrode 102.

Figure 13:
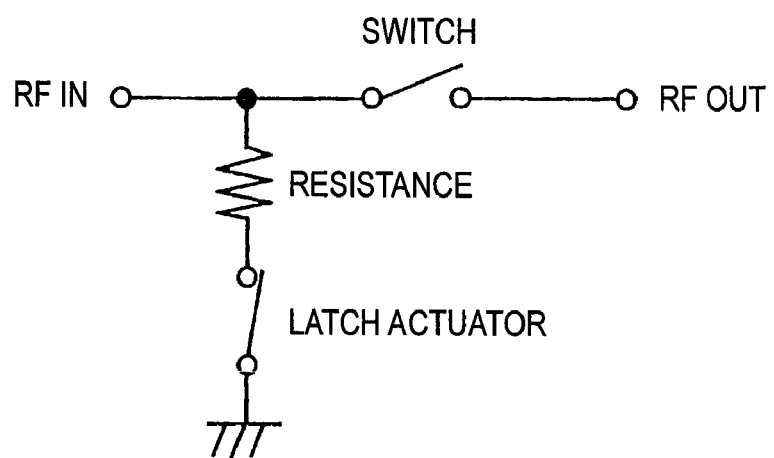
FIG. 13($a$) A view showing a circuit equivalent to the electromechanical switch according to the fourth embodiment of the present invention; and ($b$) A top view showing the configuration of a contact portion of an actuator with the movable electrode of the electromechanical switch.
Figure 13:
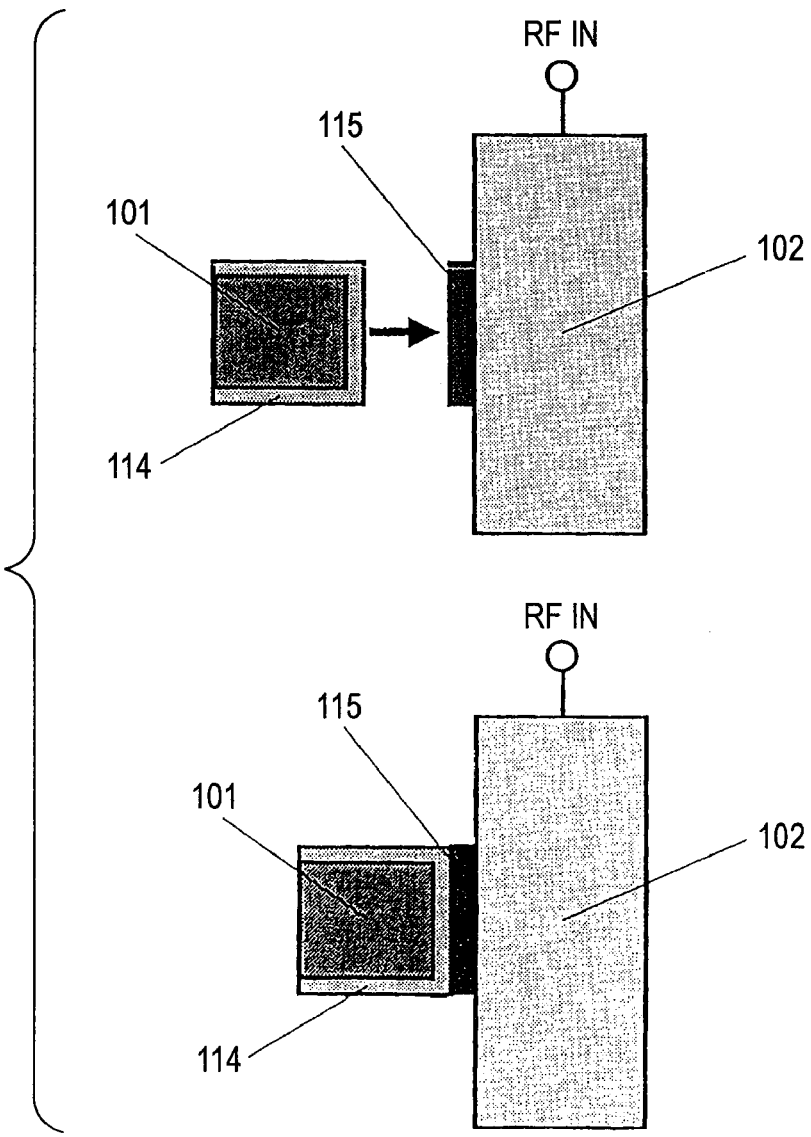

FIG. 13(a) is a view showing a circuit equivalent to the electromechanical switch according to the fourth embodiment of the present invention. The resistors 115 are provided between the movable electrode 102 and the actuators 101. When the actuators 101 have contacted the movable electrode 102, the potential difference induced by the high frequency signal input by way of the signal input port RF-IN is diminished by the resistors 115, to thus enable a decrease in the potential difference between the actuators 101, to which the electrostatic force is applied, and the resistors 115. Arranging the resistors 115 at the signal input port RF-IN side of the switch in relation to the contact portions is of importance. To this end, the resistors 115 are formed on the movable-electrode sides of the contact portions. Electrostatic force can be diminished to zero by means of the resistors 115. Thus, easy detachment of the actuators 101 becomes possible.

FIG. 13(b) is a top view showing the configuration of a contact portion of an actuator with the movable electrode of the electromechanical switch according to a fourth embodiment of the present invention. The potential difference induced by the high frequency signal is diminished by the resistors 115, and the low potential difference is imparted to the electrostatic capacitance formed by way of the insulating film 114.

By means of this structure, speedup of response, a decrease in a drive voltage, and an increase in reliability of the electromechanical switch can be fulfilled.

Fifth Embodiment

There is described a method for dispersing power of a high frequency signal to thus diminish electrostatic force in connection with a problem of difficulty encountered in detaching the actuators 101 from the movable electrode 102.

Figure 14:
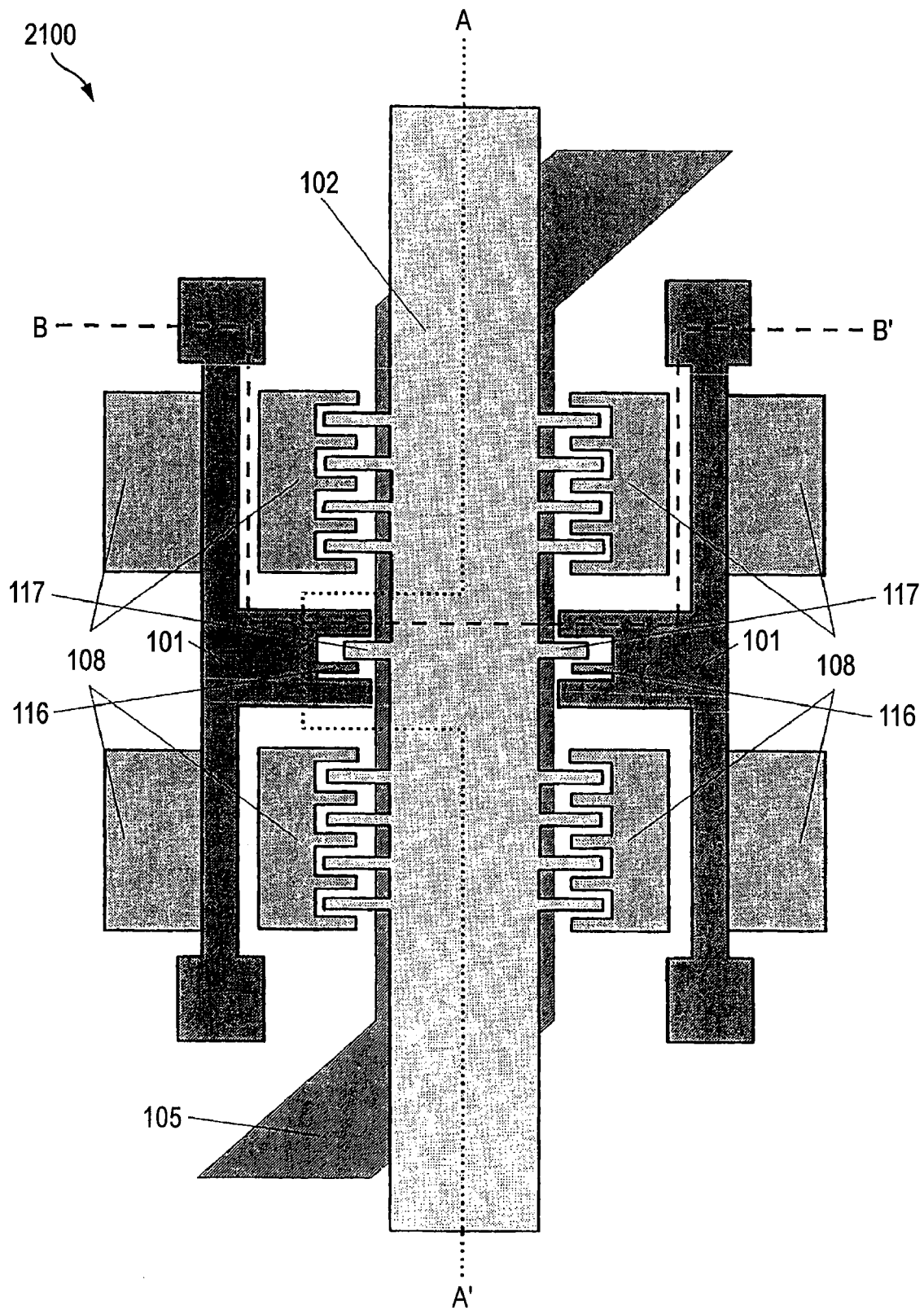
FIG. 14 A top view showing the configuration of an electromechanical switch according to a fifth embodiment of the present invention.
Figure 15:
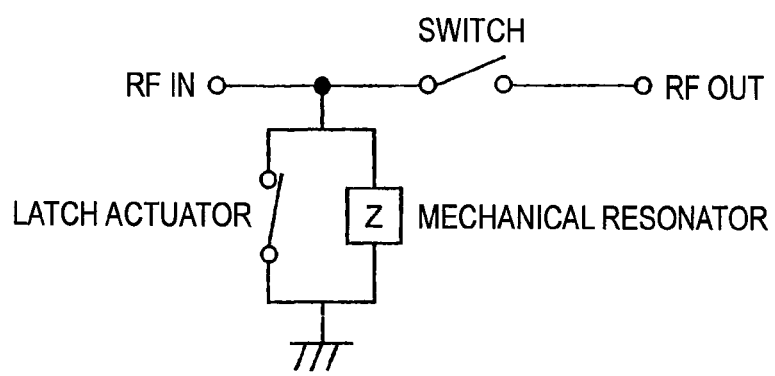
FIG. 15($a$) A view showing a circuit equivalent to the electromechanical switch according to the fifth embodiment of the present invention; and ($b$) A top view showing the configuration of a contact portion of an actuator with the movable electrode of the electromechanical switch.
Figure 15:
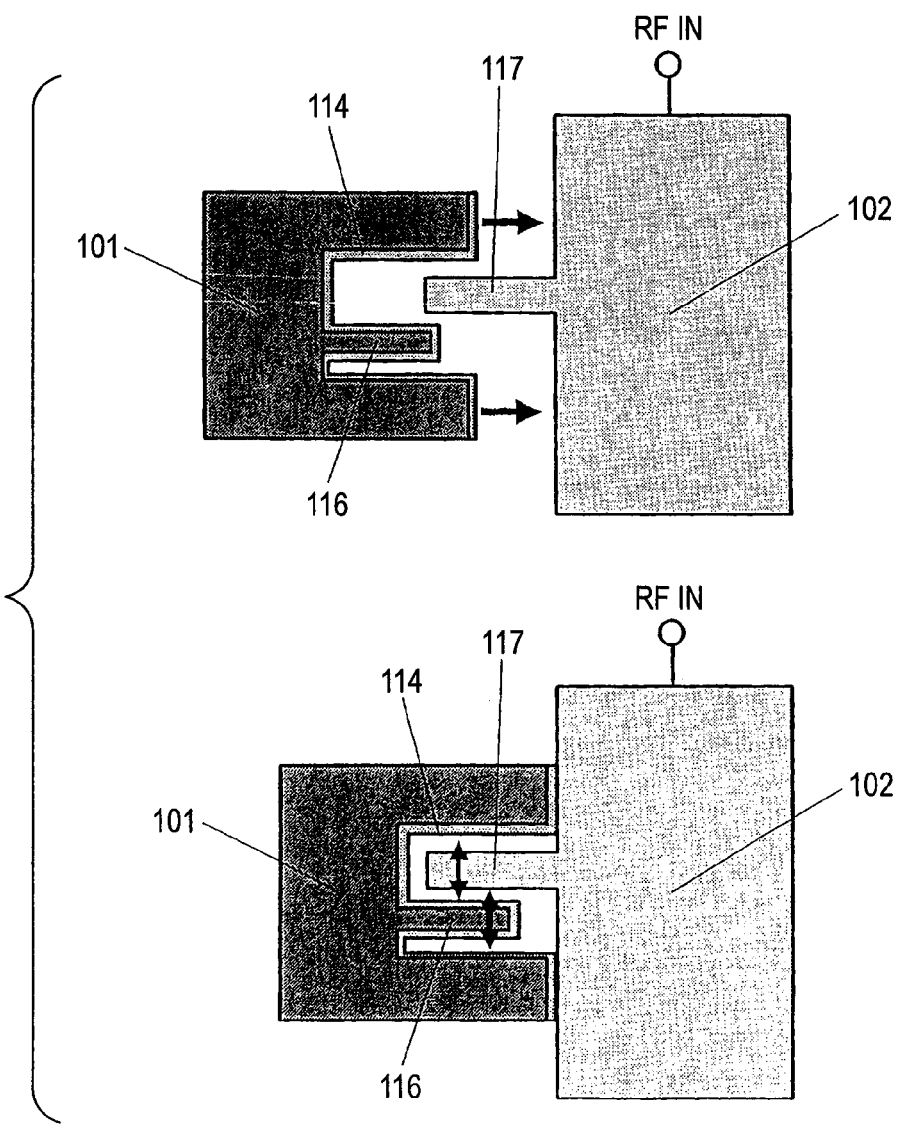

FIG. 14 is a top view showing the configuration of an electromechanical switch according to a fifth embodiment of the present invention. FIG. 15(a) is a view showing a circuit equivalent to the electromechanical switch according to the fifth embodiment of the present invention; and FIG. 15(b) is a top view showing the configuration of a contact portion of an actuator with the movable electrode of the electromechanical switch of the fifth embodiment of the present invention. In the portions of the actuators 101 contacting the movable electrode 102 in an electromechanical switch 2100, the actuator 101 is provided with a mechanical resonator 116, and the movable electrode 102 is provided with a mechanical resonator 117.

As shown in FIG. 15(b), when the actuators 101 have contacted the movable electrode 102, the mechanical resonators 116, 117 constitute cantilevers, respectively. When the high frequency signal is input from RF-IN, an AC voltage is applied between the mechanical resonators 116, 117 at a frequency identical with the frequency of the high frequency signal, whereby excitation force is generated by electrostatic force. By means of this force, the mechanical resonators 116, 117 are vibrated. The structure of the contact portion becomes equivalent to circuitry where the portion of the actuator 101 directly contacting the movable electrode 102 by way of the insulating film 114 and the portions where the mechanical resonators 116, 117 are formed are connected in parallel. As shown in FIG. 15(a), the electromechanical switch 2100 is equivalent to circuitry where the circuit of the contact portion is connected in parallel to the movable electrode 102.

Power of the high frequency signal input by way of the RF-IN travels to the contact section, where the power is consumed by the mechanical resonator as if electric energy were converted into mechanical energy. Consequently, the power transferred to the direct-contacting portions connected in parallel to the mechanical resonators is diminished, thereby enabling a reduction in potential difference and electrostatic force. Power can be consumed by the mechanical resonators 116, 117 such that electrostatic force becomes zero, whereby easy detachment of the actuators 101 becomes possible.

Figure 16:
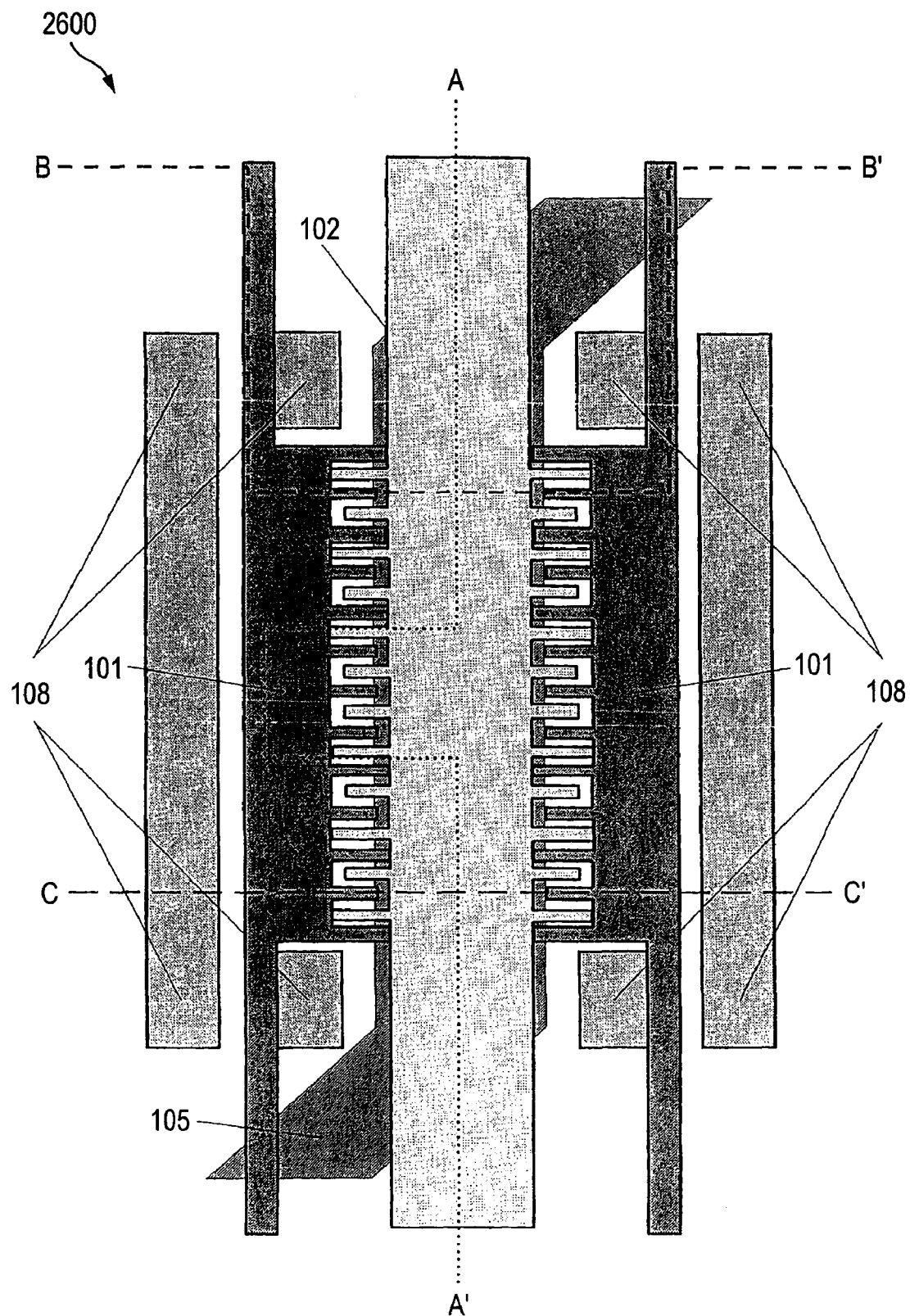
FIG. 16 A top view showing the configuration of the electromechanical switch according to the fifth embodiment of the present invention.
Figure 17:
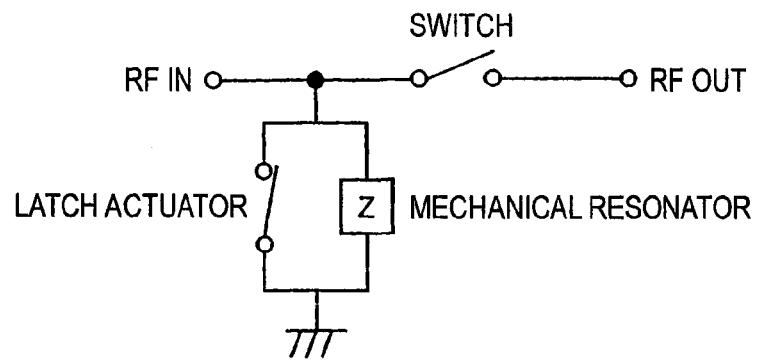
FIG. 17($a$) A view showing a circuit equivalent to the electromechanical switch according to the fifth embodiment of the present invention; and ($b$) A top view showing the configuration of a contact portion of an actuator with the movable electrode of the electromechanical switch.
Figure 17:
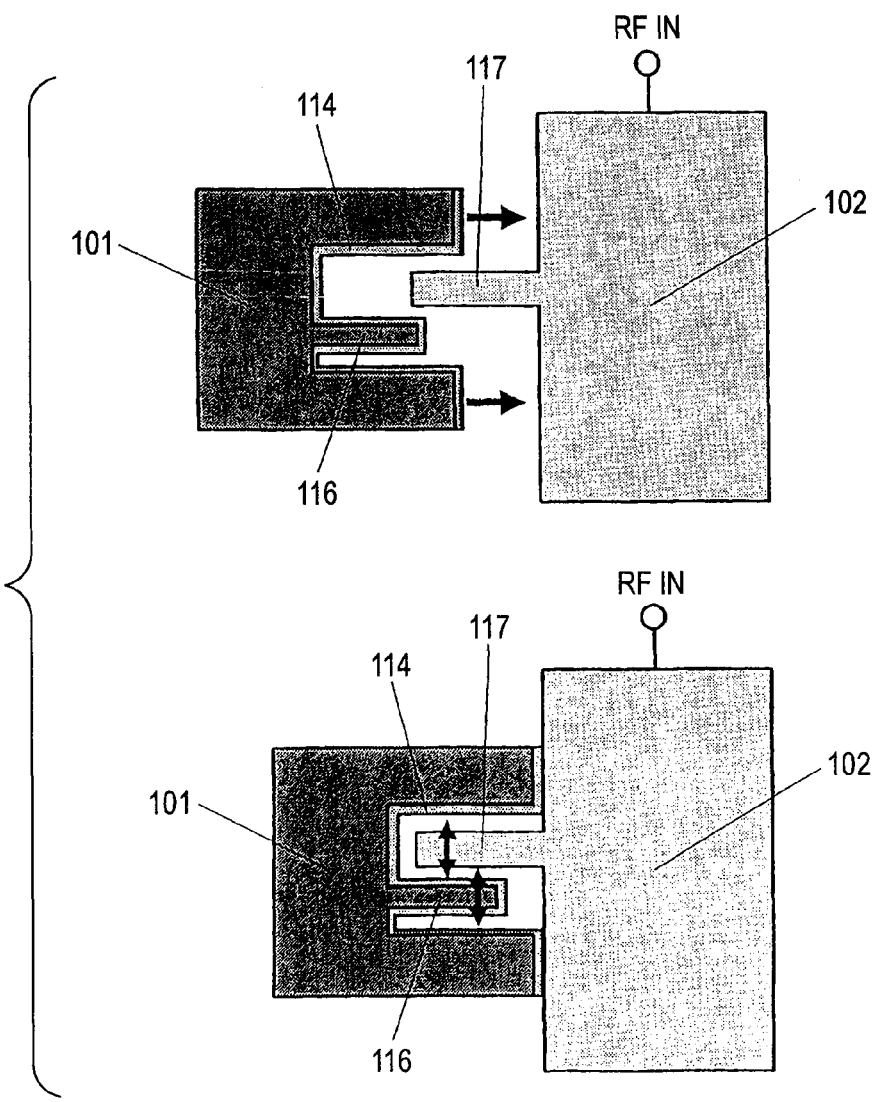

FIG. 16 is a top view showing the configuration of the electromechanical switch according to the fifth embodiment of the present invention. FIG. 17(a) is a view showing a circuit equivalent to the electromechanical switch according to the fifth embodiment of the present invention, and FIG. 17(b) is a top view showing the configuration of a contact portion of an actuator with the movable electrode of the electromechanical switch according to the fifth embodiment of the present invention. Of a plurality of comb electrodes formed between the actuators 101 and the movable electrode 102 in an electromechanical switch 2600, some comb electrodes are made short, and the mechanical resonators 116, 117 are formed in the contacting portions. The mechanism for diminishing electrostatic force induced by the high frequency signal is identical with that employed in the electromechanical switch 2100.

By means of this structure, speedup of response, a decrease in a drive voltage, and an increase in reliability of the electromechanical switch can be fulfilled.

In relation to the mechanical resonators 116, 117, a plurality of resonators having different shapes and resonance frequencies can be formed.

Figure 18:
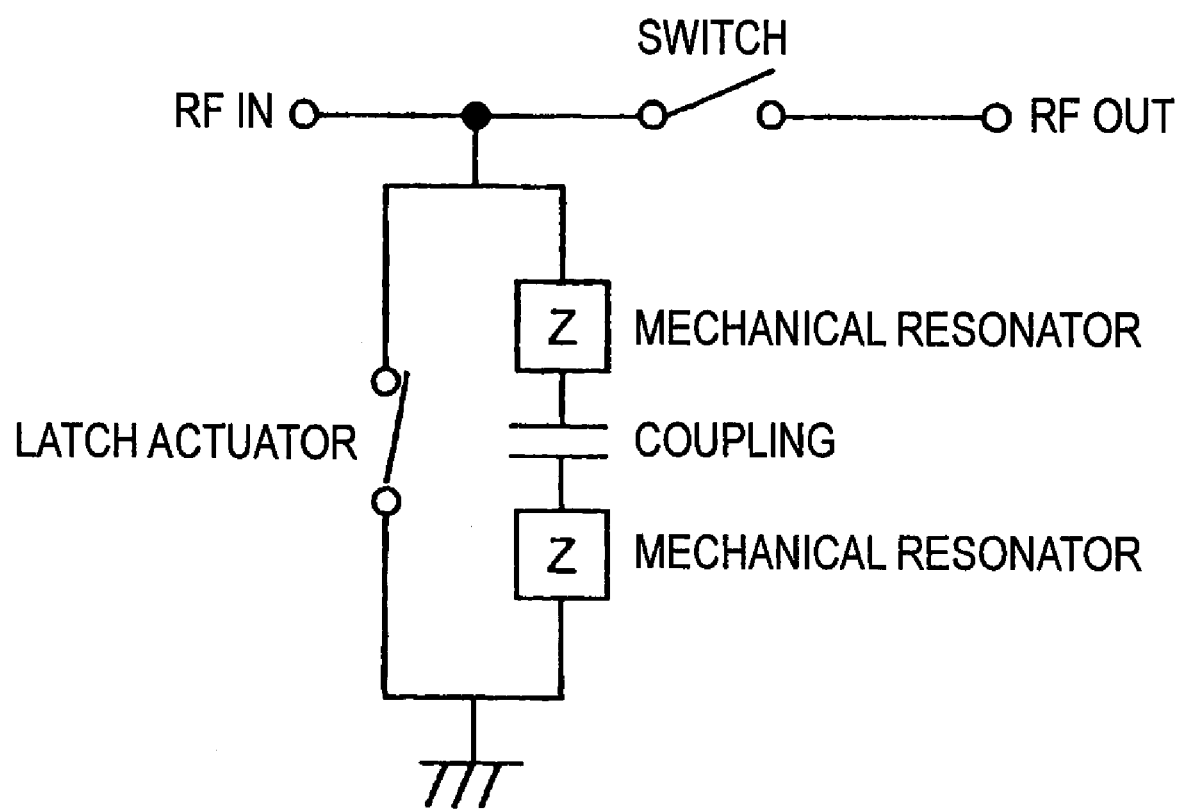
FIG. 18 A view showing a circuit equivalent to an electromechanical switch according to the fifth embodiment of the present invention.

Electrostatic capacitance is formed between the mechanical resonators 116, 117. FIG. 18 is a view showing a circuit equivalent to an electromechanical switch according to the fifth embodiment of the present invention. The degree of coupling between the mechanical resonators is changed by greatly changing electrostatic capacitance, to thus enable controlling of the resonance frequency.

The mechanical resonators 116, 117 can be provided on only either the actuator 101 or the movable electrode 102.

Sixth Embodiment

A sixth embodiment of the present invention will now be described.

Figure 19:
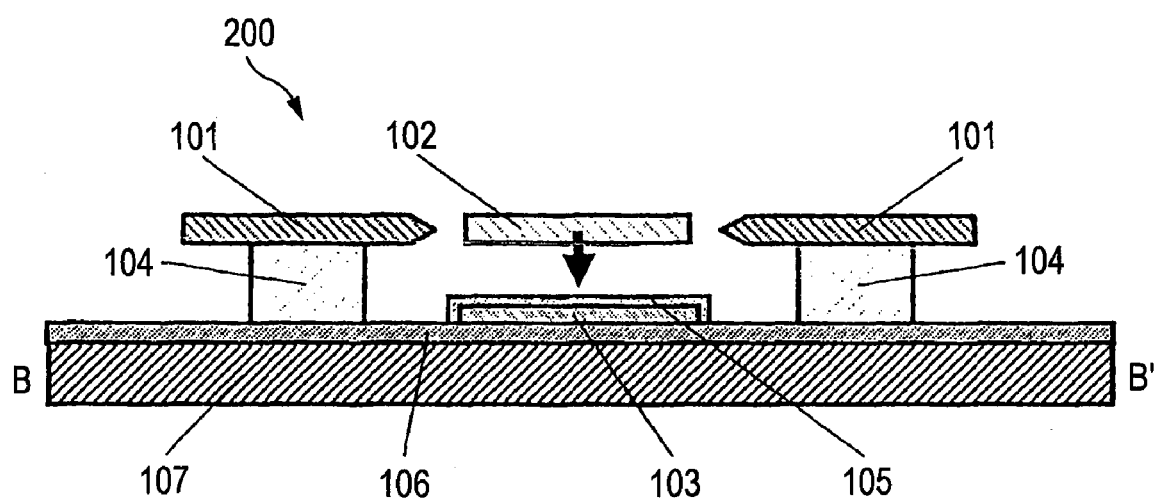
FIG. 19($a$) A cross-sectional view showing the configuration of the electromechanical switch of the sixth embodiment of the present invention in an ON state; and ($b$) A cross-sectional view showing the configuration of the electromechanical switch shown in FIG. 19($a$) in an OFF state.
Figure 19:
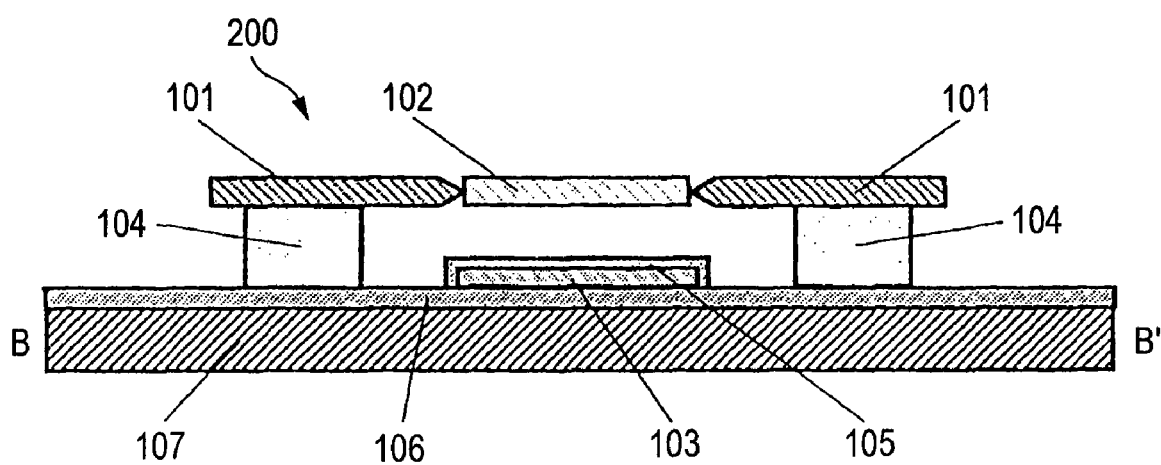

FIG. 19(a) is a cross-sectional view showing the configuration of the electromechanical switch of a sixth embodiment of the present invention in an ON state, and FIG. 19(b) is a cross-sectional view showing the configuration of the electromechanical switch of the sixth embodiment in an OFF state. In an electromechanical switch 200, the portions of the actuators 101 contacting the movable electrode 102 assume a triangular structure. The contact area of the contacting portions has become smaller than that of the contacting portions of the electromechanical switch 100 shown in FIGS. 1 through 3. By means of such a structure, abrasion or fatigue of the contacting sections can be avoided. Further, positioning is also easy.

Even when the portions of the actuators 101 contacting the movable electrode 102 assume a round structure, a similar advantage is yielded. Thus, the structure of the portions of the actuators 101 contacting the electrode 102 can be formed into various shapes, such as a round shape or an angular shape, including a triangular shape.

As above, the portions of the actuators 101 contacting the movable electrode 102 can be formed into any of various structures, including a round structure or an angular structure, such as a square structure or a wedge-shaped structure Seventh Embodiment A seventh embodiment of the present invention will now be described.

Figure 20:
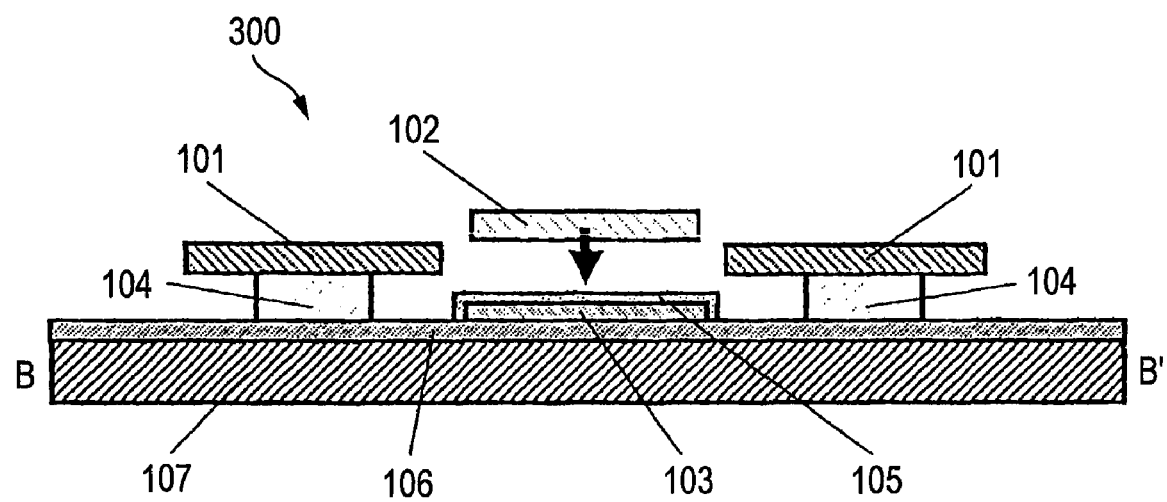
FIG. 20($a$) A cross-sectional view showing the configuration of an electromechanical switch of a seventh embodiment of the present invention in an ON state, and ($b$) A cross-sectional view showing the configuration of the electromechanical switch shown in FIG. 20($a$) in an OFF state.
Figure 20:
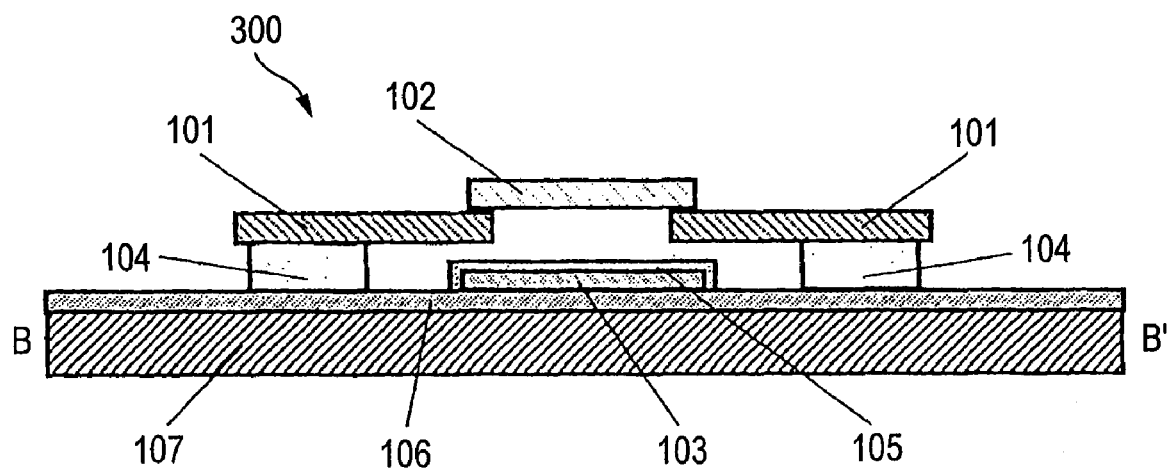

FIG. 20(a) is a cross-sectional view showing the configuration of an electromechanical switch of a seventh embodiment of the present invention in an ON state, and FIG. 20(b) is a cross-sectional view showing the configuration of the electromechanical switch of the seventh embodiment in an OFF state. As shown in FIG. 20(b), when the movable electrode is fixed in an electromechanical switch 300 during the OFF state, the actuators 101 enter positions below the movable electrode 102.

According to this configuration, even when self-actuation has arisen, the movable electrode 102 cannot be actuated downward, because it is caught by the actuators 101, thereby preventing occurrence of faulty operation. When compared with the electromechanical switch 100 shown in FIGS. 1 through 3, there is eliminated a necessity for the force required to bring the movable electrode 102 sandwiched between the actuators 101 to thus become fixed. Hence, only the force for actuating the actuators 101 is required.

Accordingly, the force for actuating the actuators can be reduced, which in turn results in a decrease in power consumption of the device. Further, when compared with the electromechanical switch 100, there is no necessity for fixing the movable electrode 102, which is about to cause downward self-actuation, by means of the side surfaces of the actuators 101, and abrasion or fatigue of the contacting portions can be avoided. The structure of the contacting portion of the actuator 101 assumes a square shape.

Eighth Embodiment

Figure 21:
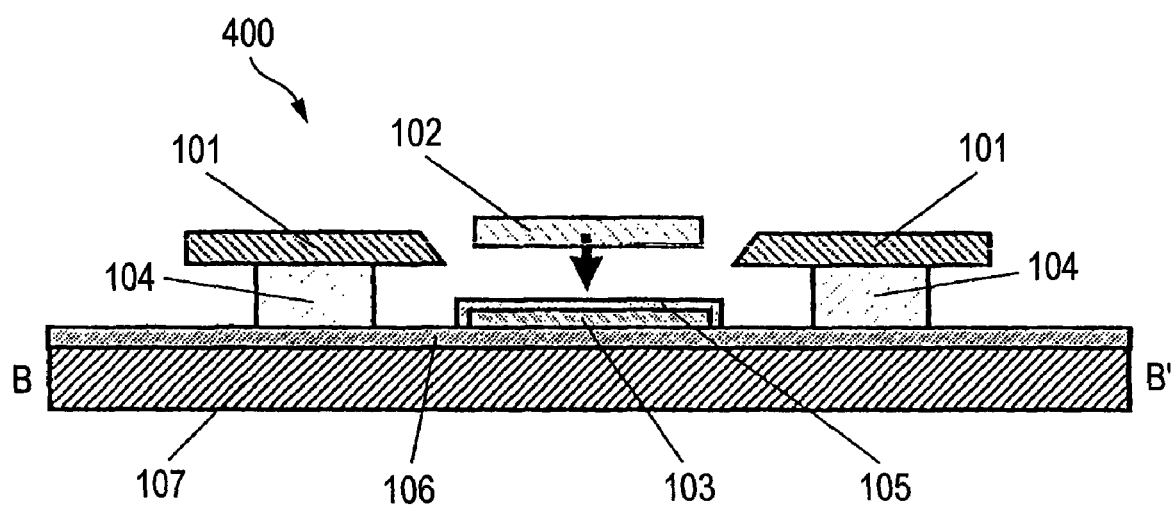
FIG. 21($a$) A cross-sectional view showing the configuration of the electromechanical switch of an eighth embodiment of the present invention in an ON state; and ($b$) A cross-sectional view showing the configuration of the electromechanical switch shown in FIG. 21($a$) in an OFF state.
Figure 21:
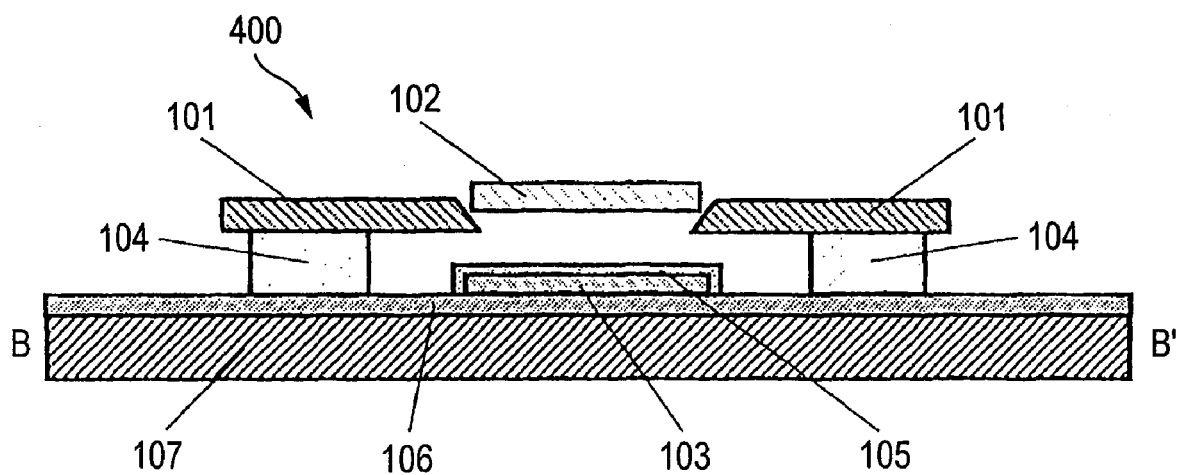

An eighth embodiment of the present invention will now be described. FIG. 21(a) is a cross-sectional view showing the configuration of the electromechanical switch of an eighth embodiment of the present invention in an ON state, and FIG. 21(b) is a cross-sectional view showing the configuration of the electromechanical switch of the eighth embodiment in an OFF state. In an electromechanical switch 400, the portions of the actuators 101 contacting the movable electrode 102 assume a wedge-shaped form.

By means of this structure, as compared with the electromechanical switch 300, the amount of displacement required to cause the actuators 101 to enter positions below the movable electrode 102 can be reduced. For instance, in a case where the actuator 101 has a thickness of 1 μM, a wedge-shaped tip end has an angle of 45°, and the portion of the actuator 101 contacting the movable electrode 102 is an intermediate portion of an inclined face of the wedge shape, the only requirement is to insert the actuators 101 having a thickness of 0.5 μm to positions below the movable electrode 102. When the gap between the actuators 101 and the movable electrode 102 is 0.6 μm, the amount of displacement of the actuators 101 can be set to about 1.1 μm. So long as the amount of displacement can be reduced, there is no necessity for great drive force or a great drive voltage, which in turn results in a decrease in power consumption of the device.

As compared with the electromechanical switch 300, the actuators 101 formed on the posts 104 can be formed at positions elevated from a substrate 107. Thus, a margin for the gap among the actuators 101, the fixed electrode 103, and the insulating film 105 can be assured. By means of this configuration, simplification of manufacturing processes and electrical isolation of the actuators 101 from the fixed electrode 103 can be achieved.

Ninth Embodiment

A ninth embodiment of the present invention will now be described.

Figure 22:
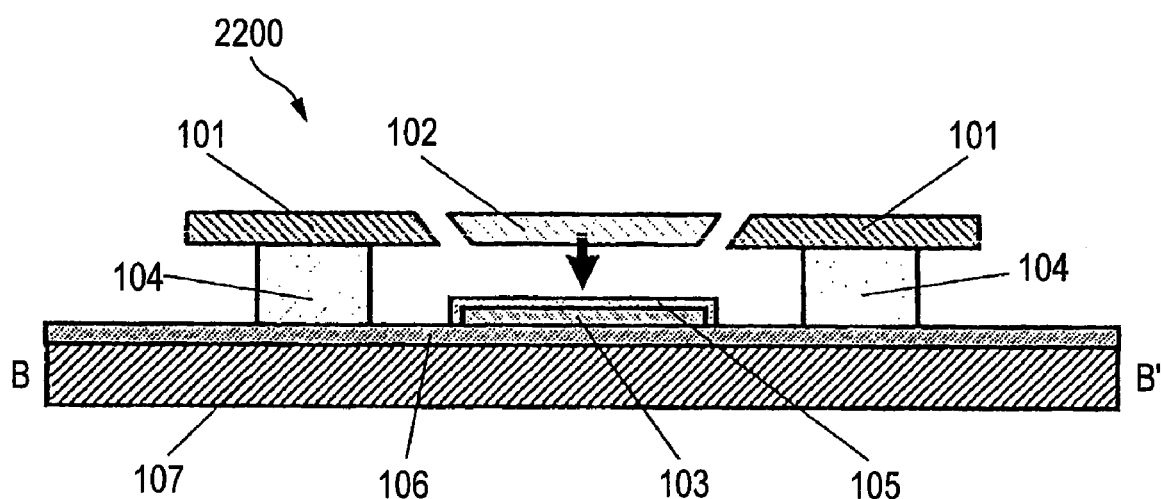
FIG. 22($a$) A cross-sectional view showing the configuration of the electromechanical switch of a ninth embodiment of the present invention in an ON state; and ($b$) A cross-sectional view showing the configuration of the electromechanical switch shown in FIG. 22($a$) in an OFF state.
Figure 22:
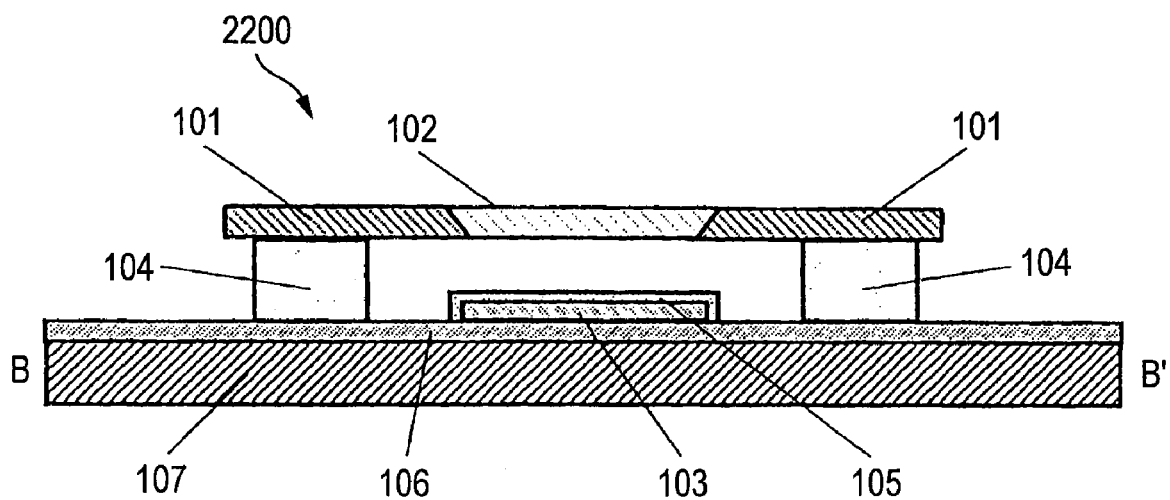

FIG. 22(a) is a cross-sectional view showing the configuration of the electromechanical switch of a ninth embodiment of the present invention in an ON state, and FIG. 22(b) is a cross-sectional view showing the configuration of the electromechanical switch of the ninth embodiment in an OFF state. In an electromechanical switch 2200, the portions of the actuators 101 contacting the movable electrode 102 assume a wedge-shaped structure.

By means of this structure, as compared with the electromechanical switch 400, the contact area between the actuators 101 and the movable electrode 102 can be increased, and concentration of stress on the contacting portions can be lessened. Frictional force exerted on and material fatigue arising in the contacting portions can be diminished, which in turn leads to enhanced reliability.

As above, the portions of the actuators 101 contacting the movable electrode 102 can be formed into any of various structures, including a round structure or an angular structure, such as a square structure or a wedge-shaped structure.

Even when the structure of the portions of the actuators 101 contacting the movable electrode 102 is of rounded angular type, a similar advantage is yielded. Thus, the structure of the portions of the actuators 101 contacting the movable electrode 102 can be formed into various forms, including a wedge shape, such as an angular shape or a round shape.

Although the present embodiment has described the structure of the portions of the actuators 101 contacting the movable electrode 102, the movable electrode 102 may have a round structure or an angular structure, including a square structure or a wedge-shaped structure. A similar advantage can be yielded.

Tenth Embodiment

A structure of the actuator 101 and a method for actuating the same are now described as a tenth embodiment of the present invention.

Figure 23:
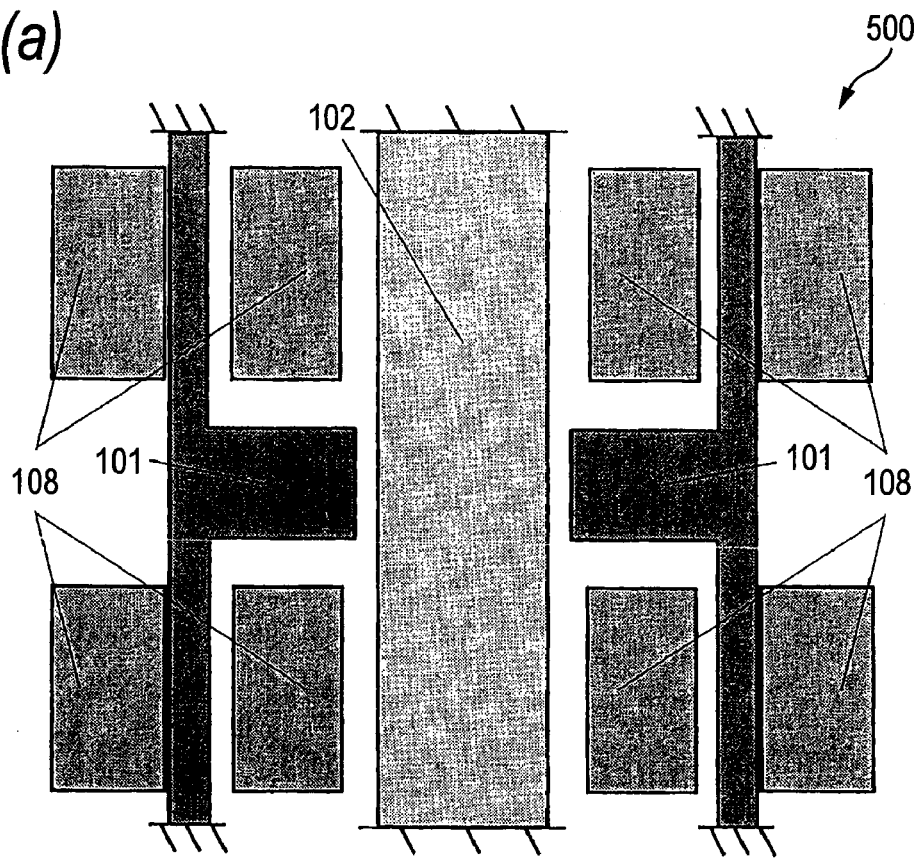
FIG. 23($a$) A top view showing the configuration of a electromechanical switch of a tenth embodiment of the present invention in an ON state, and ($b$) A top view showing the configuration of the electromechanical switch shown in FIG. 23($a$) in an OFF state.
Figure 23:
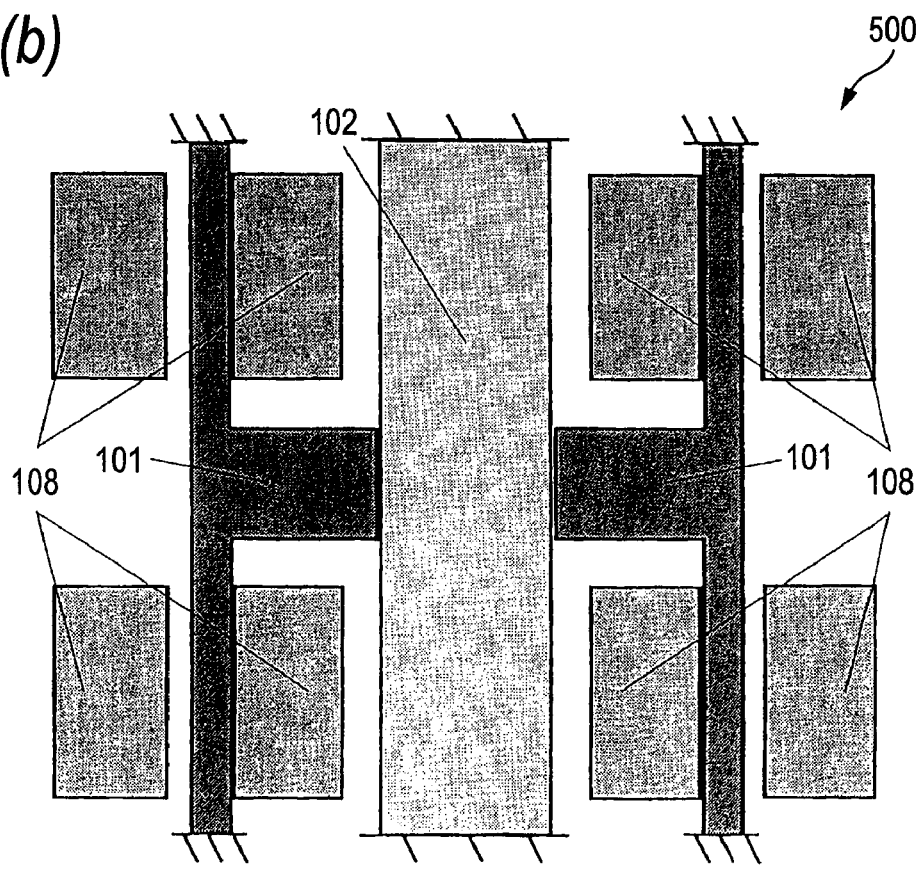

FIGS. 23(a) and 23(b) are views for describing an actuating method related to the shape of an electrode as a tenth embodiment. FIGS. 23(a) and 23(b) are views showing the principal section, which corresponds to FIG. 1. FIG. 23(a) is a cross-sectional view of the principal section showing the configuration of a electromechanical switch of a tenth embodiment of the present invention in an ON state, and FIG. 23(b) is a top view showing the configuration of the electromechanical switch of the tenth embodiment in an OFF state. In an electromechanical switch 500, the actuators 101 are formed into a beam whose both ends are fixedly supported by the post sections 104. Drive electrodes 108 are formed on the post sections 104 and on both sides of the respective actuators 101, such that the actuator 101 is sandwiched between the drive electrodes 108.

As shown in FIG. 23(b), during the OFF state of the switch, a voltage is applied between the actuators 101 and the drive electrodes 108 located close to the movable electrode 102, whereby the actuators 101 are actuated toward the movable electrode 102 by means of electrostatic force, to thus fix the movable electrode 102. In contrast, in the ON state of the switch, a voltage is applied between the actuator 101 and the outer drive electrodes 108, to thus actuate the actuators 101 outwardly by means of electrostatic force. By means of the movable electrode 102 being brought out of a fixed state, the movable electrode 102 is released.

By means of this structure, driving force can be imparted to the actuators 101 even in the ON state and the OFF state, thereby enabling high-speed response and a decrease in the drive voltage of the actuators 101.

A drive characteristic of, e.g., about 5 μs·5V is feasible. By means of forming the actuators 101 in the form of beams whose both ends are supported, the stability of the structural body can be enhanced. Durability and reliability can be enhanced.

Eleventh Embodiment

An eleventh embodiment of the present invention will now be described.

Figure 24:
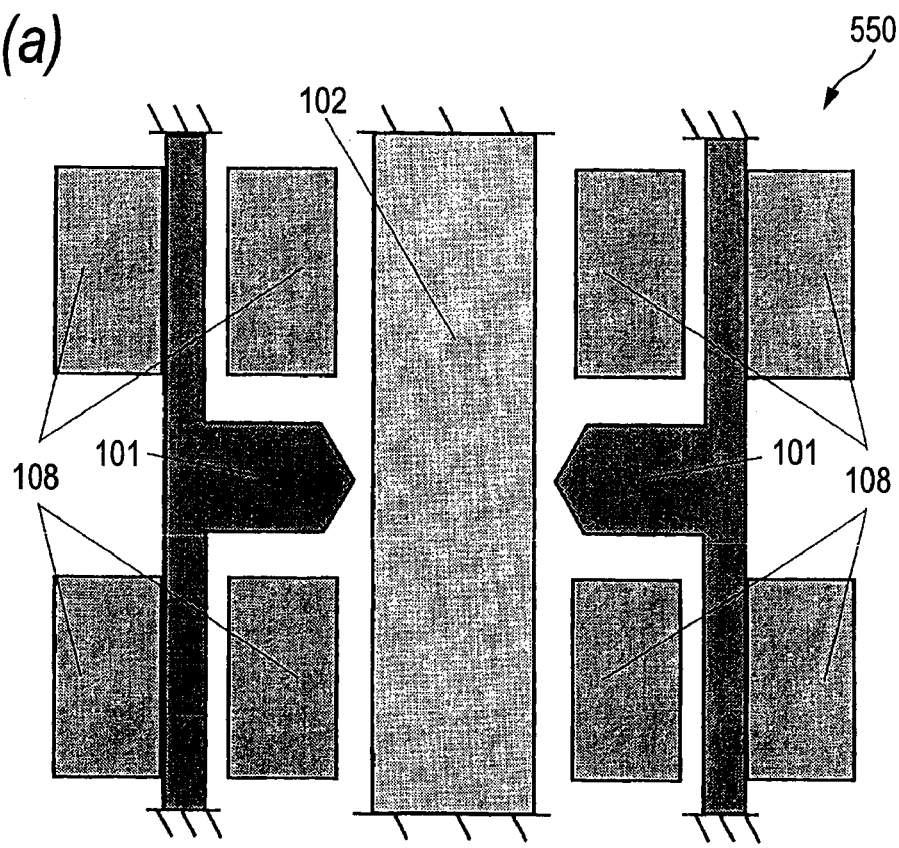
FIG. 24($a$) A top view showing the configuration of an electromechanical switch of an eleventh embodiment of the present invention in an ON state; and ($b$) A top view showing the configuration of the electromechanical switch shown in FIG. 24($a$) in an OFF state.
Figure 24:
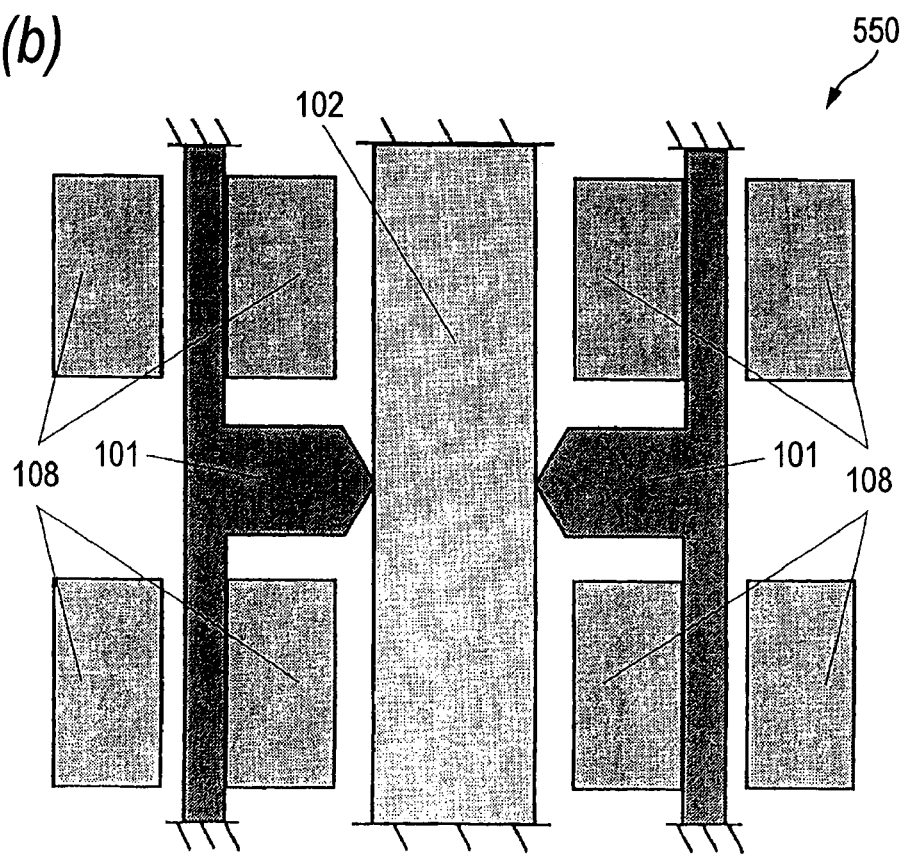

FIG. 24(a) is a top view showing the configuration of an electromechanical switch of an eleventh embodiment of the present invention in an ON state, and FIG. 24(b) is a top view showing the configuration of the electromechanical switch of the eleventh embodiment in an OFF state. In an electromechanical switch 550, the structure of the portions of the actuators 101 contacting the movable electrode 102 assumes a triangular shape. As compared with the electromechanical switch 500 shown in FIG. 23, the contact area is reduced.

By means of such a structure, abrasion or fatigue of the contacting portions can be avoided. Moreover, the area of an overlap between the actuators 101 and the movable electrode 102 is reduced by means of the structure, so that electrical isolation can be achieved. As above, the structure of the portions of the actuators 101 contacting the movable electrode 102 assumes various shapes, including the shape of a wedge, such as an angular shape or a round shape. A similar advantage is yielded.

Twelfth Embodiment

A twelfth embodiment of the present invention will now be described.

Figure 25:
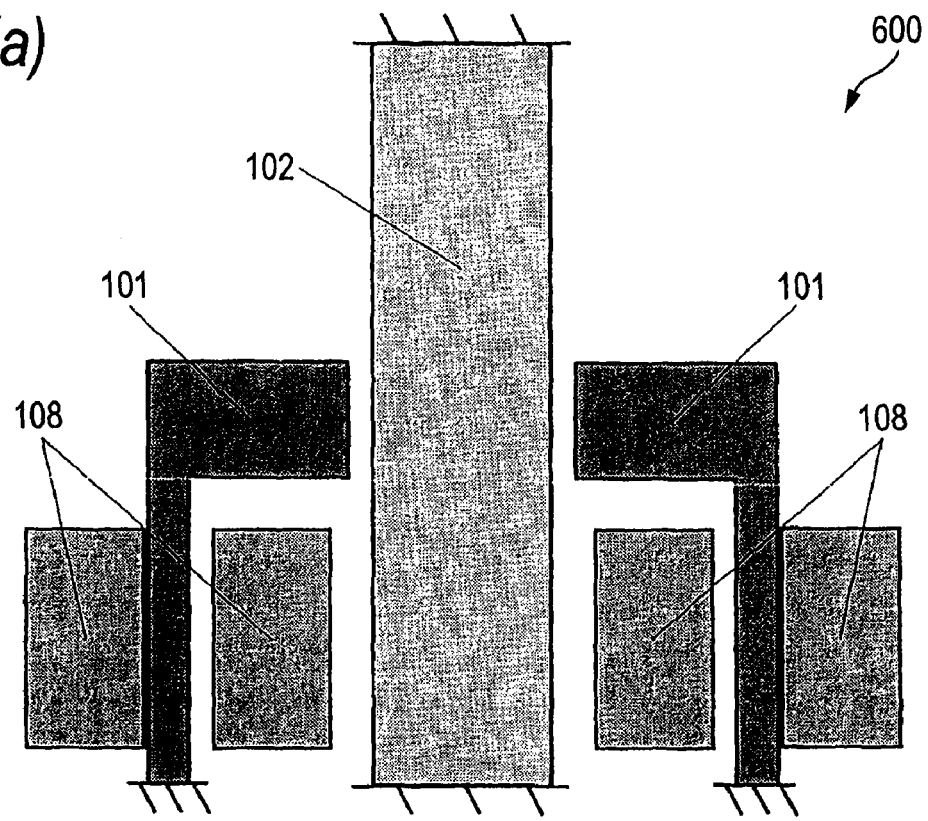
FIG. 25($a$) A top view showing the configuration of an electromechanical switch of a twelfth embodiment of the present invention in an ON state; and ($b$) A top view showing the configuration of the electromechanical switch shown in FIG. 25($a$) in an OFF state.
Figure 25:
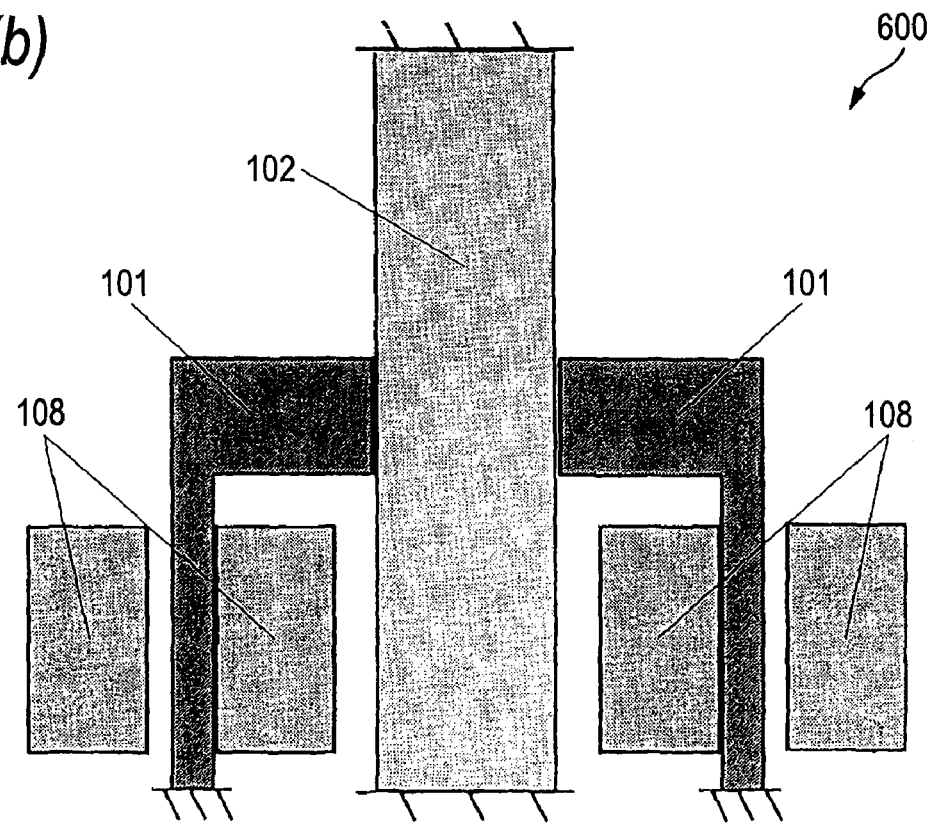

FIG. 25(a) is a top view showing the configuration of an electromechanical switch of a twelfth embodiment of the present invention in an ON state, and FIG. 25(b) is a top view showing the configuration of a modification of the electromechanical switch of the twelfth embodiment in an OFF state. In an electromechanical switch 600, each of the actuators 101 is formed into a cantilever whose one end is fixed to the post section 104. As above, the structure of the switch can be simplified and achieve space saving as a result of each of the actuators 101 being formed into a cantilever. By means of adopting the cantilever, stress can be released, and spring force can be reduced. Hence, the electromechanical switch can be actuated at low voltage and high speed.

Thirteenth Embodiment

A thirteenth embodiment of the present invention will now be described.

Figure 26:
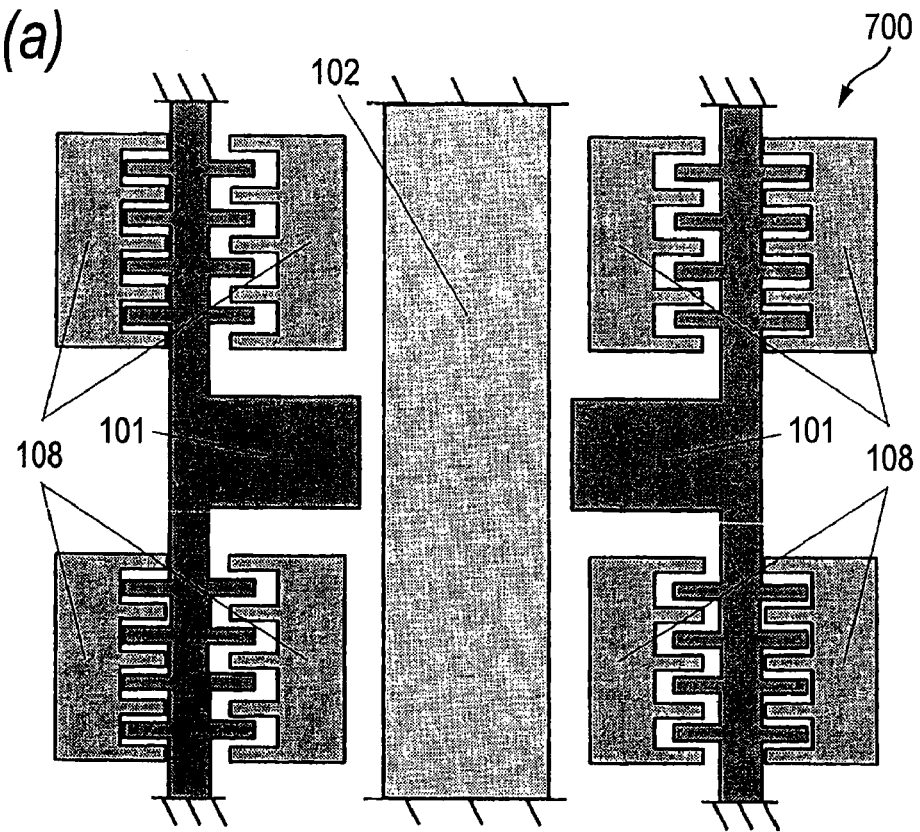
FIG. 26(a) A top view showing the configuration of an electromechanical switch of a thirteenth embodiment of the present invention in an ON state; and (b) A top view showing the configuration of the electromechanical switch shown in FIG. 26(a) in an OFF state.
Figure 26:
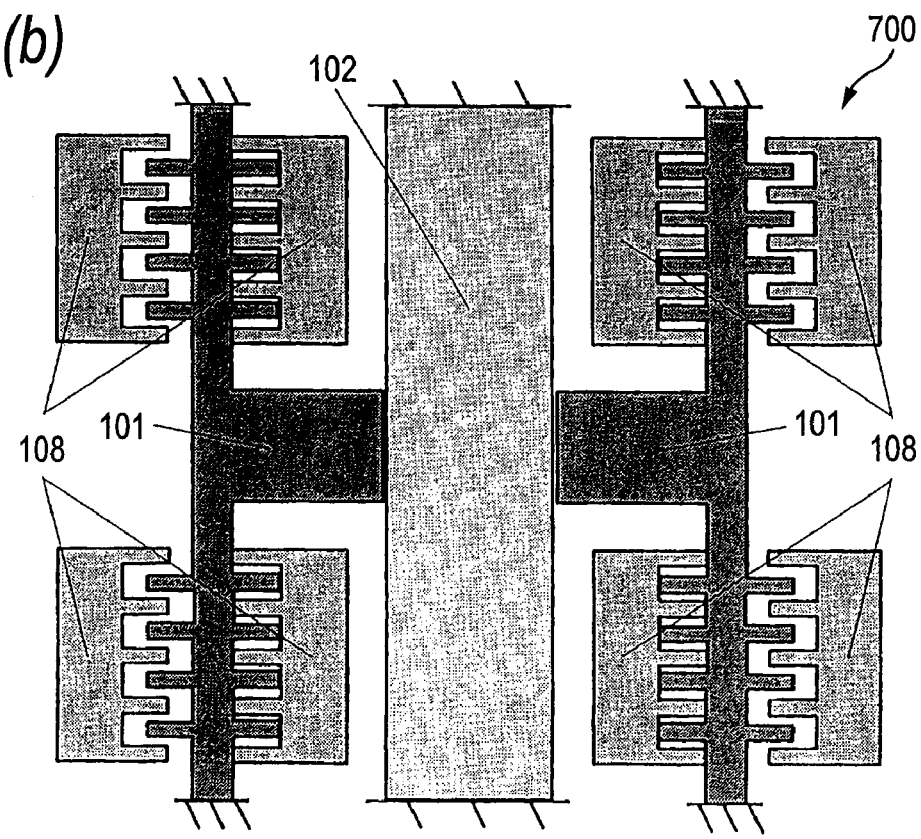

FIG. 26(a) is a top view showing the configuration of an electromechanical switch of a thirteenth embodiment of the present invention in an ON state, and FIG. 26(b) is a top view showing the configuration of the electromechanical switch of the thirteenth embodiment in an OFF state. In an electromechanical switch 700, each of the actuators 101 is formed into a beam whose both ends are fixedly supported by the post sections 104.

The drive electrodes 108 and the actuators 101 are given a structure of comb electrodes. As compared with the electromechanical switch 500 shown in FIG. 24, the electromechanical switch has a structure, where the opposing area between the electrodes to which electrostatic force is applied can be increased. By means of this structure, greater electrostatic force can be generated for a given voltage. High-speed response of the actuators 101 and a decrease in the drive voltage of the actuators 101 become possible. The amount of displacement of the actuators 101 can be increased. As above, the structure of the drive electrodes 108 and the actuators 101 can assume various structures, including a parallel electrode structure and a comb electrode structure.

Fourteenth Embodiment

A fourteenth embodiment of the present invention will now be described.

Figure 27:
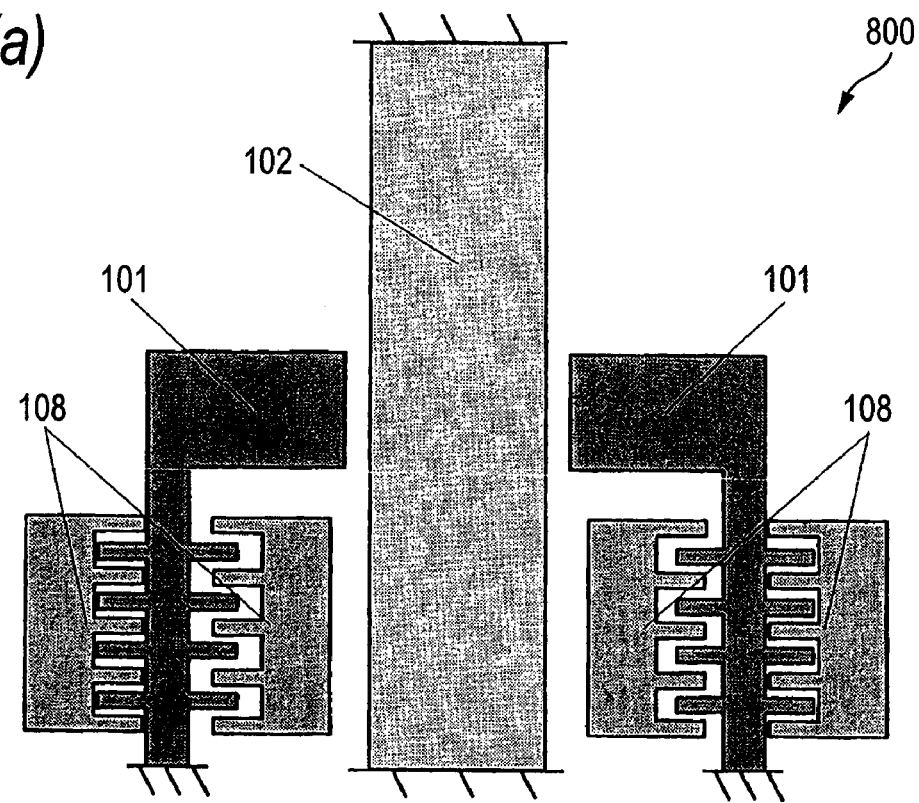
FIG. 27(a) A top view showing the configuration of an electromechanical switch of a fourteenth embodiment of the present invention in an ON state; and (b) A top view showing the configuration of the electromechanical switch shown in FIG. 27(a) in an OFF state.
Figure 27:
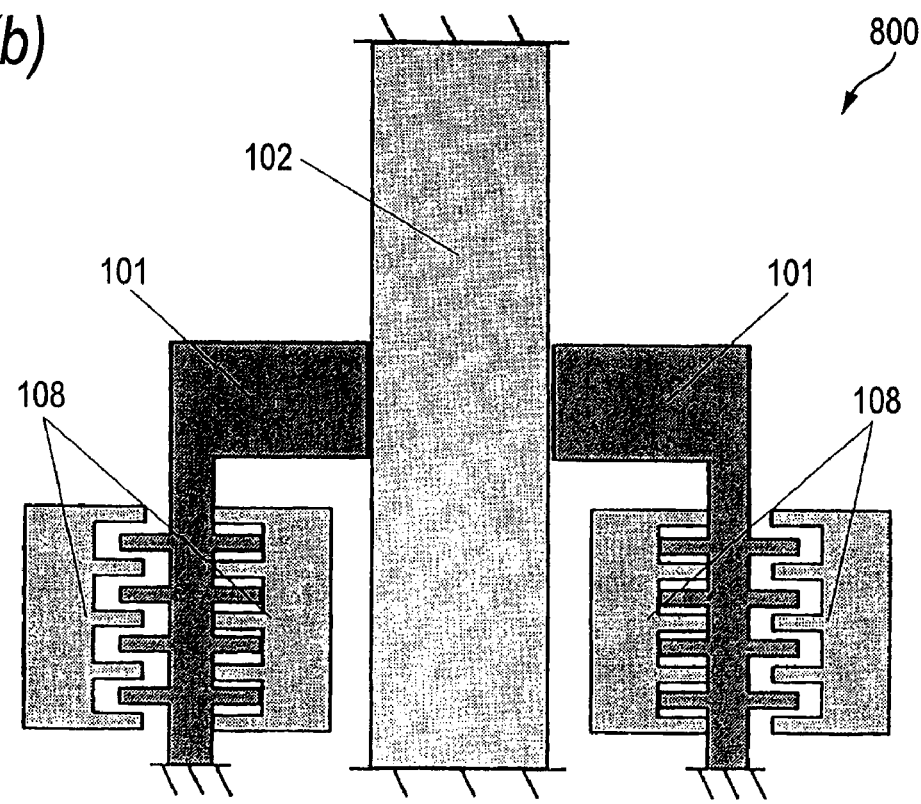

FIG. 27(a) is a top view showing the configuration of an electromechanical switch of a fourteenth embodiment of the present invention in an ON state, and FIG. 27(b) is a top view showing the configuration of the electromechanical switch of the fourteenth embodiment in an OFF state. As indicated by an electromechanical switch 800, even when the comb electrode structure is applied to the drive section for the actuators 101, each of the actuators 101 can be formed into a cantilever whose one end is fixed to the top of the post section 104. Thus, even when the structure of the drive electrode 108 and that of the actuators 101 have been changed, the actuator 101 can be formed into various structures including a beam whose both ends are supported, or a cantilever. Thus, the structure can also be simplified.

As above, even when the structure of the drive electrode 108 and that of the actuator 101 have been changed, the structures are simplified by means of forming the actuators 101 into cantilevers, whereby space saving can be achieved. Further, as a result of the actuators 101 being formed into cantilevers, stress is released, and spring force can be diminished. Hence, the electromechanical switch can be actuated at low voltage and high speed.

Fifteenth Embodiment

A fifteenth embodiment of the present invention will now be described.

FIG. 28(a) is a top view showing the configuration of an electromechanical switch of the fifteenth embodiment of the present invention in an ON state, and FIG. 28(b) is a top view showing the configuration of the electromechanical switch of the fifteenth embodiment in an OFF state. In an electromechanical switch 900, each of the actuators 101 is formed into a beam whose both ends are fixed on the post sections 104.

A drive section 109 of the actuator 101 is formed into a piezoelectric actuator including a bimorph element and a uniform element. By means of switching the direction of the drive voltage applied to the drive section 109, the actuators 101 can be actuated from the switch ON position to the switch OFF position as shown in FIGS. 28(a) and 28(b). Drive force can be imparted to the actuators during the ON state and the OFF state by adopting the piezoelectric actuators. Thus, speedup of response and a decrease in the drive voltage of the actuators can be achieved.

The amount of displacement of the actuators 101 can be increased. Further, as compared with the electromechanical switch 500 shown in FIG. 7, there is no necessity for forming the drive electrodes 108. Hence, simplification of the structure and space saving can be attained. Moreover, there is no necessity for forming the actuators 101 from a conductor, and the actuators 101 can be formed from a material of high electrical impedance ranging from an insulator to a semiconductor. Hence, electrical coupling between the movable electrode 102 and the lower electrode 103 can be prevented. Each of the actuators 101 is divided into a portion which directly contacts the movable electrode 102, and a movable beam portion. These portions can be formed from respective appropriate materials. As mentioned previously, the portion of the actuator 101 that directly contacts the movable electrode 102 can be formed from a material having high electrical impedance, ranging from an insulator to a semiconductor. The movable beam portion of the actuator 101 can be formed from a conductive material. The materials can be switched with each other. Thus, the actuators 101 can be actuated by various systems, including an electrostatic force driving method, a piezoelectric driving method, or an electromagnetic force driving method.

Sixteenth Embodiment

A sixteenth embodiment of the present invention will now be described.

FIG. 29(a) is a top view showing the configuration of an electromechanical switch of a sixteenth embodiment in an ON state, and FIG. 29(b) is a top view showing the configuration of the electromechanical switch of the sixteenth embodiment in an OFF state. As indicated by an electromechanical switch 1000, even when a piezoelectric actuator is applied to the drive section 109 of the actuator 101, the actuator 101 can be formed into a cantilever whose one end is fixed to the top of the post section 104.

As above, even when the driving system for the actuators 101 has been changed, simplification of the structure and space saving can be achieved by means of forming the actuators 101 into cantilevers. Further, as a result of adoption of the cantilever, stress is released, and the spring force can be lowered. Hence, the electromechanical switch can be actuated at low voltage and at high speed.

Figure 43:
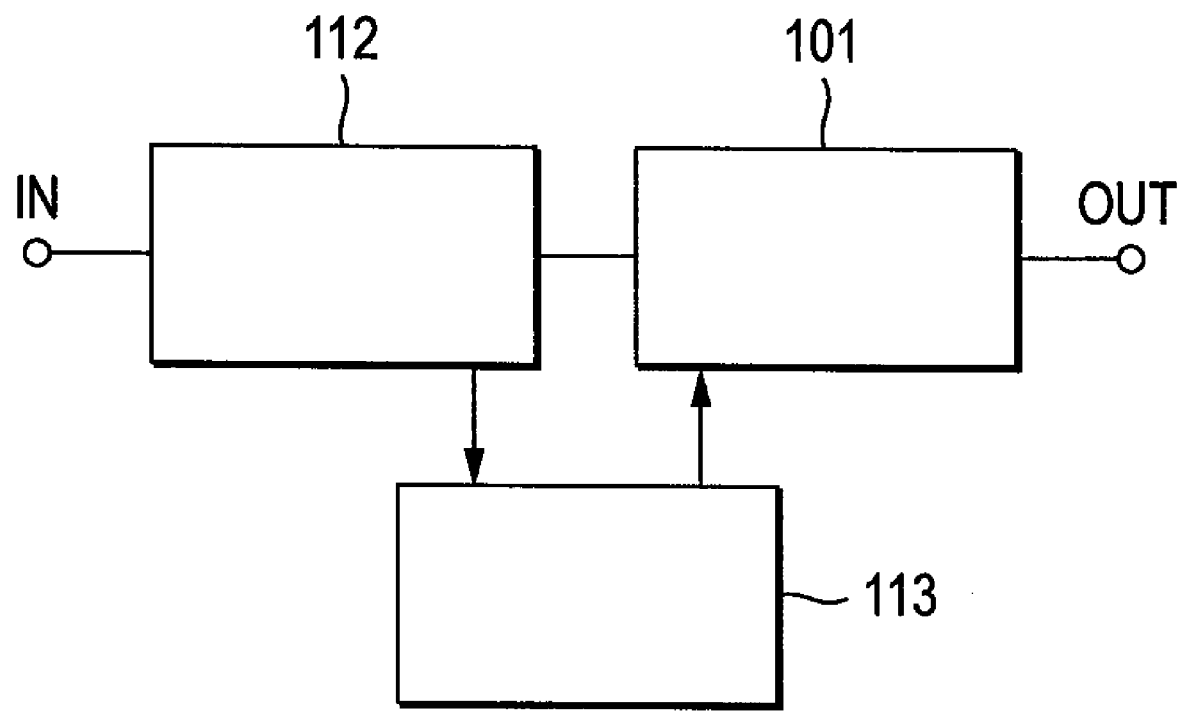
FIG. 43 A block diagram of a control circuit of the electromechanical switch according to the first and nineteenth embodiments of the present invention.

As indicated by the block diagram of the control circuit of the electromechanical switch according to the first embodiment shown in FIG. 43, in the electromechanical switch of the present invention has a mechanism for detecting the power value of an input signal, such as a signal power detector 112. Only when a signal of power which induces self-actuation or a signal of heavy power of the order of at least 2 W or more, is input, the actuators 101 can be controlled so as to be actuated by a control signal generator 113, thereby avoiding occurrence of self-actuation.

In the present embodiment, the switch can be switched between ON and OFF by utilization of self-actuation. In the ON state, the movable electrode 102 is released from the fixed state realized by the actuators 101, and the movable electrode 102 is actuated downwardly by means of self-actuation. In contrast, in the OFF state, the actuators 101 fix the movable electrode 102, and the movable electrode 102 is fixed to an elevated position.

In this case, since the switch is actuated by means of the power of the input signal, no additional drive source is required, which contributes to a reduction in power consumption of the device and miniaturization of the same. Switching between the ON position and the OFF position induced by self-actuation and switching between the ON position and the OFF position induced by the drive source can be switched according to occurrence/nonoccurrence of self-actuation. As shown in FIG. 43, when power which induces self-actuation has been detected by the power detector 112, the control signal generator 113 actuates the actuators 101 only in the OFF state. In contrast, when a signal of power which does not induce self-actuation has been detected, the control signal generator 113 can apply a voltage between the movable electrode 102 and the fixed electrode 103 in the ON state.

In the present embodiment, the drive electrodes 108 are provided only on the sides of the actuators 101 facing the movable electrode 102. The drive electrodes 108 impart drive force by means of electrostatic force only when the movable electrode is fixed in the OFF state. In the ON state, the actuators can be actuated by means of only spring force of the actuators 101. Conversely, the drive electrodes 108 can be provided only on the outside of the actuators 101. Only when the movable electrode is released in the ON state, the drive force is applied to the actuators by means of electrostatic force, and the actuators 101 can be actuated by means of only the spring force of the actuators in the OFF state. As mentioned above, the layout of the drive electrodes 108, including providing the drive electrodes 108 on only one side of the movable electrodes 102, and the driving control method can be changed in various manners so that the drive force can be imparted to the actuators 101 in only the ON state or the OFF state.

In the electromechanical switches 900 and 1000, drive force is imparted by means of the piezoelectric actuator only when the movable electrode is fixed in the OFF state. The actuators can be actuated by means of only the spring force of the actuators 101 and that of the drive section 109 in the ON state. Conversely, the drive force is imparted by means of the piezoelectric actuator only when the movable electrode is released in the ON state, and the actuators can be actuated by means of only the spring force of the actuators 101 and that of the drive section 109 in the OFF state. As above, the structure of the drive section 109 and the drive control method can be changed in various manners so that, in only the ON state or the OFF state, the drive force can be imparted to the actuators 101 of the drive section 109.

Although the present embodiment has shown a case where the drive direction of the actuators 101 is horizontal in relation to the substrate, various drive directions, including the vertical direction, are available. The layout of the drive electrode 108, the structure of the drive section 109, and the drive control method can be changed such that desired drive force is applied to the actuators 101 in a desired direction.

Although the present embodiment has described the switch (a series switch) configured such that variable capacitance is connected in series to a transmission channel in circuitry equivalent to the electromechanical switch, the present invention can also be applied to a switch (a shunt switch) configured such that variable capacitance is connected in parallel to the transmission channel and the channel is connected further to the ground. In the shunt switch, the position of the movable electrode in the shunt switch achieved in the ON state and the OFF state becomes opposite that of the movable electrode in the series switch. In the ON state, the movable electrode is located at an elevated position, and the impedance of variable capacitance is high. Hence, the high frequency signal travels, in unmodified form, through the transmission channel and is output. In the OFF state, the movable electrode is located at a lowered position, and the impedance of variable capacitance is low. Hence, the high frequency signal travels to the ground by way of the variable capacitance side. Therefore, the signal is not traveled to the output side. Thus, the shunt switch opens or closes the signal propagation channel. The movable electrode fixing mechanism of the present invention fixes the movable electrode in the shunt switch in the ON state and releases the movable electrode in the OFF state. Thus, the movable electrode fixing mechanism of the present invention can be applied to electromechanical switches of various types including the series switch and the shunt switch.

In the present embodiment, a mechanism for actuating the actuators 101 is provided. The movable electrode 102 may be fixed by utilization of self-actuation of the actuators 101 which is induced by the power of the signal input to the movable electrode 102. For instance, when a signal having power of 5V or more is input to the movable electrode 102, the movable electrode 102 is self-actuated in the direction of the fixed electrode 103. In such a case, an arrangement is made such that the actuators 101 are also self-actuated in the direction of the movable electrode 102. Self-actuation of the movable electrode 102 can be avoided by means of fixing the movable electrode 102.

Figure 28:
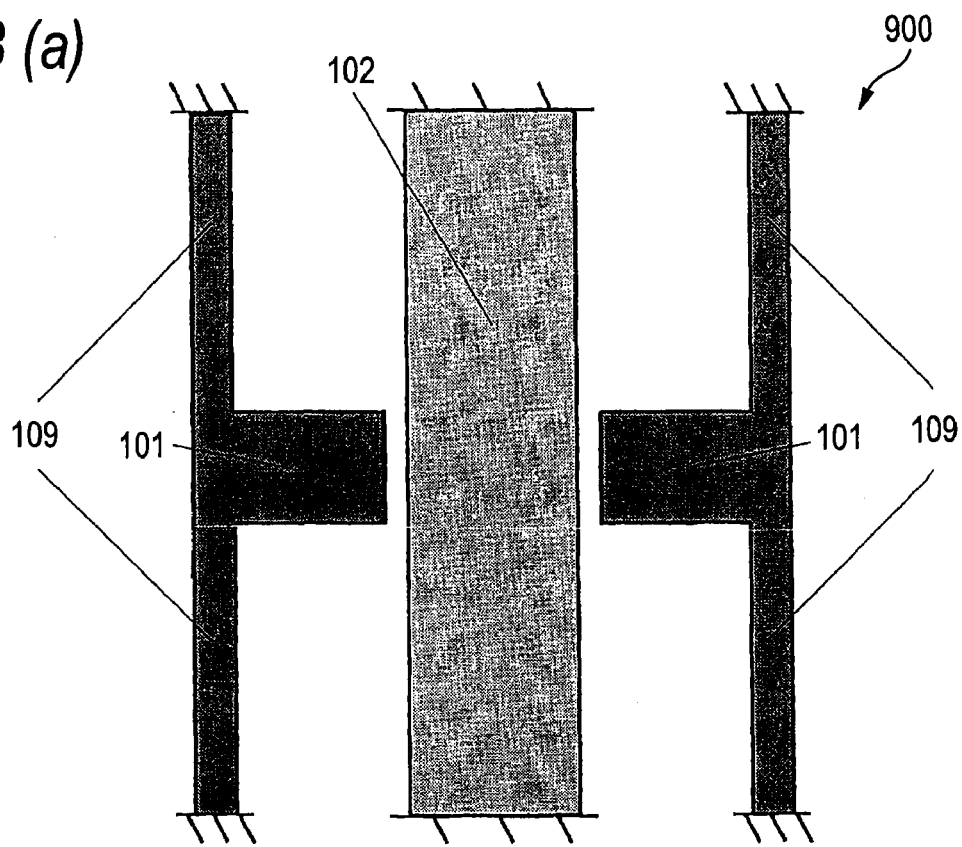
FIG. 28(a) A top view showing the configuration of an electromechanical switch of a fifteenth embodiment of the present invention in an ON state; and (b) A top view showing the configuration of the electromechanical switch shown in FIG. 28(a) in an OFF state.
Figure 28:
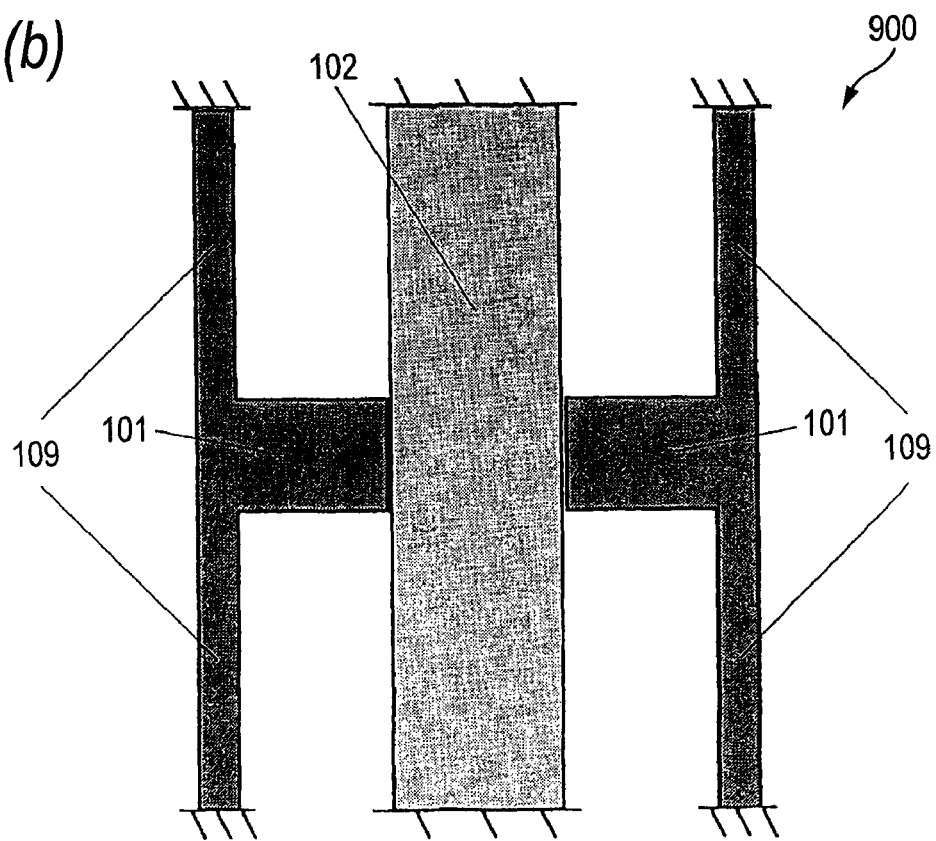
Figure 29:
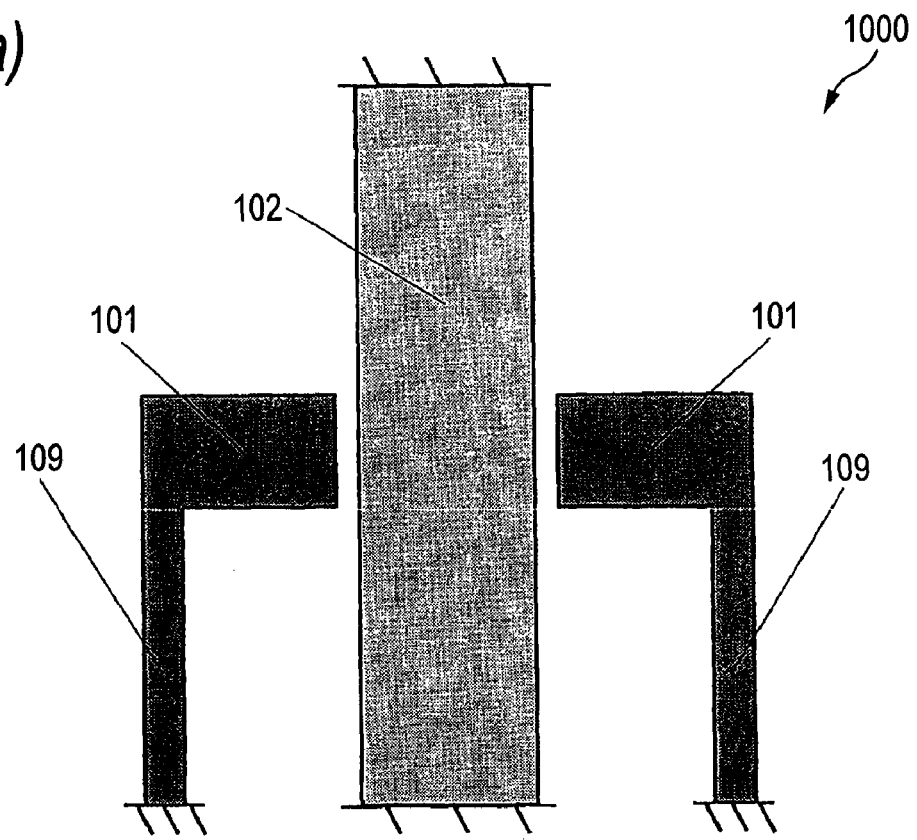
FIG. 29(a) A top view showing the configuration of the electromechanical switch of the sixteenth embodiment of the present invention in an ON state; and (b) A top view showing the configuration of the electromechanical switch shown in FIG. 29(a) in an OFF state.
Figure 29:
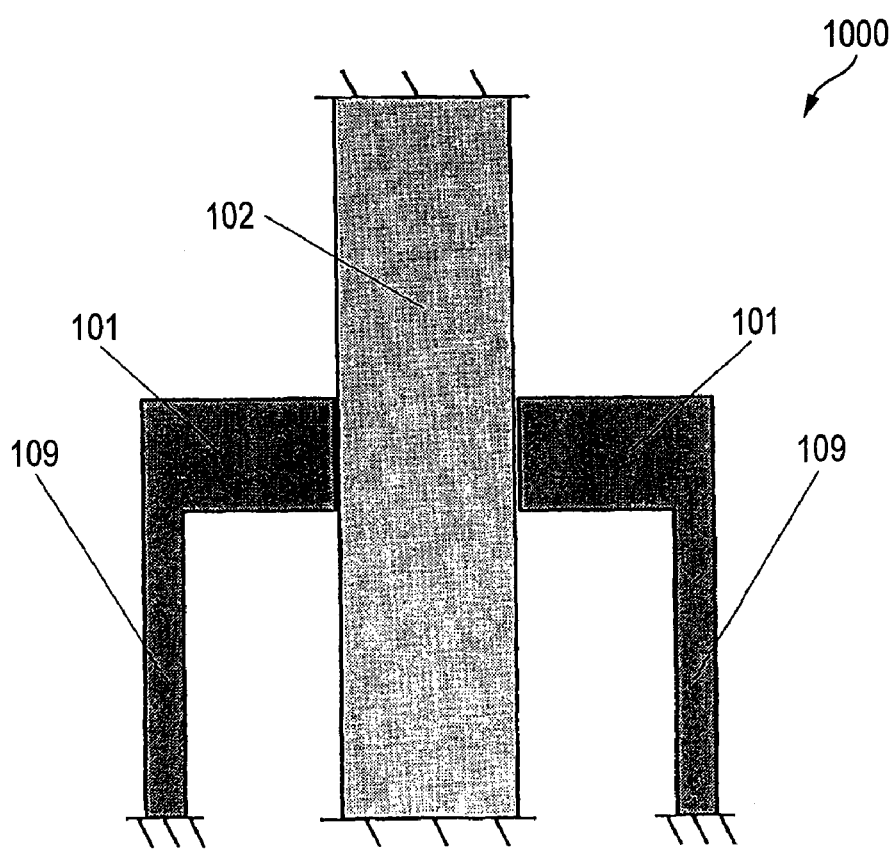

In this case, there may be adopted a simple structure not having a drive mechanism as shown in FIGS. 28 and 29, and there is no necessity for the drive section 109. Simplification of manufacturing processes and cost cutting can be attained. Space saving can also be achieved by means of simplification of the structure. Moreover, there is no necessity for controlling the switch according to the value of input power. Hence, there is no necessity for the signal power detector 112 and the control signal generator 113, such as those illustrated in the block diagram of the control circuit of the electromechanical switch shown in FIG. 25, so that an attempt can be made to simplify the control circuit and curtail cost.

The present embodiment has described a capacitative coupling switch, where the movable electrode 102 and the fixed electrode 103 achieve RF coupling by means of electrostatic capacitance by way of the insulating film 105. However, the present invention can also be applied to a switch which does not have the insulating film 105 and forms a signal transmission channel as a result of the movable electrode 102 directly contacting the fixed electrode 103. A switch of this system is called a DC-coupled switch. In this case, a drive electrode for actuating the movable electrode 102 toward the fixed electrode 103 is required, and the drive electrode can be provided at a position, e.g., below the movable electrode 102.

Figure 30:
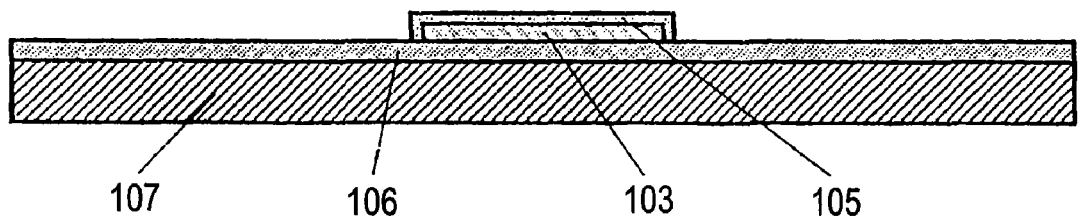
FIG. 30 Cross-sectional views for describing stepwise processes for manufacturing the electromechanical switch shown in FIG. 1 according to the first embodiment of the present invention.
Figure 30:
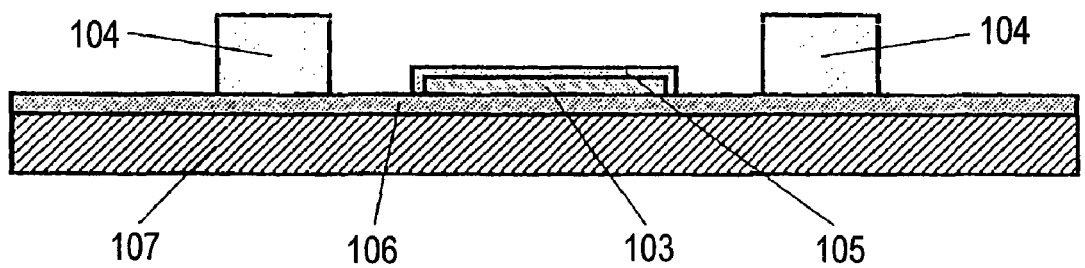
Figure 30:
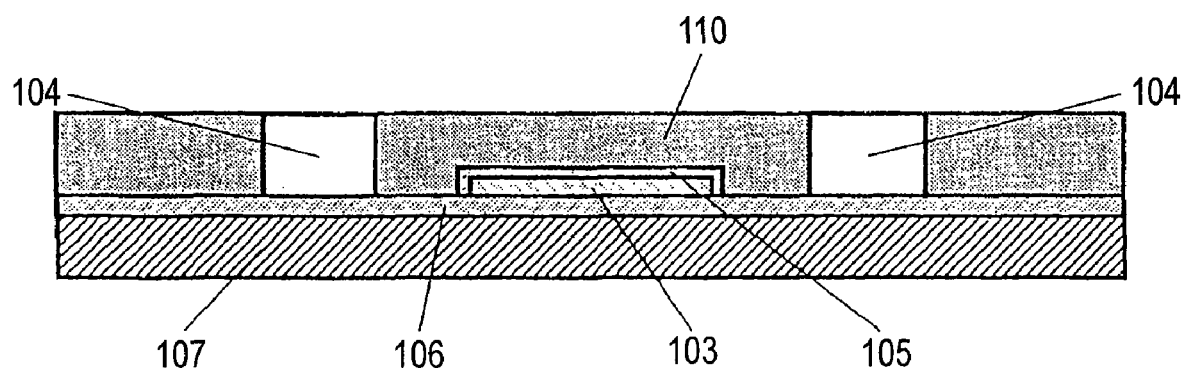

Here, a method for manufacturing the electromechanical switch 100 will be described. FIGS. 30(a) to 30(c) and FIGS. 31(a) to 31(b) are cross-sectional views for describing stepwise processes of manufacturing the electromechanical switch of the first embodiment of the present invention. As shown in FIG. 30(a), an insulating layer 106, such as $SiO_2$, $Si_3N_4$, or the like, is formed on the substrate 107 such as Si, GaAs, or the like, by means of thermal oxidation or sputtering. Next, after a conductive material, such as Al, Au, and the like, which is to become the fixed electrode 103, has been formed by means of sputtering, CVD (Chemical Vapor Deposition), or the like, a resist, on which the fixed electrode 103 has been patterned, is made on a material which is to become the fixed electrode 103, by means of electron beam lithography or photolithography. The photoresist is formed through dry etching, and the resist is eliminated by means of ashing.

Moreover, after an insulating material, such as $SiO_2$ or $Si_3N_4$, which is to become the insulating film 105, has been formed by means of sputtering or CVD, the insulating film 105 is patterned on the material that is to become the insulating film 105, by means of electron beam lithography and photolithography, to thus form photoresist on which the insulating film 105 has been patterned. The photoresist is formed through dry etching, and the resist is eliminated by means of ashing.

As shown in FIG. 30(b), after a material, which is to become the post sections 104, such as $SiO_2$, $Si_3N_4$, Al, or Au, has been formed by means of sputtering or CVD, the photoresist, on which the post sections 104 have been patterned, is formed on a material which is to become the post sections 104, by means of electron beam lithography or photolithography. The photoresist is formed through dry etching, and the resist is eliminated by means of ashing. In FIG. 30(c), a material, such as photoresist, which is to become a sacrificial layer 110, is formed. In this case, the height of the upper face of the sacrificial layer 110 from the substrate 107 is desirably equal to the height of the post sections 104 from the substrate 107.

After formation of the sacrificial layer 110, the sacrificial layer 110 is patterned by use of the same mask pattern as that used for forming the post sections 104, by means of electron beam lithography or photolithography, such that no residuals of material of the sacrificial layer 110 are left on the post sections 104. The material of the sacrificial layer 110 on the post sections 104 are desirably removed by means of development.

Figure 31:
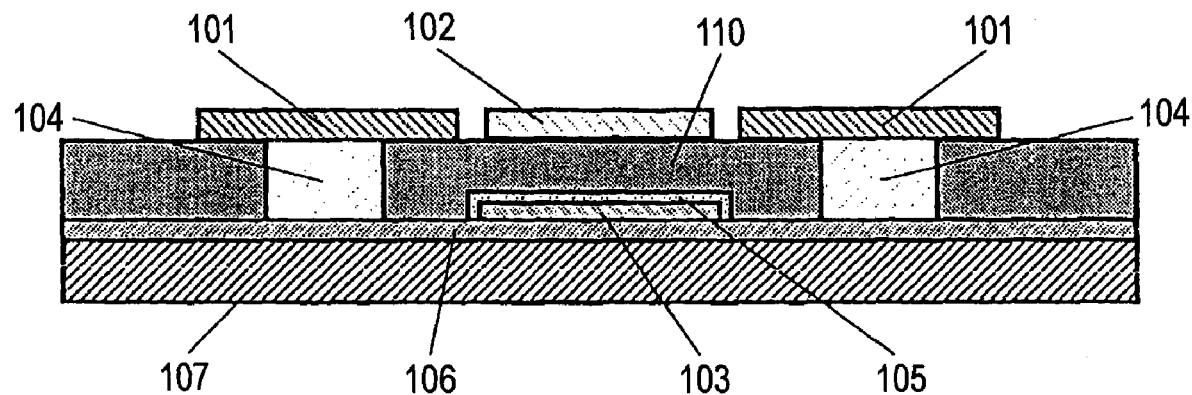
FIG. 31 Cross-sectional views for describing stepwise processes for manufacturing the electromechanical switch shown in FIG. 1 according to the first embodiment of the present invention.
Figure 31:
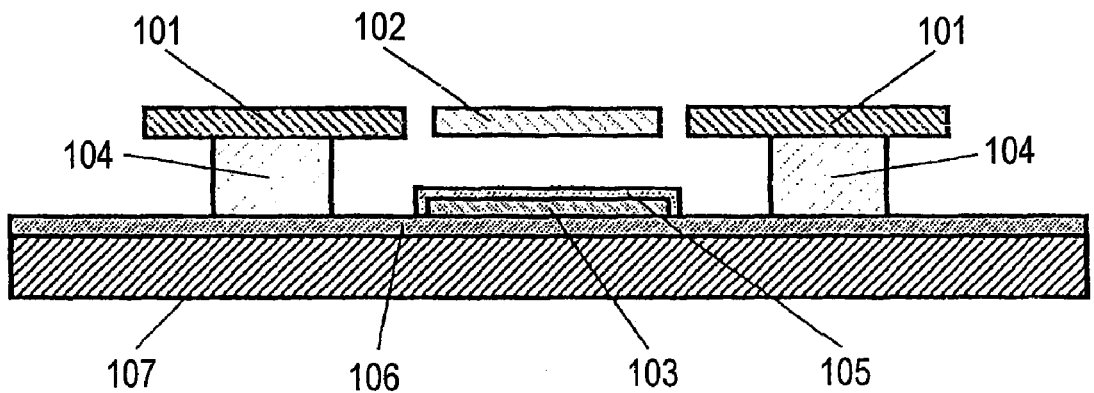

As shown in FIG. 31(a), after a conductive material, Al or Au, which is to become the movable electrode 102 and the actuators 101, has been formed by means of sputtering or CVD, the resist, on which the movable electrode 102 and the actuators 101 have been patterned, is formed on the material that is to become the movable electrode 102 and the actuators 101, by means of electron beam lithography or photolithography. The photoresist is formed through dry etching, and the resist is eliminated by means of ashing. Finally, the sacrificial layer 110 is eliminated by means of ashing, to thus create levitated structures such as the movable electrode 102 and the actuators 101 as shown in FIG. 31(b).

The electromechanical switches 200, 300, 400, 500, 600, 700, 800, 900 can be manufactured by means of the same method as that used for manufacturing the electromechanical switch 100 according to the first embodiment of the present invention.

As in the case of the electromechanical switches 200, 400, when the portion of the actuator 101 contacting the movable electrode 102 assumes a triangular structure or a wedge-shaped structure when viewed from the direction of the cross section, the structure can be formed by means of a combination of anisotropic etching operations during the processes of subjecting the actuators 101 to dry etching in FIG. 31(a). For instance, in the case of the triangular structure, a material is tapered in a certain direction and subjected to etching in a first stage, and the thus-etching material is then tapered in the opposite direction and etched in a second step, to thus form the triangular structure. Further, a wedge-shaped structure is formed by means of tapering a material in one direction and subjecting the thus-tapered material to etching.

Anisotropic etching can be controlled according to conditions for dry etching. An etched shape is changed according to power, a gas mixture ratio, gas pressure, a temperature, and an etchant. Even when the portion of the actuator 101 contacting the movable electrode 102 assumes an angular structure including a polygonal structure or a round structure, the structure can be formed by the same method.

As in the case of the electromechanical switches 300, 400, when the actuators 101 and the movable electrode 102 are formed in an offset manner, the photoresist, which is to become the sacrificial layer 110, is spin-coated such that a step for the electrode 103 is formed, in a process shown in FIG. 30(c). In relation to spin-coating of photoresist, the greater the number of revolutions, the greater an extent to which the film is reduced at the step as in the case of the fixed electrode 103, whereby the height of the photoresist over the entire surface of the substrate comes steady. In contrast, the smaller the number of revolutions, the more the photoresist undergoes the influence of irregularities of the substrate, whereby steps arise in the surface of photoresist. As above, steps of photoresist can be controlled.

As in the case of the electromechanical switch 550, when the portion of the actuator 101 contacting the movable electrode 102 assumes a triangular structure when viewed from above, the structure can be formed by means of changing a mask pattern during patterning of resist for the actuators 101 which is performed by means of electron beam lithography or photolithography shown in FIG. 31(a). Even in a case where the portion of the actuator 101 contacting the movable electrode 102 assumes an angular structure including a wedge-shaped structure or a round structure, the structure can be formed by means of the same method.

As above, according to the electromechanical switches 100, 200, 300, 400, 500, 600, 700, 800, 900, and 1000, the mechanism for fixing a movable electrode in an electromechanical switch, which has been difficult to materialize, is embodied, and a highly-reliable electromechanical switch which can be applied to a signal of heavy power is provided.

The electromechanical switch of the present invention can be applied to electrical circuits of various applications as well as to an electrical circuit for wireless communication.

The electromechanical switch of the present invention can be applied to electrical equipment of various applications as well as to wireless communication terminals.

Seventeenth Embodiment

Figure 32:
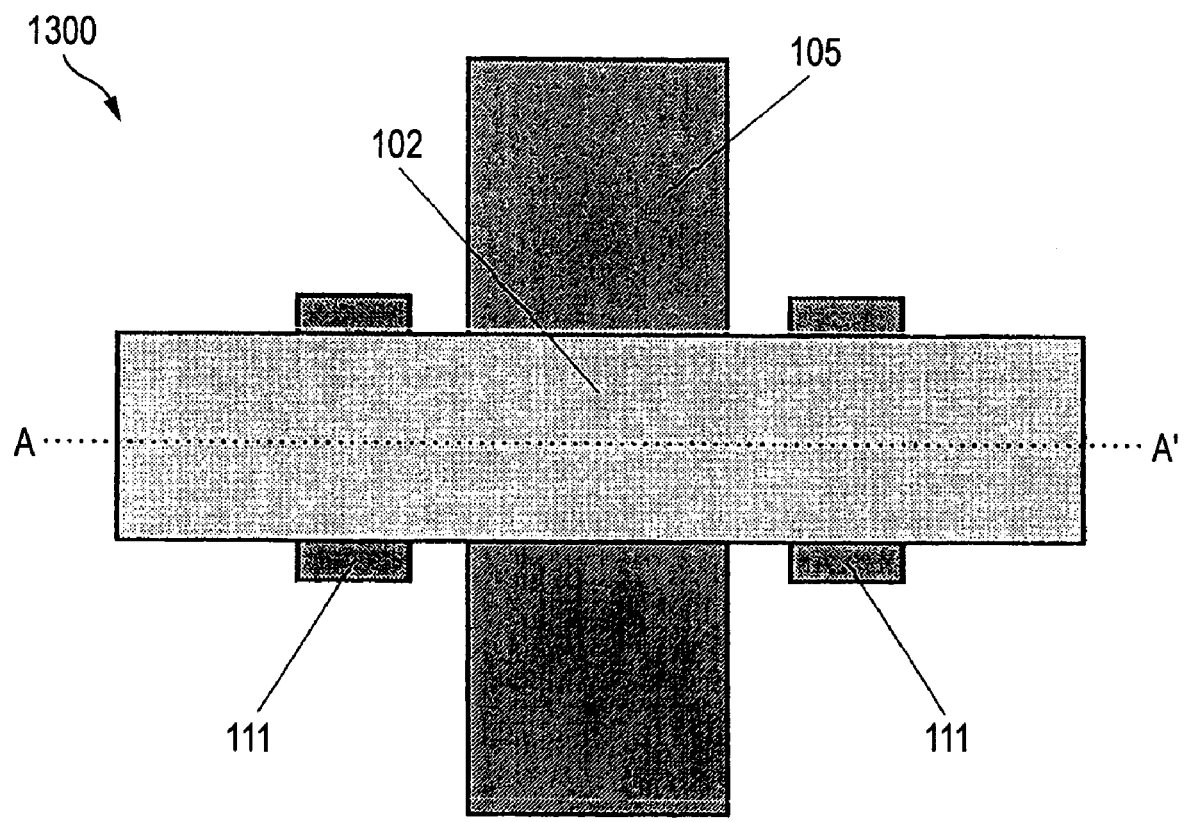
FIG. 32 A top view showing the configuration of an electromechanical switch according to a seventeenth embodiment of the present invention.
Figure 33:
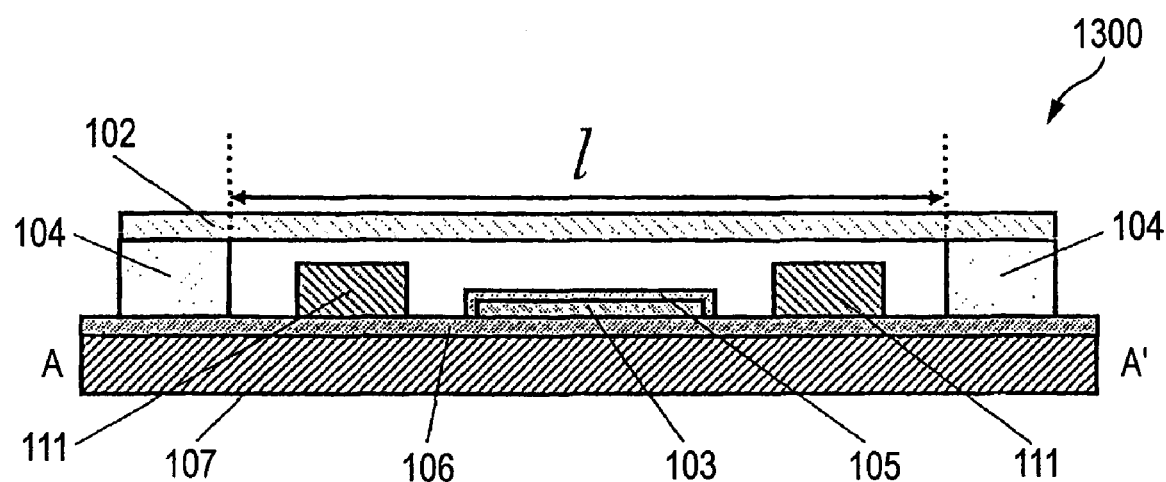
FIG. 33(a) A cross-sectional view showing the configuration of the electromechanical switch according to the seventeenth embodiment of the present invention acquired when self-actuation has not arisen in the electromechanical switch; and (b) A cross-sectional view showing the configuration of the electromechanical switch acquired when occurrence of self-actuation in the electromechanical switch shown in FIG. 33(a) is prevented.
Figure 33:
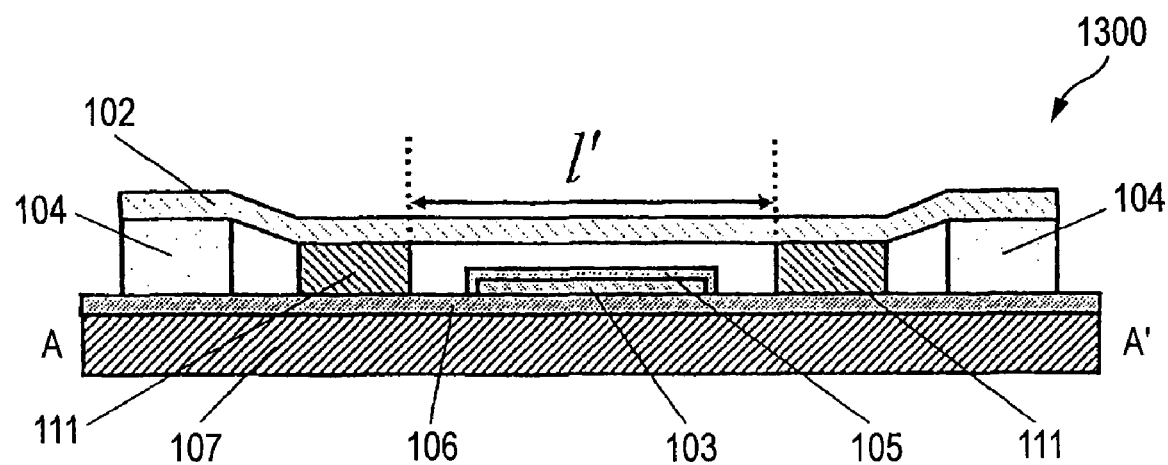

FIG. 32 is a top view showing the configuration of an electromechanical switch according to a seventeenth embodiment of the present invention, and FIG. 33(a) is a cross-sectional view taken along line A-A' shown in FIG. 32, showing the configuration of the electromechanical switch according to the seventeenth embodiment of the present invention acquired when self-actuation has not arisen in the electromechanical switch. In an electromechanical switch 1300 shown in FIGS. 32 and 33(a), the fixed electrode 103, the insulating film 105, the movable electrode 102 in the form of a levitating beam crosslinked across the post sections 104, and the stays 111 formed below the movable electrode 102 are provided on the substrate 107 whose surface is covered with the insulating layer 106. The movable electrode 102 and the fixed electrode 103 form a capacitor in the same manner as do elements of a parallel plate capacitor.

The switching mechanism of the electromechanical switch 1300 will now be described.

When the switch is in the OFF position, the movable electrode 102 is located at an elevated position, and electrostatic capacitance in an air gap between the movable electrode 102 and the fixed electrode 103 is small. In this case, the electrostatic capacitance has a.c. high impedance, and a high-frequency signal cannot travel between the movable electrode 102 and the fixed electrode 103. Meanwhile, when the switch remains in the ON position, a voltage is applied between the movable electrode 102 and the fixed electrode 103, and the movable electrode 102 is actuated downward by means of electrostatic force. The movable electrode 102, which has been actuated downward, comes into contact with the fixed electrode 103, to thus generate great electrostatic capacitance between the movable electrode 102 and the fixed electrode 103 by way of the insulating film 105. In this case, the electrostatic capacitance has low AC impedance, and the high-frequency signal can travel between the movable electrode 102 and the fixed electrode 103. Thus, the electromechanical switch opens and closes the propagation channel for the signal that has traveled to the movable electrode 102 or the fixed electrode 103.

According to the configuration found in such a related electromechanical switch, when a signal is input to the movable electrode 102 or the fixed electrode 103 during the OFF state of the switch, a potential difference arises between the movable electrode 102 and the fixed electrode 103 for reasons of the power of the signal. There arises a phenomenon of the movable electrode 102 being automatically actuated downward, regardless of no additional application of drive voltage. This phenomenon is called self-actuation. Self-actuation enables an input of a signal of great power and high-speed response and a low-voltage drive of the actuator. For this reasons, self-actuation particularly poses a problem when the spring force of the movable electrode 102 has been reduced, which in turn induces faulty operation of the electromechanical switch or deterioration of durability of the same. In order to avoid self-actuation, the present invention provides a movable electrode fixing mechanism for use in an OFF state.

The mechanism of the movable electrode fixing mechanism in the electromechanical switch 1300 will now be described. FIG. 33(b) is a cross-sectional view showing the configuration of the electromechanical switch of the seventeenth embodiment acquired when occurrence of self-actuation in the electromechanical switch is prevented. In the state shown in FIG. 33(a), self-actuation has not arisen, and the length of the crosslinked portion of the movable electrode 102 corresponds to the interval "l" between the post sections 104. When self-actuation has arisen as shown in FIG. 33(b), the movable electrode 102 is actuated downward. Here, in order to stop actuation of the movable electrode 102 induced by self-actuation, it is better to make the spring force of the movable electrode 102 equivalent to or greater than the drive force stemming from self-actuation.

To this end, there is provided a mechanism where the stays 111 are provided below the movable electrode 102 and where the movable electrode 102 contacts the stays 111 when being actuated downward by self-actuation, to thus increase the spring force of the movable electrode 102. When the movable electrode 102 has contacted the stays 111, the length of the crosslinked portion of the movable electrode 102 corresponds to an interval "l'" between the stays 111. As compared with the length "l" of the crosslinked portion of the movable electrode 102 in FIG. 33(a), which is an initial state where self-actuation arises, the length "l'" becomes shorter.

A spring constant "k" of the beam of the movable electrode 102 whose both ends are supported is proportional to the inverse of the cube root of the length "l" of the crosslinked portion as indicated by (Equation 1). The shorter the length of the crosslinked portion, the greater the spring constant, which increases with a power of a cube root, whereby the spring force is also increased. By means of this effect, the movable electrode 102 where self-actuation has arisen cannot be actuated further downward from the position of the stays 111. Thus, self-actuation can be avoided.

Figure 34:
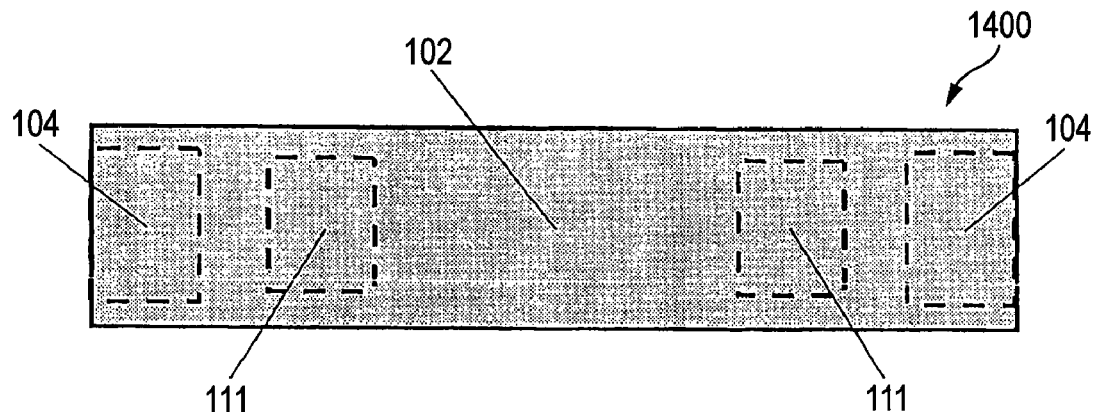
FIG. 34(a) A top view showing the configuration of the electromechanical switch shown in FIG. 33 according to the seventeenth embodiment of the present invention; (b) A top view showing a modification of the electromechanical switch shown in FIG. 34(a); and (c) A top view showing a modification of the electromechanical switch shown in FIG. 30(a).
Figure 34:
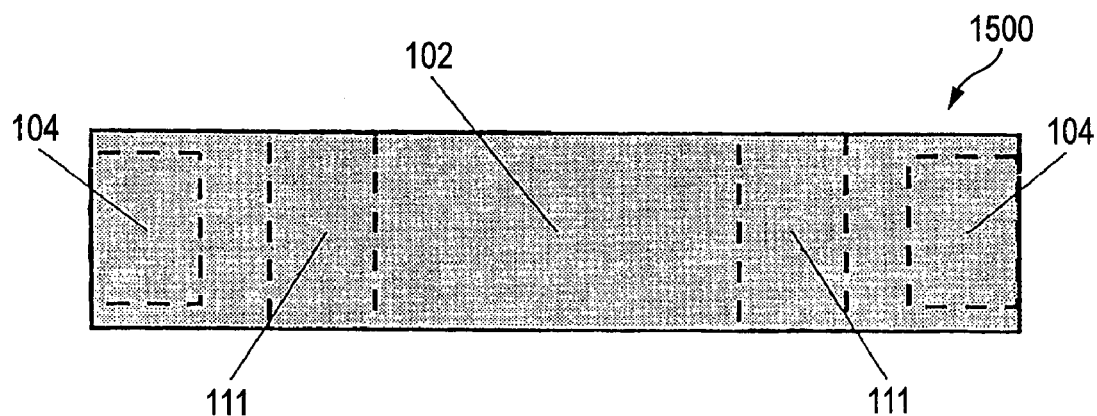
Figure 34:
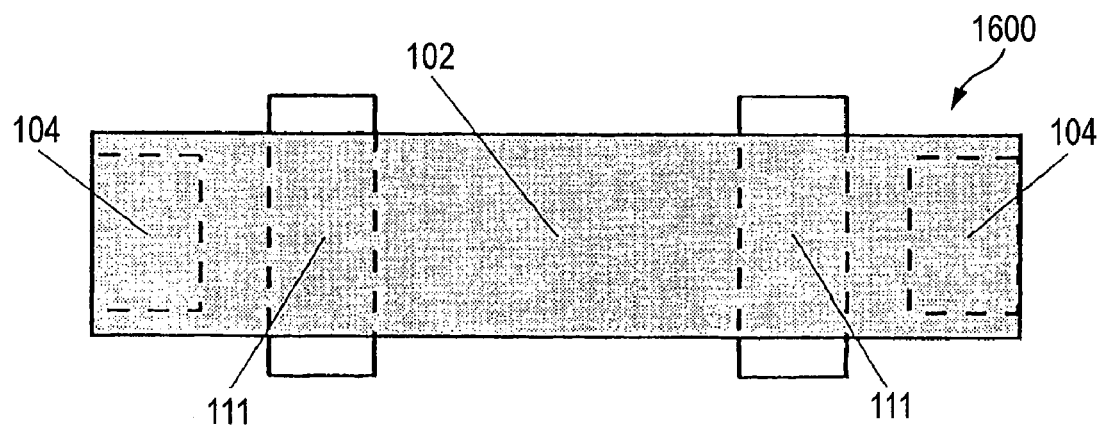

FIGS. 34(a), 34(b), and 34(c) are top views showing the configuration of a modification of the electromechanical switch of the seventeenth embodiment of the present invention. As indicated by electromechanical switches 1400, 1500, and 1600, the stays 111 may be smaller than, equivalent to, or larger than the width of the movable electrode 102 and can be given various sizes.

The positions of the stays 111 where the length "l'" of the crosslinked portion of the movable electrode 102 acquired during avoidance of self-actuation can be set to various locations where the spring force of the movable electrode 102 assumes a desired value.

The height of the stays 111 from the insulating film 105 can be set to various heights such that desired isolation is achieved.

Eighteenth Embodiment

Figure 35:
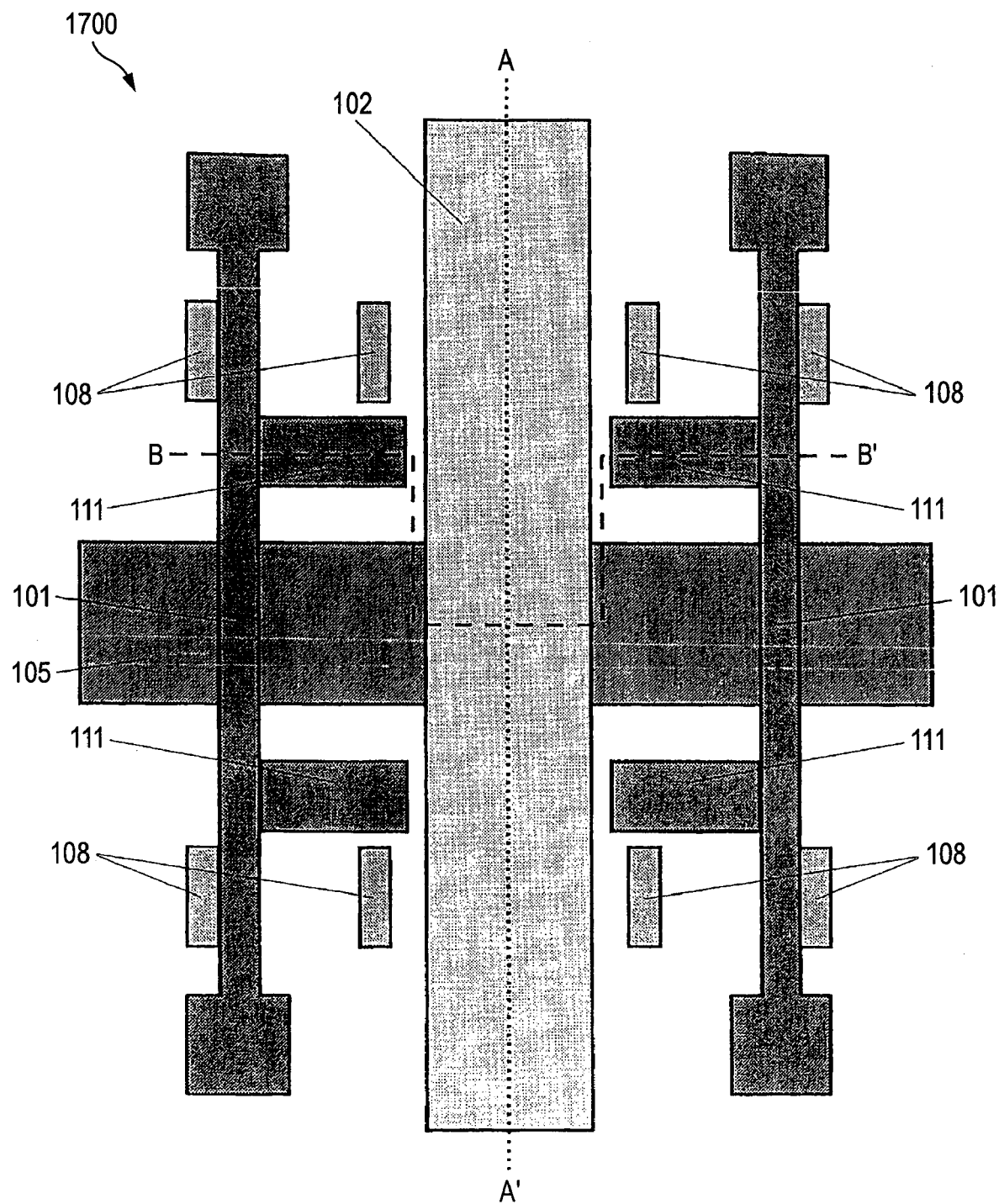
FIG. 35 A top view showing the configuration of an electromechanical switch according to an eighteenth embodiment of the present invention.

FIG. 35 is a top view showing the configuration of an electromechanical switch according to an eighteenth embodiment of the present invention. FIGS. 36(a), 37(a) show cross-sectional views taken along lines A-A' and B-B' shown in FIG. 35, and are cross-sectional views showing the configuration of the electromechanical switch according to the eighteenth embodiment of the present invention acquired when self-actuation has not arisen in the electromechanical switch. FIGS. 36(b), 37(b) show cross-sectional views taken along lines A-A' and B-B' shown in FIG. 35, and are cross-sectional views showing the configuration of the electromechanical switch according to the eighteenth embodiment of the present invention acquired when occurrence of self-actuation in the electromechanical switch is prevented. FIG. 38(a) is a top view showing the configuration of an electromechanical switch according to a modification of the eighteenth embodiment of the present invention acquired when self-actuation has not arisen in the electromechanical switch, and FIG. 38(b) is a top view showing the configuration of the electromechanical switch acquired when occurrence of self-actuation in the electromechanical switch according to a modification of the eighteenth embodiment of the present invention is prevented.

Figure 36:
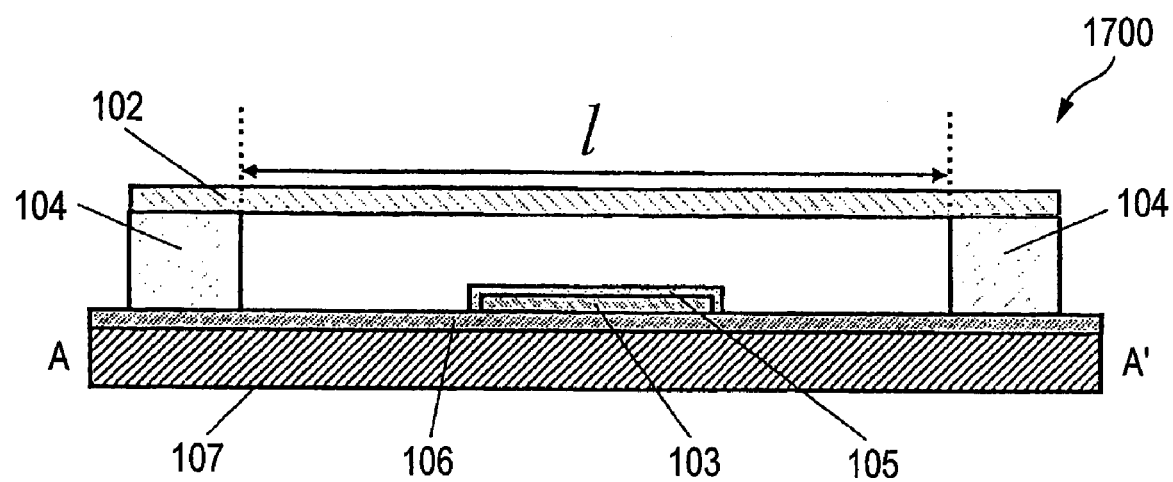
FIG. 36(a) A cross-sectional view showing the configuration of the electromechanical switch according to the eighteenth embodiment of the present invention acquired when self-actuation has not arisen in the electromechanical switch; and (b) A cross-sectional view showing the configuration of the electromechanical switch acquired when occurrence of self-actuation in the electromechanical switch shown in FIG. 36(a) is prevented.
Figure 36:
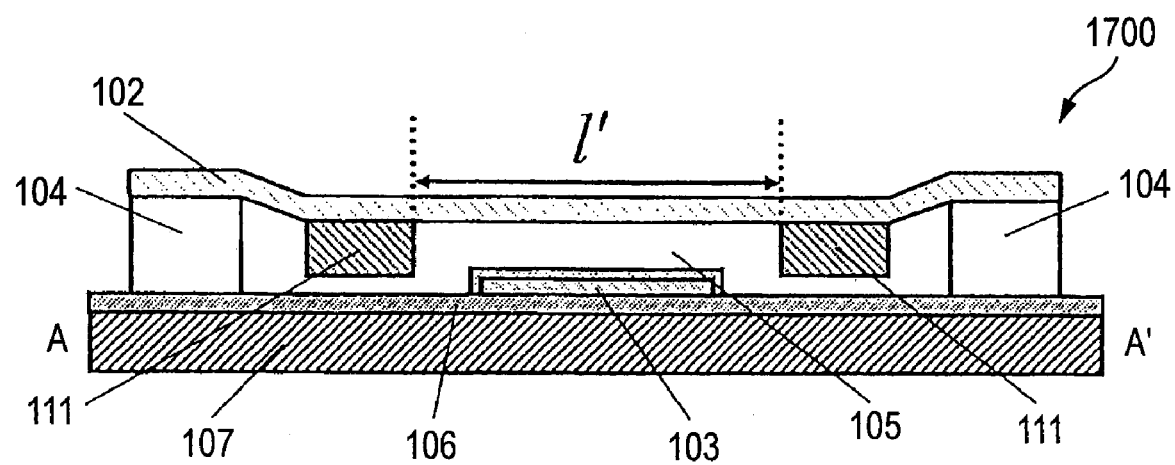
Figure 37:
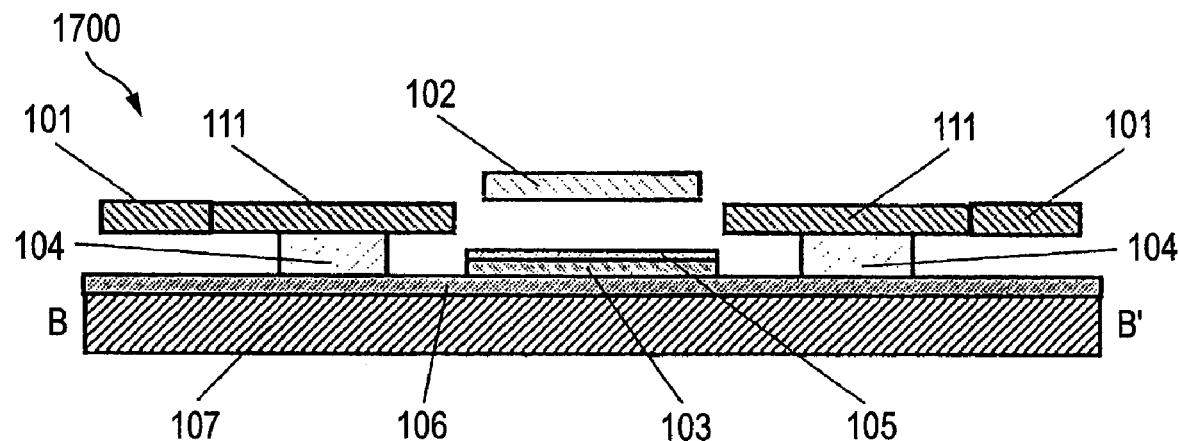
FIG. 37(a) A cross-sectional view showing the configuration of the electromechanical switch according to the eighteenth embodiment of the present invention acquired when self-actuation has not arisen in the electromechanical switch, and (b) A cross-sectional view showing the configuration of the electromechanical switch acquired when occurrence of self-actuation in the electromechanical switch shown in FIG. 37a is prevented.
Figure 37:
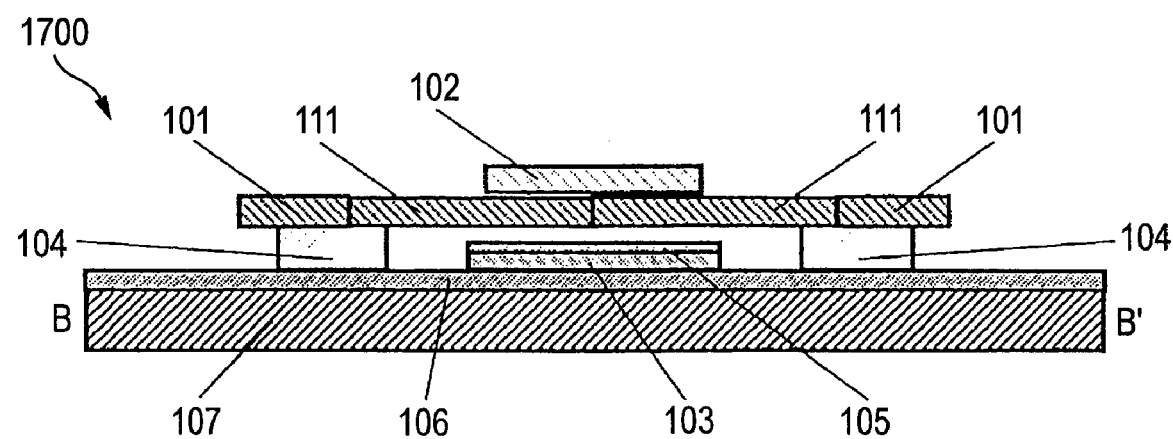
Figure 38:
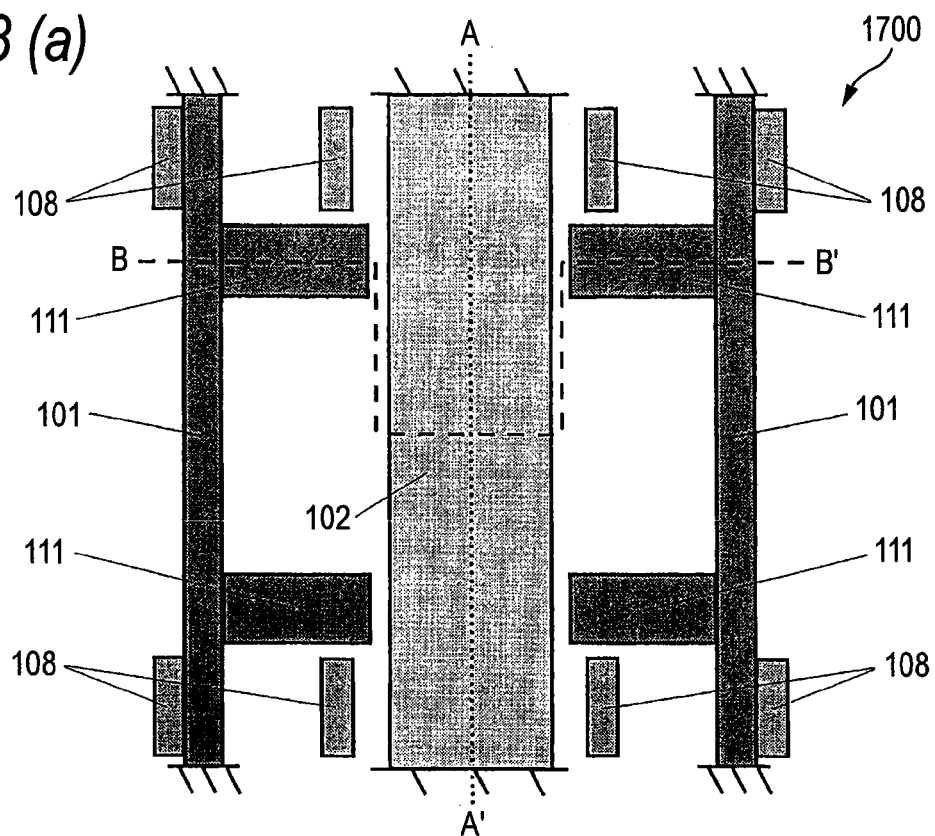
FIG. 38(a) A cross-sectional view showing the configuration of an electromechanical switch according to a modification of the eighteenth embodiment of the present invention acquired when self-actuation has not arisen in the electromechanical switch; and (b) A cross-sectional view showing the configuration of the electromechanical switch acquired when occurrence of self-actuation in the electromechanical switch shown in FIG. 38(a) is prevented.
Figure 38:
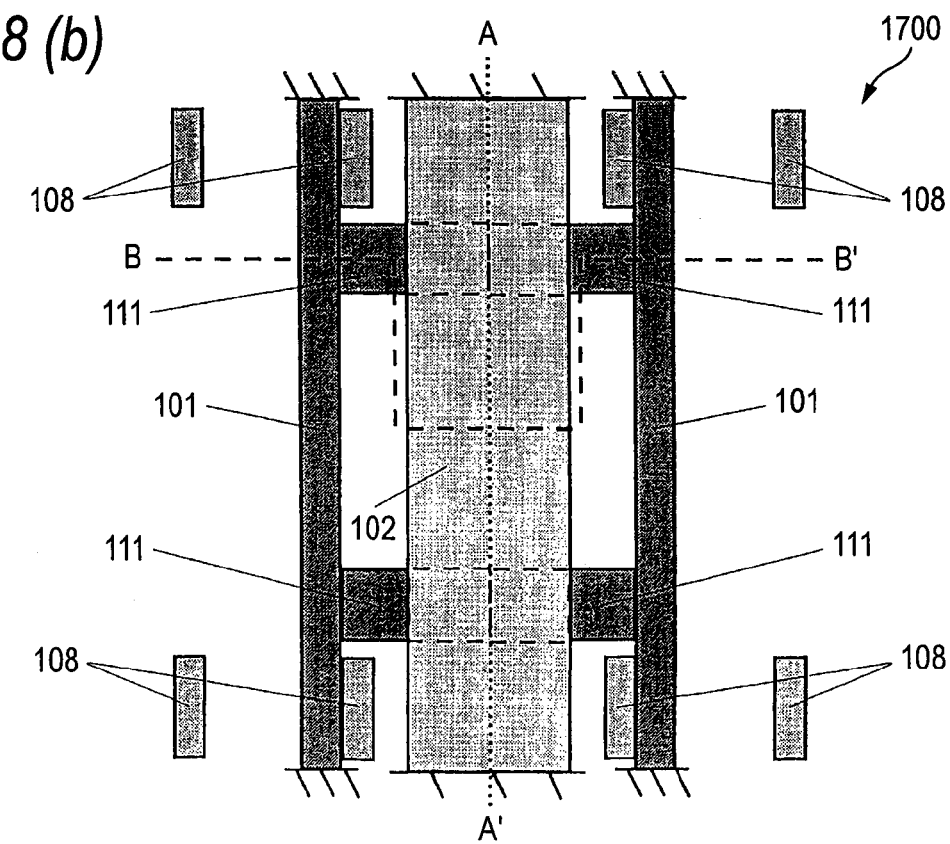

FIGS. 36(a), 37(a) show cross-sectional views taken along lines A-A' and B-B' shown in FIG. 38(a), and FIGS. 36(b), 37(b) show cross-sectional views taken along lines A-A' and B-B' shown in FIG. 38(b). As shown in FIGS. 36, 37, and 38, the stays 111 are formed in a levitating structure and are connected to the actuators 101, which drive the stays 111. The actuators 101 are actuated by means of electrostatic force developing between the actuator and the drive voltage 108.

By means of this configuration, positional adjustment of the stays 111 and downward movement of the movable electrode 102 are enabled.

Figure 39:
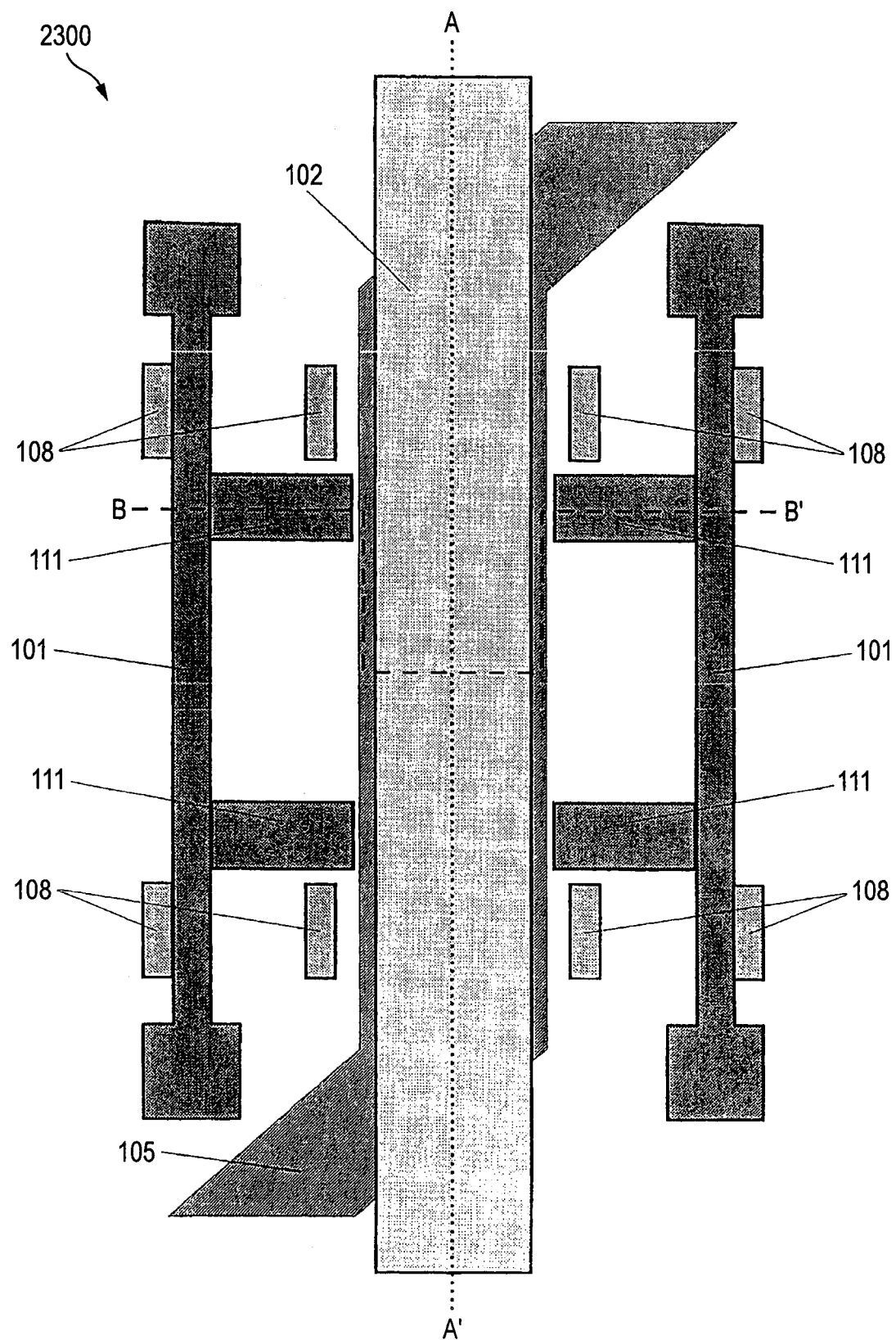
FIG. 39 A top view showing the configuration of a modification of the electromechanical switch according to the eighteenth embodiment of the present invention.
Figure 40:
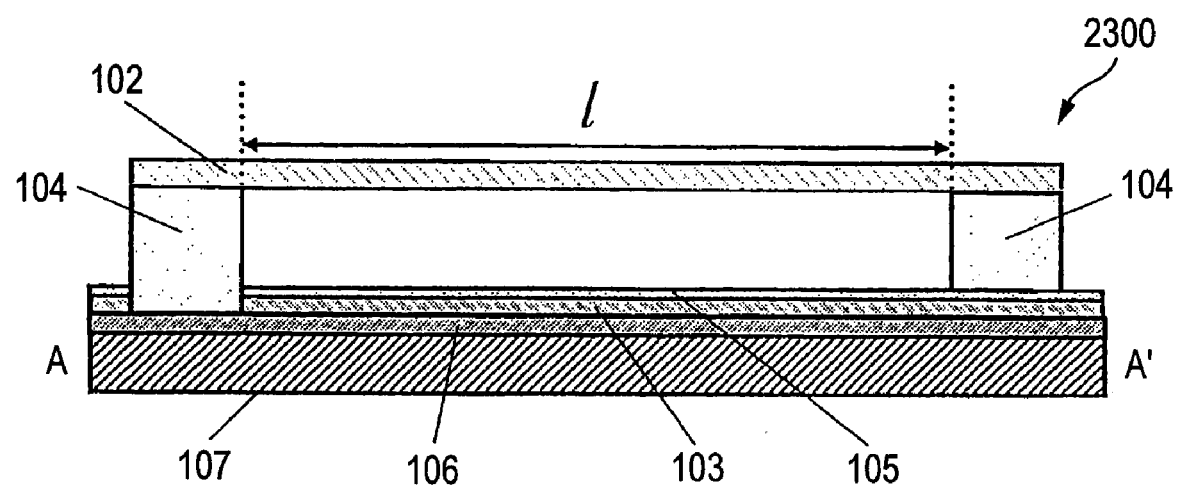
FIG. 40(a) A cross-sectional view showing the configuration of a modification of the electromechanical switch according to the eighteenth embodiment of the present invention acquired when self-actuation has not arisen in the electromechanical switch; and (b) A cross-sectional view showing the configuration of the electromechanical switch acquired when occurrence of self-actuation in the electromechanical switch shown in FIG. 40(a) is prevented.
Figure 40:
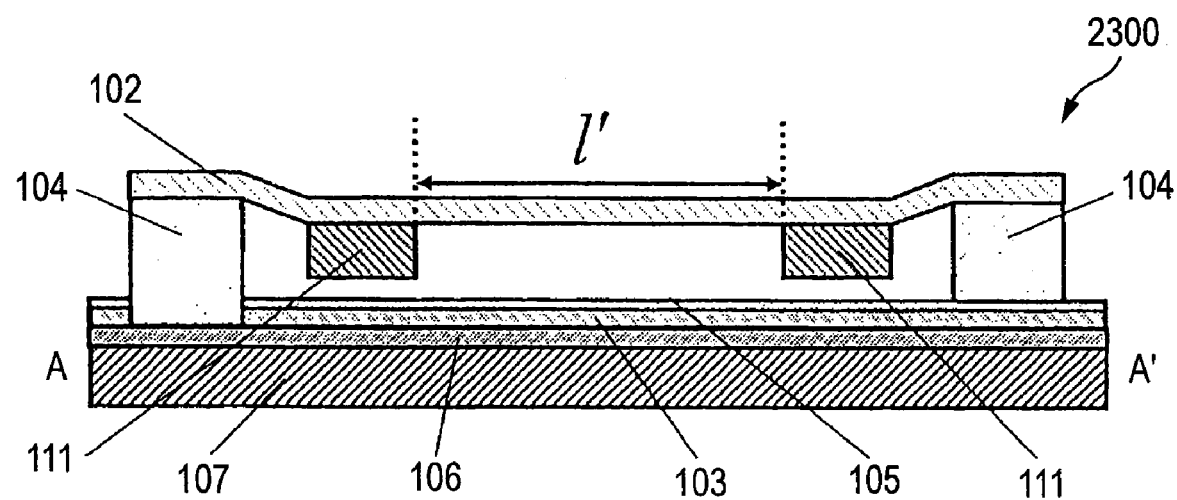

FIG. 39 is a top view showing the configuration of a modification of the electromechanical switch according to the eighteenth embodiment of the present invention, FIG. 40(*a*) shows a cross-sectional view taken along line A-A' shown in FIG. 39, and is a cross-sectional view showing the configuration of the electromechanical switch according to the eighteenth embodiment of the present invention acquired when self-actuation has not arisen in the electromechanical switch. FIG. 40(*b*) shows a cross-sectional view taken along line A-A' shown in FIG. 39, and is a cross-sectional view showing the configuration of a modification of the electromechanical switch, according to the eighteenth embodiment of the present invention, acquired when occurrence of self-actuation in the electromechanical switch is prevented. An electromechanical switch 2300 is a modification of the electromechanical switch 1700, and assumes a structure where the fixed electrode 103 is arranged in parallel to the movable electrode 102. Even when the arrangement of the fixed electrode 103 is different, the self-actuation avoidance method according to the thirteenth embodiment is applicable.

The stays 111 can also be inserted into a portion of the widthwise area of the movable electrode 102 rather than into the entire widthwise area of the same.

A part of each of the stays 111 facing the movable electrode 102 can be formed into any of various structures such as a round structure or angular structures including a square structure, a triangular structure, and a wedge-shaped structure.

The actuator 101 can be formed into various structures, including a beam whose both ends are supported and a cantilever.

The drive electrodes 108 and the actuators 101 can be formed into various structures, including a parallel electrode structure and a comb electrode structure.

The actuators 101 can be embodied as various drive types including an electrostatic force drive type, a piezoelectric drive type, or an electromagnetic drive type.

The stay 111 can be remained inserted to a position below the movable electrode 102 at all times without regard to occurrence/nonoccurrence of self-actuation or the power value of an input signal.

Further, as shown in the block diagram of the control circuit of the electromechanical switch according to the embodiment shown in FIG. 43, the electromechanical switch of the present invention has a mechanism for detecting the power value of an input signal such as the signal power detector 112. Only upon input of a signal of power which induces self-actuation; e.g., a signal of heavy power of the order of at least 2 W or more, the actuators 101 can be controlled by the control signal generator 113, or the like, so as to insert the stay 111 to a position below the movable electrode, thereby avoiding occurrence of self-actuation.

In the eighteenth embodiment, the electromagnetic switch can be switched between the ON and OFF states by utilization of self-actuation. In the ON state, the movable electrode 102 is released from the fixed state realized by the actuators 101, and the movable electrode 102 is actuated downwardly by means of self-actuation. In contrast, in the OFF state, the actuators 101 fix the movable electrode 102, and the movable electrode 102 is fixed to an elevated position.

In this case, since the switch is actuated by means of the power of the input signal, no additional drive source is required, which contributes to a reduction in power consumption of the device and miniaturization of the same. Switching between the ON position and the OFF position induced by self-actuation and switching between the ON position and the OFF position induced by the drive source can be switched according to occurrence/nonoccurrence of self-actuation. As shown in FIG. 43, when power which induces self-actuation has been detected by the power detector 112, the control signal generator 113 actuates the actuators 101 only in the OFF state. In contrast, when a signal of power which does not induce self-actuation has been detected, the control signal generator 113 can apply a voltage between the movable electrode 102 and the fixed electrode 103 in the ON state.

In the eighteenth embodiment, the drive electrodes 108 are provided only on the sides of the actuators 101 facing the movable electrode 102. The drive electrodes 108 impart drive force by means of electrostatic force only when the movable electrode is fixed in the OFF state. In the ON state, the actuators can be actuated by means of only spring force of the actuators 101. Conversely, the drive electrodes 108 can be provided only on the outside of the actuators 101. Only when the movable electrode is released in the ON state, the drive force is applied to the actuators by means of electrostatic force, and the actuators 101 can be actuated by means of only the spring force of the actuators in the OFF state.

As mentioned above, the layout of the drive electrodes 108, including provision of the drive electrodes 108 on only one side of the movable electrodes 101, and the driving control method can be changed in various manners so that the drive force can be imparted to the actuators 101 in only the ON state or the OFF state. When a piezoelectric actuator is applied to the drive section of the actuators 101, the piezoelectric actuator imparts drive force only when the movable electrode is fixed in the OFF state. In the ON state, the movable electrode can be actuated by means of only the spring force of the actuators 101 and the drive section. Conversely, the piezoelectric actuator can impart drive force only when the movable electrode is released in the ON state. In the OFF state, the movable electrode can be actuated by means of only the spring force of the actuators 101 and the drive section. As mentioned above, the structure of the driving control section and the drive control method can be changed in various manners so that the drive force can be imparted to the actuators 101 in only the ON state or the OFF state.

The eighteenth embodiment shows that the direction in which the actuators 101 are actuated and vibrated is horizontal in relation to the substrate. However, the drive direction can be implemented in various directions, including the vertical direction. The layout of the drive electrodes 108, the structure of the drive section, and the drive control method can be changed such that desired drive force is imparted to the actuators 101 in a desired direction.

The eighteenth embodiment has described the case where the structure of the movable electrode of the electromechanical switch is a beam whose both ends are supported. However, the movable electrode can be formed into any of various structures, including a cantilever.

Further, although the thirteenth embodiment has described the switch (a series switch) configured such that variable capacitance is connected in series to a transmission channel in circuitry equivalent to the electromechanical switch, the present invention can also be applied to a switch (a shunt switch) configured such that variable capacitance is connected in parallel to the transmission channel and the channel is connected further to the ground.

In the shunt switch, the position of the movable electrode in the shunt switch achieved in the ON state and the OFF state becomes opposite that of the movable electrode in the series switch. In the ON state, the movable electrode is located at an elevated position, and the impedance of variable capacitance is high. Hence, the high frequency signal travels, in unmodified form, through the transmission channel and is output. In the OFF state, the movable electrode is located at a lowered position, and the impedance of variable capacitance is low. Hence, the high frequency signal travels to the ground by way of the variable capacitance side. Therefore, the signal does not travel to the output side. Thus, the shunt switch opens or closes the signal propagation channel.

The movable electrode fixing mechanism of the present invention fixes the movable electrode in the shunt switch in the ON state and releases the movable electrode in the OFF state. Thus, the movable electrode fixing mechanism of the present invention can be applied to electromechanical switches of various types including the series switch and the shunt switch.

The eighteenth embodiment has described a capacitative coupling switch, where the movable electrode 102 and the fixed electrode 103 achieve RF coupling by means of electrostatic capacitance byway of the insulating film 105. However, the present invention can also be applied to a switch which does not have the insulating film 105 and forms a signal transmission channel as a result of the movable electrode 102 directly contacting the fixed section electrode 103. A switch of this system is called a DC-coupled switch. In this case, a drive electrode for actuating the movable electrode 102 toward the fixed electrode 103 is required, and the drive electrode can be provided at a position, e.g., below the movable electrode 102.

Figure 41:
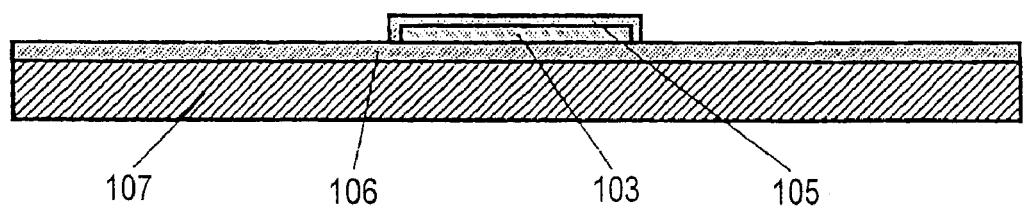
FIG. 41 A cross-sectional view for describing stepwise processes for manufacturing an electromechanical switch according to a nineteenth embodiment of the present invention.
Figure 41:
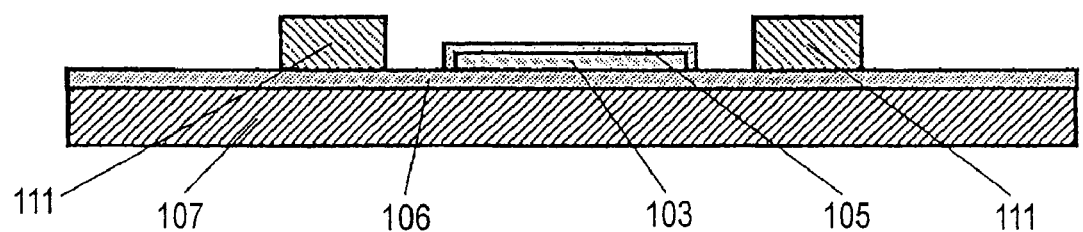
Figure 41:
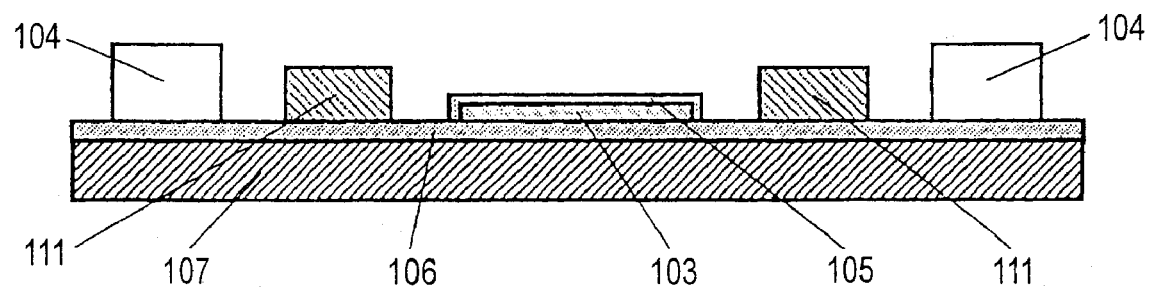

Here, a method for manufacturing the electromechanical switch 1300 will be described. FIGS. 41(a) to 41(c) and FIGS. 42(a) to 42(c) are cross-sectional views for describing stepwise processes of manufacturing the electromechanical switch of the eighteenth embodiment of the present invention. As shown in FIG. 41(a), the insulating layer 106, made of $SiO_2$, $Si_3N_4$, or the like, is formed on the substrate 107 such as Si, GaAs, or the like, by means of thermal oxidation or sputtering. Next, after a conductive material, such as Al, Au, and the like, which is to become the fixed electrode 103, has been formed by means of sputtering, CVD (Chemical Vapor Deposition), or the like, a resist, on which the fixed electrode 103 has been patterned, is formed on a material which is to become the fixed electrode 103 serving as the second electrode, by means of electron beam lithography or photolithography. The photoresist is formed through dry etching, and the resist is eliminated by means of ashing.

Moreover, after an insulating material, such as $SiO_2$ or $Si_3N_4$, which is to become the insulating film 105, has been formed by means of sputtering or CVD, the insulating film 105 is patterned on the material that is to become the insulating film 105, by means of electron beam lithography and photolithography, to thus form photoresist on which the insulating film 105 has been patterned. The photoresist is formed through dry etching, and the resist is eliminated by means of ashing.

As shown in FIG. 41(b), after a material, such as $SiO_2$ or $Si_3N_4$, which is to become the stays 111, has been formed by means of sputtering or CVD, the stays 111 are patterned on the material that is to become the stays 111, by means of electron beam lithography or photolithography, to thus form photoresist on which the stays 111 have been patterned. The photoresist is formed through dry etching, and the resist is eliminated by means of ashing.

As shown in FIG. 41(c), after a material, which is to become the post sections 104, such as $SiO_2$, $Si_3N_4$, Al, or Au, has been formed by means of sputtering or CVD, the photoresist, on which the post sections 104 have been patterned, is formed on a material which is to become the post sections 104, by means of electron beam lithography or photolithography. The photoresist is formed through dry etching, and the resist is eliminated by means of ashing.

Figure 42:
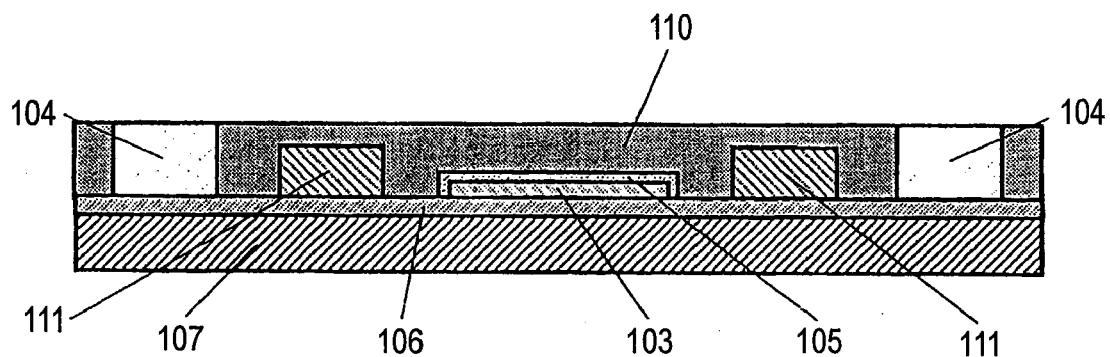
FIG. 42 A cross-sectional view for describing stepwise the processes for manufacturing the electromechanical switch according to the nineteenth embodiment of the present invention.
Figure 42:
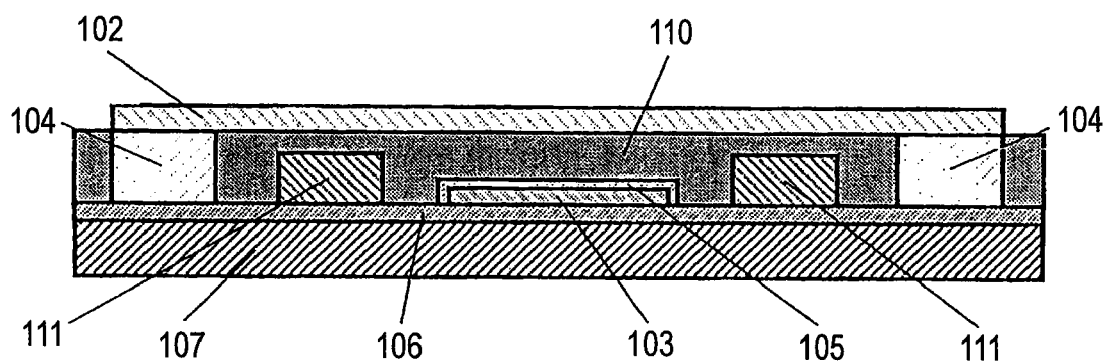
Figure 42:
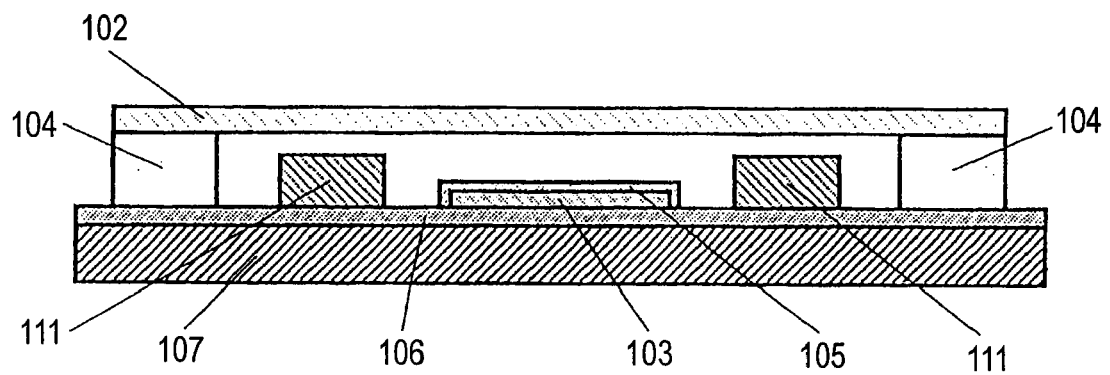

In FIG. 42(a), a material, such as photoresist, which is to become a sacrificial layer 110, is formed. In this case, the height of the upper face of the sacrificial layer 110 from the substrate 107 is desirably equal to the height of the post sections 104 from the substrate 107. After formation of the sacrificial layer 110, the sacrificial layer 110 is patterned by use of the same mask pattern as that used for forming the post sections 104, by means of electron beam lithography or photolithography, such that no residuals of material of the sacrificial layer 110 are left on the post sections 104. The material of the sacrificial layer 110 on the post sections 104 are desirably removed by means of development.

As shown in FIG. 42(b), after a conductive material, Al or Au, which is to become the movable electrode 102, has been formed by means of sputtering or CVD, the resist, on which the movable electrode 102 has been patterned, is formed on the material that is to become the movable electrode 102 and the actuators 101, by means of electron beam lithography or photolithography. The photoresist is formed through dry etching, and the resist is eliminated by means of ashing. Finally, the sacrificial layer 110 is eliminated by means of ashing, to thus create levitating structures such as the movable electrode 102 as shown in FIG. 42(c).

The electromechanical switches 1400, 1500, and 1600 can be manufactured by means of the same method as that used for manufacturing the electromechanical switch 1300 according to the eighteenth embodiment of the present invention.

As above, according to the electromechanical switches 1300, 1400, 1500, and 1600, the mechanism for fixing a movable electrode in an electromechanical switch, which has been difficult to materialize, is embodied, and a highly-reliable electromechanical switch which can be applied to a signal of heavy power is provided.

The electromechanical switch of the present invention can be applied to electrical circuits of various applications as well as to an electrical circuit of wireless communication.

The electromechanical switch of the present invention can be applied to electrical equipment of various applications as well as to wireless communication terminals.

In the electromechanical switch of the present invention, although the fixed electrode is used as a signal transmission line, the movable electrode may be used as a signal transmission line.

INDUSTRIAL APPLICABILITY

The electromechanical switch of the present invention is provided with the movable electrode fixing mechanism, to thus be able to avoid self-actuation. The electromechanical switch is useful as a highly-reliable electromechanical switch which can be applied to a signal of high power, as well as to electrical equipment of various types.

The invention claimed is:
1. An electromechanical switch comprising:
a first electrode; and
a second electrode which is formed while being spaced from the first electrode by way of a gap and is formed so as to be able to contact the first electrode by means of displacement induced by electrostatic force,
wherein the second electrode has a movable actuator for preventing a driving force of the second electrode in a direction toward the first electrode.

2. The electromechanical switch according to claim 1, wherein the actuator is a clamp unit which physically clamps the second electrode.

3. The electromechanical switch according to claim 1, wherein the actuator is interposed between the second electrode and the first electrode.

4. The electromechanical switch according to claim 1, wherein the actuator has a surface covered with an insulating film.

5. The electromechanical switch according to claim 1, further comprising a resistor provided in a contact portion between the actuator and the movable electrode.

6. The electromechanical switch according to claim 1, further comprising a mechanical resonator provided in a contact portion between the actuator and the movable electrode.

7. The electromechanical switch according to claim 1, wherein a part of the actuator contacting the second electrode has a pointed shape.

8. The electromechanical switch according to claim 1, wherein a part of the actuator contacting the second electrode has a plane shape.

9. The electromechanical switch according to claim 1, wherein an end face of a part of the actuator opposing the second electrode forms a tapered surface whose cross-sectional area becomes smaller with increasing proximity to the second electrode.

10. The electromechanical switch according to claim 1, wherein an end face of a part of the second electrode opposing the actuator forms a tapered surface whose cross-sectional area becomes smaller with increasing proximity to the actuator.

11. The electromechanical switch according to claim 1, further comprising a third electrode provided around the second electrode,
wherein a comb-shaped electrode is provided between the second and third electrodes.

12. The electromechanical switch according to claim 1, further comprising a comb-shaped electrode provided between the second electrode and the actuator.

13. The electromechanical switch according to claim 1, wherein the drive electrode is provided around the actuator.

14. The electromechanical switch according claim 1, wherein the actuator comprises drive electrodes of comb electrode structure which are formed so as to oppose each other while being spaced apart from each other by a predetermined interval.

15. The electromechanical switch according to 1, wherein the actuator is a piezoelectric actuator including a bimorph and a unimorph element.

16. The electromechanical switch according claim 1, wherein the actuator is actuated by piezoelectric force which arises between the actuator and the drive electrode.

17. The electromechanical switch according to claim 1, wherein the actuator is actuated by piezoelectric force.

18. The electromechanical switch according to claim 1, wherein the actuator is actuated by electromagnetic force.

19. The electromechanical switch according to claim 1, wherein the actuator is formed from a high-impedance material containing an insulator or a semiconductor.

20. The electromechanical switch according to claim 1, wherein the actuator includes a stay which is configured to fix a portion of the second electrode and shortens the length of a vibrating section.

21. The electromechanical switch according to claim 1, further comprising:
a mechanism for detecting the power value of an input signal; and
a mechanism for inputting a drive signal for the actuator to the actuator by means of a signal output from the mechanism for detecting the power value of the input signal.

22. The electromechanical switch according to claim 1, wherein the movable electrode is actuated by means of self-actuation induced by the power of the signal.

* * * * *